(12) United States Patent
Kabumoto et al.

(10) Patent No.: US 6,483,714 B1
(45) Date of Patent: Nov. 19, 2002

(54) MULTILAYERED WIRING BOARD

(75) Inventors: Masanao Kabumoto, Kokubu (JP); Yoshihiro Nabe, Kokubu (JP); Masaru Nomoto, Kokubu (JP); Shigeto Takeda, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/511,517

(22) Filed: Feb. 23, 2000

(30) Foreign Application Priority Data

| Feb. 24, 1999 | (JP) | ............................................. 11-046623 |
| Mar. 25, 1999 | (JP) | ............................................. 11-082252 |
| Mar. 25, 1999 | (JP) | ............................................. 11-082253 |
| Mar. 25, 1999 | (JP) | ............................................. 11-082254 |
| May 14, 1999 | (JP) | ............................................. 11-134783 |

(51) Int. Cl.$^7$ .......................... H05K 7/02; H05K 7/06
(52) U.S. Cl. ................ 361/760; 361/720; 361/748; 361/799; 361/777; 361/778; 174/250; 174/261; 257/776; 333/246
(58) Field of Search ................ 361/760, 720, 361/746, 751, 748, 762, 803, 777, 778, 799, 820; 174/250, 261; 333/246; 257/776

(56) References Cited

U.S. PATENT DOCUMENTS

| 4,782,193 | A | | 11/1988 | Linsker | |
| 4,811,082 | A | | 3/1989 | Jacobs et al. | |
| 5,285,018 | A | | 2/1994 | Pence | |
| 5,288,949 | A | * | 2/1994 | Crafts | ................... 174/117 M |
| 5,410,107 | A | | 4/1995 | Schaper | |
| 5,446,243 | A | * | 8/1995 | Crowder et al. | ............. 174/250 |
| 5,633,479 | A | * | 5/1997 | Hirano | ........................ 174/255 |
| 6,107,578 | A | * | 8/2000 | Hashim | ....................... 174/250 |

FOREIGN PATENT DOCUMENTS

| JP | 59-86248 | 5/1984 |
| JP | 1-96953 | 4/1989 |
| JP | 5-343601 | 12/1993 |
| JP | 7-94666 | 4/1995 |
| JP | 2575734 | 11/1996 |
| JP | 9-18156 | 1/1997 |

* cited by examiner

*Primary Examiner*—David S. Martin
*Assistant Examiner*—Hung Bui
(74) *Attorney, Agent, or Firm*—Hogan & Hartson, L.L.P.

(57) ABSTRACT

A multilayered wiring board comprising a first stacked structure consisting essentially of a first insulating layer having a first parallel conductor array and a second insulating layer formed thereon, having a second parallel conductor array oriented orthogonal to the first parallel conductor array, the first and second parallel conductor arrays being electrically interconnected by a first through conductor array; and a second stacked structure consisting essentially of a third insulating layer having a third parallel conductor array crossing at an angle of 30 to 60 degrees to the first parallel conductor array and a fourth insulating layer formed on top of the third insulating layer, having a fourth parallel conductor array orthogonal to the third parallel conductor array, the third and fourth parallel conductor arrays being electrically interconnected by a second through conductor array, wherein the second stacked structure is overlaid on the first stacked structure by interposing therebetween an intermediate insulating layer having a conductive layer, and the first or second parallel conductor array and the third or fourth parallel conductor array are electrically interconnected by a third through conductor array.

6 Claims, 23 Drawing Sheets

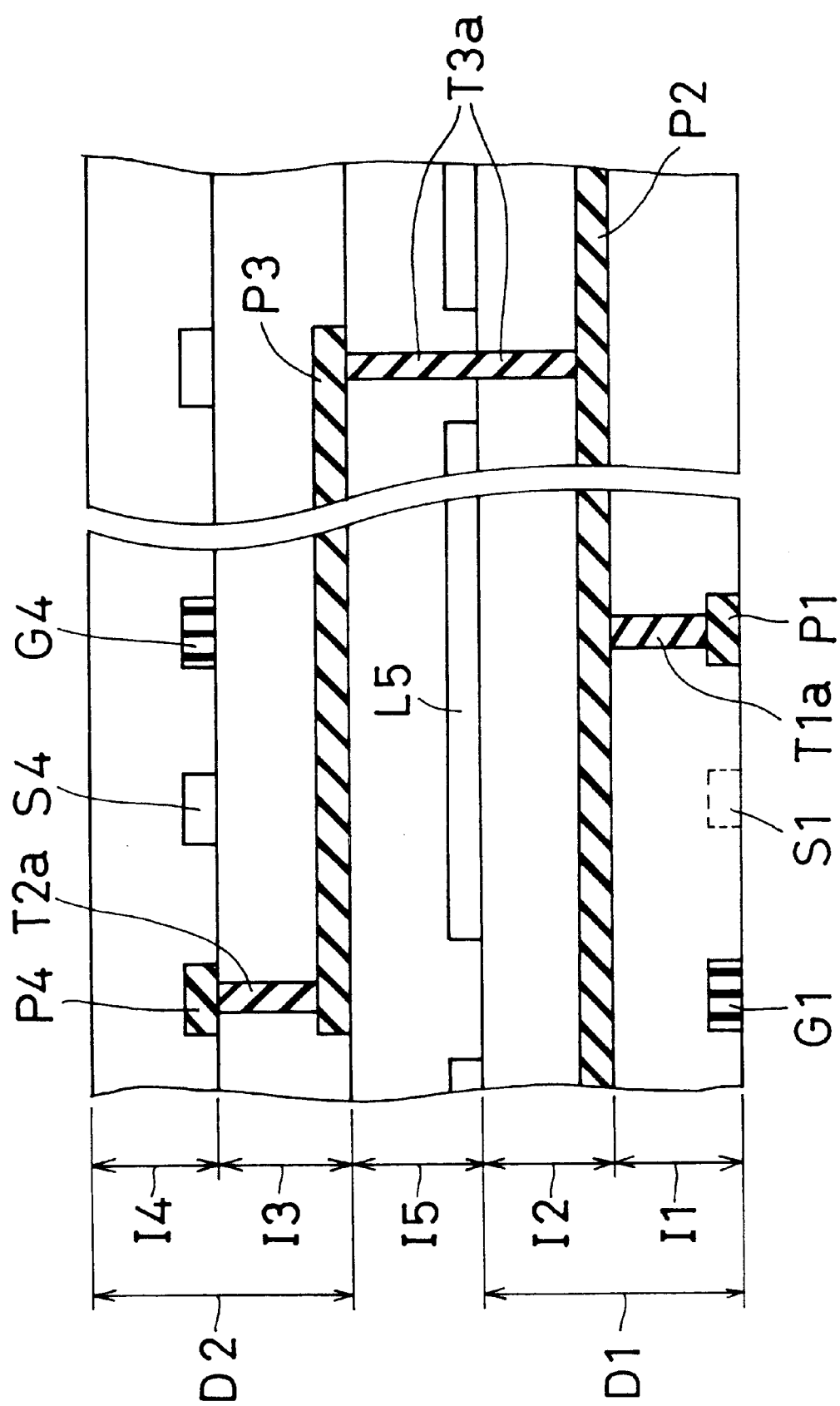

MULTILAYERED WIRING BOARD

BACKGROUND OF THE INVENTION

1. Field of the Invention

The present invention relates to a multilayered wiring board for use in an electronic circuit board or the like, and more particularly to a wiring structure of a multilayered wiring board on which a high speed operating semiconductor device is mounted.

2. Description of the Related Art

Conventionally, in the fabrication of a multilayered wiring board used as an electronic circuit board or the like for mounting thereon an electronic component including a semiconductor device such as a semiconductor integrated circuit device, interconnection conductors for internal wiring are formed by depositing layers of interconnections made of a high melting point metal such as tungsten (W), with an insulating layers made of a ceramic such as alumina formed between them.

In the conventional multilayered wiring board, of the interconnection conductors signal conductors are usually formed in a stripline structure, and above and below each layer of signal conductors is formed a large-area ground layer or power supply layer of the so-called solid pattern, with an insulating layer interposed therebetween.

With increasing speed of electrical signals handled by multilayered wiring boards, it has also been practiced to fabricate high-density, high-functionality multilayered wiring boards that can accommodate the high speed operation of semiconductor devices; that is, in the fabrication of such multilayered wiring boards, an insulating layer is formed using a polyimide resin or epoxy resin having a relatively low dielectric constant of 3.5 to 5 in place of an alumina ceramic whose dielectric constant is about 10, and an internal wiring conductor layer of copper is deposited on the insulating layer by thin film technology using vapor phase deposition such as evaporation or sputtering, and then forming microscopic conductor patterns by photolithography, the process being repeated to form multiple layers alternating between insulators and conductors.

On the other hand, for internal wiring structure within a multilayered wiring board, in order to reduce the impedance of wiring and cross talk between signal conductors and to achieve high density wiring, there has been proposed a wiring structure in which an array of parallel conductors is formed on the upper surface of each insulating layer and a plurality of such layers are stacked one on top of another with designated conductors electrically interconnected between the layers using through conductors such as via hole conductors or through hole conductors.

For example, Japanese Unexamined Patent Publication JP-A 63-129655 (1988) discloses a multilayer wiring structure in which a first conductive layer, having a plurality of first signal lines extending in a first direction and first power lines formed alternately with the first signal lines, and a second conductive layer, having a plurality of second signal lines extending in a second direction orthogonal to the first direction and second power lines formed alternately with the first signal lines, are formed in alternating fashion with an insulating layer interposed therebetween, wherein first and second power lines receiving a corresponding voltage are interconnected. According to this structure, it becomes possible to increase packing density, reduce power consumption, and increase operating speed by making effective use of the chip area of the semiconductor chips mounted thereon.

Further, Japanese Unexamined Patent Publication JP-A 1-96953 (1989) discloses a wiring structure comprising a plurality of sets of wiring planes, wherein each of the sets of wiring planes includes at least first and second wiring planes, each of the wiring planes supporting conductive wiring oriented in a principal wiring direction and further supporting a plurality of connection sites arranged at intersections of orthogonal lines, the principal direction of wiring on the first wiring plane lying at an acute angle to the principal direction of wiring on the second wiring plane. According to this structure, wiring length can be reduced, optimized, or minimized using one or several sets of standardized wiring planes.

Also, Japanese Unexamined Patent Publication JP-A 5-343601 (1993) discloses a connection system for integrated circuits, wherein conductor (wiring conductors) layers comprising no more than two layers of parallel conductor patterns are formed one on top of another with the conductor patterns arranged at right angles to each other, some conductors on the conductor layers are used as signal conductors and the other conductors as power conductors, and the conductors on the conductor layers are interconnected in such a manner that the power conductors shield the signal conductors from each other. According to this system, since a conductor grid is formed in such a manner that each signal pattern is flanked by a pair of power supply patterns, the spacing between signal patterns can be reduced and the signal patterns running in parallel can be formed over an extended length, so that effective use is made of the carrier surface, cross talk is reduced, and S/N ratio is improved.

Further, Japanese Unexamined Patent Publication JP-A 7-94666 (1995) discloses an electrical interconnection medium comprising at least first and second interconnection layers, each of the interconnection layers comprising a plurality of parallel conductive regions, the conductive regions of the second interconnection layer being oriented orthogonally to the conductive regions of the first interconnection layer, the conductive regions of the first and second interconnection layers being electrically interconnected such that at least conductive planes are substantially interdigitated on each interconnection layer and each conductive plane appears on both interconnection layers, and such that selective conductive regions can be electrically isolated from the two conductive planes to form at least one signal path. According to this interconnection medium, the number of interconnect layers is reduced while retaining the low inductance power distribution characteristics of parallel power and ground planes, as well as the high wiring density for signal interconnect wires characteristic of photolithographic fabrication techniques.

Furthermore, Japanese Unexamined Patent Publication JP-A-9-18156 (1997) discloses a multilayer printed wiring board comprising a first layer having a first signal conductor section, a first power conductor section, and a plurality of first ground conductor sections, and a second layer formed on top of the first layer and having a second signal conductor section, a second power conductor section, and a plurality of second ground conductor sections connected one for one to the plurality of first ground conductor sections, wherein the first signal conductor section of the first layer and the second signal conductor section of the second layer are twisted, that is, orthogonal, with respect to each other. According to this structure, since the total number of wiring layers can be reduced, and since the combined conductance value and combined resistance value can be held low even if the wiring width of the ground conductor sections is reduced, high density placement of ICs and other devices becomes possible and noise caused to transmission signals can be held low. Furthermore, since noise due to the mismatch of the characteristic impedance of the signal conductor sections can be reduced because of the shield effect of the ground conductor and power conductor sections, and since the first signal conductor section and the second conductor section are twisted with respect to each other, it becomes possible to control the effects of the cross talk noise caused by the electromagnetic and capacitive couplings between the two signal conductor sections.

In the multilayered wiring boards having parallel conductor arrays as described above, appropriate conductors are selected from each parallel conductor array in the multilayered wiring board in order to electrically connect an electronic component such as a semiconductor device mounted on the multilayered wiring board to the mounting board on which the multilayered wiring board is mounted, and connections between conductors of different wiring layers are made using through conductors such as via hole conductors.

Since these prior art multilayered wiring boards comprise the so-called x- and y-direction wiring planes with the wiring direction of one plane being oriented orthogonal to the wiring direction of the other plane, the prior art has the problem that when interconnecting desired connection terminals via the orthogonally arranged parallel conductor arrays, the interconnection cannot be made along the shortest route and the wiring length in the multilayered wiring board becomes long. That is, the resistance, capacitance, and inductance of signal conductors become larger than would be the case if the interconnection were made along the shortest route, thus resulting in the problem that the rise time of signals which should be operated at high speed increases and noise also increases.

On the other hand, Japanese Unexamined Patent Publication JP-A 59-86248 (1984), for example, discloses a multilayered wiring board comprising a first wiring layer having an array of conductors extending in a first direction, a second wiring layer having an array of conductors extending in a direction orthogonal to the first direction, a third wiring layer having an array of conductors extending in a third direction at an oblique angle to the first direction, and a fourth wiring layer having an array of conductors extending in a direction orthogonal to the third direction, the wiring layers being formed one on top of another in superimposing fashion with each layer separated by an insulating layer. According to this structure, since the two wiring layers having conductor arrays arranged orthogonal to each other and the two wiring layers having conductor arrays arranged orthogonal to each other but at an oblique angle to the first two conductor arrays are formed one on top of another in superimposing fashion with each layer separated by an insulating layer, the wiring length between any two terminals can be reduced compared with other prior art wiring grid structure and cross talk between adjacent connection lines can also be reduced. More specifically, by adding wiring layers having conductor arrays arranged obliquely to the x and y directions, greater freedom is provided in designing wiring connections and the connection wiring length can be reduced compared with multilayered wiring boards having conductor arrays arranged only in the x and y directions.

If the conductor array of a certain wiring layer is not arranged orthogonal to, but is arranged obliquely to, the conductor array of the wiring layer lying directly above or below that certain wiring layer, like the first and second wiring layers and the third and fourth wiring layers in the multilayered wiring board disclosed in Japanese Unexamined Patent Publication JP-A 59-86248 (1984), there arises the problem that unwanted electromagnetic coupling occurs between the conductors, causing cross talk noise between the upper and lower conductors.

The present invention has been devised in view of the above-enumerated problems, and its first object is to provide a multilayered wiring board that permits terminals to be connected efficiently over a distance close to the shortest distance using alternately stacked parallel conductor arrays and without compromising the freedom of wiring arrangement and, at the same time, can reduce cross talk noise between conductors, and that is advantageous for use as an electronic circuit board or the like for mounting thereon an electronic component such as a semiconductor device operating at high speed.

In a multilayered wiring board for mounting thereon a semiconductor device, such as described above, and a semiconductor package using such a wiring board, it is practiced to connect a plurality of capacitors, for example, chip capacitors between the power conductors and the semiconductor device in order to reduce noise from the ground conductors or power conductors connected to the semiconductor device.

These capacitors are usually disposed near the semiconductor device, providing the shortest electrical connections to the power supply terminals of the semiconductor device to minimize the inductance and resistance due to the wiring between the capacitors and the semiconductor device, thus making maximum use of their noise suppression ability. The reason for this is that when a capacitor is interposed between a semiconductor device and a power supply conductor, since the charge is first stored on the capacitor and then supplied to the semiconductor device, noise from the power conductor is buffered and suppressed, ensuring stable power supply; if the distance from the capacitor to the semiconductor device increased, the inductance and capacitance would increase correspondingly, making the semiconductor device more susceptible to noise.

However, in the prior art multilayered wiring boards using parallel conductor arrays as described above, since the wiring direction of the parallel conductor array in each wiring layer is oriented only in the x or y direction, there arises the problem that when an array of parallel conductors extending only in the x or y direction is formed in the first wiring layer lying directly below the surface on which a semiconductor device is mounted, the position where a capacitor can be placed to achieve the shortest connection to the semiconductor device is limited to an area lying in a sideway direction (x direction) or in a crosswise direction (y direction) with respect to the semiconductor device.

That is, if the capacitors are placed in the four directions around the semiconductor device, of these capacitors the capacitors placed in the two directions coinciding with the oriented direction of the parallel conductor array of the first layer lying directly below the surface can achieve the shortest connection to the semiconductor device through the parallel conductor array, but for the other two directions, since the connection cannot be provided through the parallel conductor array of the first layer, the connection has to be made first to the parallel conductor array of the second layer underneath, and then to the semiconductor device via the parallel conductor array of the first layer. As a result, the inductance and resistance of the wiring between these latter capacitors and the semiconductor device increase by an amount equivalent to the parallel conductor arrays of the first and second layers and through conductors interconnecting them, the resulting problem being that, compared with the capacitors placed in the two directions providing the shortest connection via the parallel conductor array of the first layer, the effects of noise on the power supply conductors increase, making stable power supply difficult.

The present invention has been devised in view of the above-enumerated problems, and its second object is to provide a multilayered wiring board that is advantageous for use as a semiconductor package or an electronic circuit board or the like for mounting thereon an electronic component such as a semiconductor device operating at high speed, and that is structured so that the capacitors arranged around the semiconductor device to ensure stable power supply can be placed in areas lying in the four directions around the semiconductor device where noise can be effectively suppressed, thus suppressing the effects of noise while permitting high density placement of the capacitor and achieving a reduction in the size of the board.

In the multilayered wiring boards having parallel conductor arrays as described above, as the operating speeds of electronic components such as semiconductor devices mounted thereon increase, EMI (electromagnetic interference) noise is becoming an important concern. EMI noise is produced when unwanted electromagnetic waves are emitted from electronic equipment and pass into electronic circuits within the electronic equipment or other electronic equipment located nearby, causing interference to the equipment by inducing noise in its electronic circuits. EMI noise may cause the affected equipment to malfunction.

Countermeasures for this EMI noise can be considered at the following three levels. First, the countermeasure at the system level of electronic equipment is to block the emission of electromagnetic waves, for example, by coating the inside of the housing of the equipment with an electromagnetic absorber. Second, the countermeasure at the electronic circuit board level is to use EMI suppression components such as EMI filters and capacitors in the electronic circuit.

Third, the countermeasure at the package level of electronic devices or semiconductor devices is to provide shielding by covering the internal wiring layers with large-area (so-called solid pattern) ground conductor layers.

However, in the prior art multilayered wiring boards as described above, the deficiency of the prior art is that the EMI countermeasure at the package level is not provided because no large-area ground conductor layers are included. Accordingly, there arises the problem that unwanted electromagnetic wave from other electronic equipment causes interference, causing the semiconductor device, etc. to malfunction, or unwanted electromagnetic wave is radiated from internal conductors, causing an ill effect on electronic equipment located nearby.

The present invention has been devised in view of the above-enumerated problems, and its third object is to provide a multilayered wiring board that has a wiring structure comprising orthogonally oriented parallel conductor arrays in multiple layers and capable of reducing cross talk noise between the conductors, that provides means for suppressing the effects of EMI without degrading its electrical characteristics, and that is advantageous for use as an electronic circuit board or the like for mounting thereon an electronic component such as a semiconductor device operating at high speed.

Especially, in recent years, the operating frequencies of semiconductor integrated circuits represented by MPUs (microprocessing units) have been increasing, and semiconductor devices operating at several GHz are being realized.

On the other hand, with increasing operating frequency and packing density of semiconductor devices, increasing EMI noise is becoming a matter of concern. This is because, in a digital device such as an MPU, a signal having a rise speed of several GHz contains harmonic components of frequencies several to ten-odd times the fundamental frequency, and one major cause of EMI noise is the emission of these harmonic components radiated as electromagnetic waves.

One possible measure to prevent the emission of such harmonic components is to provide shielding by completely covering the upper and lower surfaces of wiring layers with a large-area solid pattern ground conductor layer.

However, in the prior art multilayered wiring boards composed of stacked parallel conductor arrays as described above, the deficiency of the prior art is that the EMI countermeasure at the package level is not provided because no large-area ground conductor layers are included. Accordingly, there arises the problem that unwanted electromagnetic wave from other electronic equipment causes interference, causing the semiconductor device, etc. to malfunction, or unwanted electromagnetic wave is radiated from internal conductors, causing an ill effect on electronic equipment located nearby.

When a large-area ground conductor layer is formed above and below parallel conductor array as a countermeasure for EMI noise, since signal conductors disposed opposite the ground conductor layer across an insulating layer have capacitances with respect to the ground conductor layer, there arises the problem that the impedance of the signal conductors arranged by considering the impedance matching (for example, 50 Ω) between the signal conductors becomes lower than the intended value, causing an impedance mismatch between the signal conductors disposed opposite the ground conductor layer and the signal conductors of other wiring layers; this could cause noise or transmission loss of high frequency signals, or could result in malfunctioning of an electronic component such as a semiconductor device mounted on the wiring board.

The present invention has been devised in view of the above-enumerated problems, and its fourth object is to provide a multilayered wiring board which is capable of reducing cross talk noise between conductors in alternately stacked parallel conductor arrays, and advantageous for use as a semiconductor package or an electronic circuit board or the like for mounting thereon an electronic component such as a semiconductor device operating at high speed, in which multilayered wiring board countermeasure against EMI noise is taken without degrading the electrical characteristics, and impedance matching of signal wiring is carried out in order to improve the transmission characteristics of high-frequency signals.

In recent years, with increasing operating speed and packing density of semiconductor devices, among others, semiconductor integrated circuits such as MPUs (microprocessing units), pin count (the number of input/output electrodes) has been increasing, and devices having operating speeds in the GHz band and, in terms of pin count (the number of input/output electrodes), 2000 or more pins are becoming available.

For such semiconductor devices, the prior art multilayered wiring boards having wiring layers of the stripline structure have the problems that since higher pin count means increased number of signals, the number of stacked layers increases because of the increase in the number of deployment layers required to accommodate the increased number of signals using signal conductors and, as a result, the thickness and size of the multilayered wiring board increase, and additionally that cross talk noise between signal wirings is increased with increasing operating frequency and wiring density.

On the other hand, according to the multilayered wiring boards having parallel conductor arrays as described above, by forming signal conductors and power or ground conductors within the same wiring layer, not only can the increase in the number of layers, resulting from increased pin count, be reduced, but cross talk between signal conductors can also be reduced.

However, as the number of input/output electrodes of semiconductor devices increases, electrode spacing decreases to 200 μm or further to 150 μm or less, and the spacing between conductors in parallel conductor arrays also decreases; furthermore, since there are a variety of design schemes for the placement of the input/output electrodes of semiconductor devices, it is becoming extremely difficult to electrically connect such input/output electrodes to the parallel conductor arrays in the prior art multilayered wiring boards having parallel conductor arrays, the problem being that it is difficult to provide good connections to semiconductor devices while making effective use of their excellent electrical characteristics.

The invention has been devised in view of the above-enumerated problems, and its fifth object is to provide a multilayered wiring board having alternately stacked parallel conductor arrays, and more particularly, a multilayered wiring board that permits efficient electrical connections to be made to a semiconductor device having high density input/output terminals while making effective use of its electrical characteristics, and yet permits reductions in the number of stacked layers, the multilayered wiring board thus being advantageous for use as an electronic circuit board or the like for mounting thereon a semiconductor device or the like.

SUMMARY OF THE INVENTION

In order to achieve the first object, the invention provides a multilayered wiring board comprising a first stacked structure consisting essentially of a first insulating layer having a first parallel conductor array and a second insulating layer formed on top of the first insulating layer, having a second parallel conductor array oriented orthogonal to the first parallel conductor array, the first and second parallel conductor arrays being electrically interconnected by a first through conductor array; and a second stacked structure essentially consisting of a third insulating layer having a third parallel conductor array and a fourth insulating layer formed on top of the third insulating layer, having a fourth parallel conductor array oriented orthogonal to the third parallel conductor array, the third and fourth parallel conductor arrays being electrically interconnected by a second through conductor array, wherein the second stacked structure is overlaid on the first stacked structure by interposing therebetween an intermediate insulating layer having a conductive layer disposed opposite at least the first and second parallel conductor arrays, in such a manner that the third parallel conductor array is oriented at 30 to 60 degrees with respect to the first parallel conductor array, and the first or second parallel conductor array and the third or fourth parallel conductor array are electrically interconnected by a third through conductor array formed passing through the conductive layer.

In the invention it is preferable that each of the first to fourth parallel conductor arrays includes a plurality of signal conductors and a plurality of power conductors or ground conductors disposed adjacent to the signal conductors in alternating fashion.

The invention provides a multilayered wiring board comprising:

(a) a first stacked structure D1 including
  (a1) a first insulating layer I1 on one surface of which is formed a first parallel conductor array L1,
  (a2) a second insulating layer I2 on one surface of which is formed a second parallel conductor array L2 oriented orthogonal to the first parallel conductor array L1,
    the second insulating layer I2 being stacked on another surface of the first insulating layer I1, and
  (a3) a first through conductor array T1 for electrically interconnecting the first and second parallel conductor arrays L1 and L2, the first through conductor array T1 passing through the first insulating layer I1 at positions where the first and second parallel conductor arrays L1 and L2 intersect;

(b) a second stacked structure D2 including
  (b1) a third insulating layer I3 on one surface of which is formed a third parallel conductor array L3,
    a direction 1 in which the third parallel conductor array L3 is oriented being inclined at an angle θ1, θ2 of 30 to 60 degrees with respect to a direction 3 in which the first parallel conductor array L1 is oriented,
  (b2) a fourth insulating layer I4 on one surface of which is formed a fourth parallel conductor array L4 oriented orthogonal to the third parallel conductor array L3, the fourth insulating layer I4 being stacked on another surface of the third insulating layer I3, and
  (b3) a second through conductor array T2 for electrically interconnecting the third and fourth parallel conductor arrays L3 and L4, the second through conductor array T2 passing through the third insulating layer I3 at positions where the third and fourth parallel conductor arrays L3 and L4 intersect;

(c) an intermediate insulating layer I5 interposed between another surface of the second insulating layer I2 in the first stacked structure D1 and the one surface of the third insulating layer I3 in the second stacked structure D2, the intermediate insulating layer I5 having a conductive layer L5 formed on one surface thereof which one surface faces the other surface of the second insulating layer I2; and (d) a third through conductor array T3 for electrically interconnecting the second and third parallel conductor arrays L2 and L3, the third through conductor array T3 passing through the intermediate insulating layer I5 at positions where the second and third parallel conductor arrays L2 and L3 intersect.

In the invention it is preferable that the multilayered wiring board further comprises a fourth through conductor array T4 for electrically interconnecting the first and third parallel conductor arrays L1 and L3, the fourth through conductor array T4 passing through the second insulating layer I2 and the intermediate insulating layer I5 at positions where the first and third parallel conductor arrays L1 and L3 intersect and where neither the first parallel conductor array L1 nor the third parallel conductor array L3 intersects the second parallel conductor array L2.

In the invention it is preferable that the multilayered wiring board further comprises a fifth through conductor array T5 for electrically interconnecting the first and fourth parallel conductor arrays L1 and L4, the fifth through conductor array T5 passing through the second insulating layer I2, the intermediate insulating layer I5, and the third insulating layer I3 at positions where the first and fourth parallel conductor arrays L1 and L4 intersect and where the first parallel conductor array L1 and the fourth parallel conductor array L4 intersect neither the second parallel conductor array L2 nor the third parallel conductor array L3.

In the invention it is preferable that each of the first to fourth parallel conductor arrays includes a plurality of signal conductors and a plurality of power conductors or ground conductors disposed adjacent to the signal conductors in alternating fashion.

According to the multilayered wiring board of the invention, since the first parallel conductor array and the second parallel conductor array in the first stacked structure and the third parallel conductor array and the fourth parallel conductor array in the second stacked structure are oriented orthogonal to each other in the respective stacked structures, cross talk noise between the conductors in the respective stacked structures can be reduced to a minimum. Further, since the third and fourth parallel conductor arrays in the second stacked structure are oriented obliquely at an angle of 30 to 60 degrees with respect to the first and second parallel conductor arrays in the first stacked structure, terminals from the first parallel conductor array in the first stacked structure to the fourth parallel conductor array in the second stacked structure can be interconnected over a distance close to the shortest distance without compromising the freedom of wiring arrangement between the terminals; as a result, compared with the prior art multilayered wiring boards comprising parallel conductor arrays only oriented orthogonal to each other, the interconnection wiring length can be shortened and the resistance, capacitance, and inductance of the wiring interconnecting the terminals from the first stacked structure to the second stacked structure can thus be reduced. Furthermore, because of the conductive layer formed by interposing the intermediate insulating layer between the first and second stacked structures, unwanted electromagnetic coupling not only between the second parallel conductor array and the third parallel conductor array but also between the first and second parallel conductor arrays and the third and fourth parallel conductor arrays can be blocked using the conductive layer, and cross talk noise between the first stacked structure and the second stacked structure can be virtually eliminated. Thus, according to the multilayered wiring board of the invention, electronic components such as semiconductor devices operating at high speed can be operated accurately and stably without malfunctioning.

As described above, according to the present invention, a multilayered wiring board can be provided that permits terminals to be connected efficiently over a distance close to the shortest distance using alternately stacked parallel conductor arrays and without compromising the freedom of wiring arrangement and, at the same time, can reduce cross talk noise between conductors, and that is advantageous for use as an electronic circuit board or the like for mounting thereon an electronic component such as a semiconductor device operating at high speed.

In order to achieve the second object, the invention provides a multilayered wiring board comprising:
  a stack composed of a plurality of insulating layers I11 to I14 and a plurality of wiring layers L11 to L14,
    the plurality of insulating layers I11 to I14 and the plurality of wiring layers L11 to L14 being stacked on top of each other in alternating fashion;
  a semiconductor device D mounted on a center region of a surface 11 of the stack; and
  capacitors placed around the semiconductor device,
    the capacitors being electrically connected to the semiconductor device via the wiring layer L11 which is disposed directly below the surface 11,
  wherein in four quadrant regions 12 to 15 of each of the insulating layers with the semiconductor device as a center thereof, a first wiring layer which is the wiring layer L11 disposed directly below the surface 11 includes parallel conductor arrays each directed toward the center 16,
  a second wiring layer which is the wiring layer L12 successive to the wiring layer disposed includes parallel conductor arrays oriented orthogonal to the respective parallel conductor arrays of the first wiring layer L11, and is electrically connected to the first wiring layer L11 via a through conductor array T12, and
  the capacitors are placed above the parallel conductor arrays of the first wiring layer L11 which are opposite to the semiconductor device.

In the invention it is preferable that each of the parallel conductor arrays of the first and second wiring layers L11 and L12 includes a plurality of signal conductors and a plurality of power conductors or ground conductors disposed adjacent to the signal conductors in alternating fashion.

In the invention it is preferable that the insulating layers I11 to I14 are of a same rectangular planar shape, that the quadrant regions 12 to 15 are separated from one another by two straight lines 17 and 18 drawn along diagonals of each of the insulating layers I11 to I14 and that the capacitors C are placed in areas 35 and 36 each extending so as to have a width in a direction of one of two mutually orthogonal sides 27 and 28 and to be parallel to the other of the two sides 27 and 28.

In the invention it is preferable that the insulating layers I21 to I23 are of a same rectangular planar shape, that the quadrant regions 12 to 15 are separated from one another by straight lines 19 and 20 each extending so as to cross one of two mutually perpendicular sides 27 and 28 of each of the insulating layers I21 to I23 and to be parallel to the other of the two sides 27 and 28, and that the capacitors C are placed in areas 25 and 26 along the two diagonals of each of the insulating layers I21 to I23.

According to the multilayered wiring board of the invention, the first wiring layer lying directly below the surface for electrically connecting the semiconductor device mounted on the surface to the capacitors arranged around it is formed from parallel conductor arrays directed toward the center, each parallel conductor array arranged in one of four quadrant regions centered around the semiconductor device, each quadrant region being one of the four regions into which the plane of the wiring layer is divided by two straight lines intersecting at right angles on that plane at a point corresponding to the center of the semiconductor device, and the capacitors are placed above the parallel conductors leading to the semiconductor device, that is, the conductors lying in areas extending from the semiconductor device in directions parallel to the parallel conductor arrays; accordingly, the capacitor placement areas where the capacitors can be connected to the semiconductor device over the shortest distance can be provided in the four directions around the semiconductor device.

Further, since the second wiring layer lying directly below the parallel conductor arrays of the first wiring layer is formed from parallel conductor arrays oriented orthogonal to the parallel conductor arrays of the second wiring layer in the respective quadrant regions, cross talk noise between the upper and lower wiring layers can be reduced and the capacitors' function of ensuring stable power supply can be further enhanced.

As a result, according to the multilayered wiring board of the invention, the capacitor placement areas where noise can be effectively suppressed can be provided in the four directions around the semiconductor device, and high density placement of the capacitors and a reduction in the size of the board can be achieved while suppressing the effects of noise.

As a result, according to the present invention, a multilayered wiring board can be provided that is advantageous for use as a semiconductor package or an electronic circuit board or the like for mounting thereon an electronic component such as a semiconductor device operating at high speed, and that permits high density placement of the capacitors and achieves a reduction in the size of the board, while effectively suppressing the effects of noise.

In order to achieve the third object, the invention provides a multilayered wiring board comprising a stacked wiring structure including a first insulating layer I31, a first wiring layer L31 formed in the first insulating layer I31, the first wiring layer L31 comprising parallel conductor arrays each directed toward a point of intersection of two to four straight lines by which the first insulating layer is divided into regions each of which has an approximately equal interior angle, which point of intersection is in a center portion of the first insulating layer;

a second insulating layer I32 stacked on the first insulating layer I31, a second wiring layer L32 formed in the second insulating layer and comprising parallel conductor arrays which are orthogonal to the parallel conductor arrays of the first wiring layer in the regions, and a through conductor array T13, passing through the first insulating layer I31, for electrically interconnecting the first and second wiring layers L31 and L32.

In the invention it is preferable that the second wiring layer has an encircling wiring structure in which the conductors of the parallel conductor arrays in the respective regions are connected together.

In the invention it is preferable that each of the parallel conductor arrays of the first and second wiring layers includes a plurality of signal conductors and power conductors or ground conductors disposed adjacent to the signal conductors.

Furthermore, in the invention it is preferable that an outermost encircling conductor of the encircling wiring structure of the second wiring layer is a ground conductor.

According to the multilayered wiring board of the invention, in the construction of the multilayer wiring structure comprising orthogonally oriented parallel conductor arrays in multiple layers, split regions are set by splitting the insulating layer plane by two to four straight lines intersecting at the center of the insulating layer so that each region has an approximately equal interior angle, the first wiring layer is formed from parallel conductor arrays oriented substantially parallel to directions directed toward the point of intersection, i.e., the center of the insulating layer, each parallel conductor array being arranged in one of the split regions, the second wiring layer is formed from parallel conductor arrays oriented substantially parallel to directions orthogonal to the parallel conductor arrays of the first wiring layer in the respective split regions, and the first and second wiring layers are electrically interconnected by a through conductor array; as a result, the power conductors and the ground conductors of the parallel conductor arrays forming the second wiring layer are arranged in a substantially encircling wiring configuration encircling the center portion of the insulating layer, and by optimizing these power conductors and ground conductors this structure has the effect of providing shielding to block the infiltration of external EMI noise as well as the emission of unwanted electromagnetic wave to the outside, thus providing an effective countermeasure against EMI while reducing cross talk noise between the conductors.

Furthermore, since the split regions are set by splitting the insulating layer plane by two to four straight lines intersecting at the center of the insulating layer so that each region has an approximately equal interior angle, the freedom of wiring arrangement can be enhanced and the wiring length reduced, reducing the resistance, inductance, and capacitance.

Furthermore, when each of the parallel conductor arrays of the first and second wiring layers is formed to include a plurality of signal conductors and a plurality of power conductors or ground conductors disposed adjacent to the signal conductors in alternating fashion, cross talk noise can be effectively reduced by electromagnetically shielding the signal conductors lying on the same plane, and the inductance of the power conductors and ground conductors can be reduced, effectively reducing power supply noise as well as ground noise.

When the second wiring layer is formed in an encircling wiring structure by interconnecting its parallel conductor arrays in the respective regions, by optimizing the power conductors and the ground conductors in the parallel conductor arrays, this encircling wiring structure serves to enhance the effectiveness of the EMI countermeasure, and thus provides more effective means for suppressing the effects of EMI.

Further, when the outermost conductor of the encircling wiring structure of the second wiring layer is a ground conductor, this encircling ground conductor provides very effective shielding means against EMI noise, and contributes to further enhancing the effectiveness of the EMI countermeasure.

Thus, according to the multilayered wiring board of the invention, the wiring structure comprises orthogonally oriented parallel conductor arrays in multiple layers and capable of reducing cross talk noise between the conductors, and the second wiring layer is structured to provide shielding against EMI noise to implement means for suppressing the effects of EMI without degrading its electrical characteristics, so that the electronic component such as a semiconductor device operating at high speed can be operated accurately and stably without malfunctioning.

As described above, according to the present invention, a multilayered wiring board can be provided that has a wiring structure comprising orthogonally oriented parallel conductor arrays in multiple layers and capable of reducing cross talk noise between the conductors, that provides means for suppressing the effects of EMI without degrading its electrical characteristics, and that is advantageous for use as an electronic circuit board or the like for mounting thereon an electronic component such as a semiconductor device operating at high speed.

In order to achieve the fourth object, the invention provides a multilayered wiring board comprising a stacked wiring structure including a first insulating layer having a first parallel conductor array including signal conductors, and a second insulating layer having a second parallel conductor array including signal conductors, the second insulating layer being stacked on the first insulating layer, the second parallel conductor array being oriented orthogonal to the first parallel conductor array, and a through conductor array for electrically interconnecting the first and second parallel conductor arrays; and a ground conductor layer with openings each of which is opposed to the signal conductors and has a width of 500 µm or less, disposed on or under the stacked wiring structure.

The invention provides a multilayered wiring board comprising:
- (a) a stacked wiring structure including
  - (a1) a first insulating layer I72 on one surface of which is formed a first parallel conductor array L71 including a first signal conductor S71 for carrying an electrical signal,
  - (a2) a second insulating layer I73 on one surface of which is formed a second parallel conductor array L72 which is oriented orthogonal to the first parallel conductor array L71 and includes a second signal conductor S72 for carrying an electrical signal, the second insulating layer I73 being stacked on another surface of the first insulating layer I72, and
  - (a3) a through conductor array T71 for electrically interconnecting the first and second parallel conductor arrays L71 and L72, the through conductor array T71 passing through the first insulating layer I72 at positions where the first and second parallel conductor arrays L71 and L72 intersect; and
- (b) a ground conductor layer GL formed on another surface of the second insulating layer I73 and having an opening A which is opposed to the second signal conductor S72 and has a width of 500 µm or less.

The invention provides a multilayered wiring board as shown in FIG. 14. In an embodiment in FIG. 14, the respective parts corresponding to those in FIG. 12 are denoted by the same reference characters as those in FIG. 12 for the purpose of providing a clear understanding. The multilayered wiring board of the invention comprises:
- (a) a stacked wiring structure including
  - (a1) a first insulating layer I73 on one surface of which is formed a first parallel conductor array L73 including a first signal conductor S73 for carrying an electrical signal,
  - (a2) a second including layer I71 on one surface of which is formed a second parallel conductor array L71 which is oriented orthogonal to the first parallel conductor array L73 and includes a second signal conductor S71 for carrying an electrical signal, the second insulating layer I71 being stacked on another surface of the first insulating layer I73, and
  - (a3) a through conductor array T74 for electrically interconnecting the first and second parallel conductor arrays L73 and L71, the through conductor array T74 passing through the first insulating layer I71 at positions where the first and second parallel conductor arrays L73 and L71 intersect;
- (b) a third insulating layer I74 one surface of which is overlaid on the one surface of the first insulating layer I73; and
- (c) a ground conductor layer GL formed on another surface of the third insulating layer I74 and having an opening A which is opposed to the first signal conductor S73 and has a width of 500 µm or less.

In the invention it is preferable that the opening A has an area equal to or more than 50% of an area of the signal conductor S72, S73 formed to be opposed to the opening A.

In the invention it is preferable that each of the first and second parallel conductor arrays L71, L72 and L73 includes a plurality of signal conductors S71, S72 and S73 and power conductors P71, P72 and P73 or ground conductors G71, G72 and G73 disposed adjacent to the signal conductors S71, S72 and S73 in alternating fashion.

According to the multilayered wiring board of the invention, since the stacked wiring structure constructed by interconnecting the orthogonally oriented parallel conductor arrays by a through conductor array, each parallel conductor array having a signal conductors, is provided on its upper or lower surface with a large-area ground conductor layer having openings arranged to be opposed to the signal conductors, an excess capacitive components hardly occurs between the signal conductors and the ground conductor layer. Accordingly impedance mismatching caused by adverse effect of the ground conductor layer thereon never occurs to the signal conductors, and the signal conductors will be in the state of impedance matching owing to electromagnetic connection with the adjacent conductors. Further, since each opening formed in the ground conductor layer is 500 µm or less in width, the frequency of a high-frequency signal which passes through the opening can be sufficiently shifted to the high-frequency side, and there is no possibility of EMI noise entering or radiating through the opening, with the result that the ground conductor layer can be used as a shield layer having a sufficient shielding effect against EMI noise.

Further, when each opening is formed to have an area not smaller than 50% of the area of the signal conductor formed opposite the opening, though the capacitance of the signal conductor becomes correspondingly higher than would be the case if the opening area were made equal to 100% of the signal conductor area, its influence can be suppressed below a level that can cause a practical problem; therefore, if a capacitive component occurs on the signal conductor, the resulting impedance mismatching can be held within tolerable limits so as not to cause a detrimental effect to the transmission characteristics of a high frequency signal and, at the same time, the EMI noise shielding effect of the ground conductor layer can be further enhanced.

Further, each opening formed in the ground conductor layer is made to have an area not smaller than 50% of the area of the signal conductor formed opposite the opening, whereby the impedance matching of the signal conductors can be enhanced, while enhancing transmission characteristics of a high-frequency signal, and at the same time the EMI noise shielding effect of the ground conductor layer can be further enhanced.

Furthermore, when each of the first and second parallel conductor arrays is formed to include a plurality of signal conductors and a plurality of power conductors or ground conductors disposed adjacent to the signal conductors in alternating fashion, cross talk noise between adjacent signal conductors on the same plane can be effectively reduced by electromagnetically shielding the signal conductors on the same insulating layer, and power supply noise and ground noise can also be reduced effectively.

As described above, according to the present invention, in the multilayered wiring board, the alternatively stacked parallel conductor arrays can reduce cross talk noise between conductors, and the ground conductor layer having a prescribed opening can improve the transmission characteristics of high-frequency signals as well as providing countermeasure against EMI noise, with the result that electronic components such as semiconductor devices can be allowed to operate at high speed accurately and stably without malfunctioning. Thus, the multilayered wiring board of the invention is advantageous for use in a semiconductor package or electronic circuit board or the like.

In order to achieve the fifth object, the invention provides a multilayered wiring board comprising:

a plurality of insulating layers I82 to I84 and a plurality of wiring layers C82 and C83 stacked sequentially in alternating fashion;

a stripline section 71 disposed below a mounting region M of the semiconductor device D provided in a center portion of a surface 78, the stripline section 71 comprising an upper conductor layer C81, a line conductor layer C82 formed from a plurality of line conductors to which terminals of the semiconductor device are connected via a first through conductor array T81, and a lower conductor layer C83; and a parallel conductor section 79 constructed by electrically interconnecting, through a second through conductor array T82, a first wiring layer L81 formed in the same plane as the line conductor layer C82 in such a manner as to encircle the stripline section 71, and divided into split regions 74 to 77 by two to four straight lines 72, 73 intersecting at a point 16 within the mounting region M so that each split region has an approximately equal interior angle $\theta 11$, $\theta 12$, each split region containing a first parallel conductor array directed toward the point of intersection 16, and a second wiring layer L82 formed in the same plane as the lower conductor layer C83, and comprising second parallel conductor arrays oriented orthogonal to the first wiring layer in the respective split regions, wherein the semiconductor device is electrically connected to the first wiring layer L81 via the line conductor layer C82.

In the invention it is preferable that each of the parallel conductor arrays of the first and second wiring layers includes a plurality of signal conductors and a plurality of power conductors or ground conductors disposed adjacent to the signal conductors in alternating fashion.

The invention provides a wiring board comprising:

(a) a first insulating layer I81, I82 having a mounting region M for mounting a semiconductor device D formed substantially centrally on a surface 78 thereof;

(b) an upper conductor layer C81 formed on the other surface of the first insulating layer I81, I82 and underneath the mounting region M;

(c) a second insulating layer I82 formed to have a surface facing the other surface of the first insulating layer I81, I82 and the upper conductor layer C81;

(d) a line conductor layer C82 comprising a plurality of line conductors, the line conductor layer C82 being formed on the other surface of the second insulating layer I83 and underneath the mounting region M;

(e) a first through conductor array T81, passing through the first and second insulating layers I81, I82 and I83, for electrically connecting the semiconductor device D to the line conductors of the line conductor layer C82;

(f) a third insulating layer I84 formed to have one surface facing the other surface of the second insulating layer I83 and the line conductor layer C82;

(g) a lower conductor layer C83 formed on the other surface of the third insulating layer I84 and underneath the mounting region M, the lower conductor layer C83 forming a stripline section 71 together with the upper conductor layer C81 and the line conductor layer C82;

(h) a first wiring layer L81 interposed between the other surface of the first insulating layer I83 and the one surface of the third insulating layer I84, the first wiring layer L81 having a plurality of first parallel conductor arrays, each of the first parallel conductor arrays being formed in one of a plurality of split regions 74 to 77 formed around the stripline section 71, the split regions 74 to 77 being separated by two to four straight lines 72, 73; 17, 18; 19, 20; 41 to 43; 53 to 56 intersecting at a point 16 within the mounting region so that interior angles $\theta 11$, $\theta 12$; $\theta 1$, $\theta 2$; $\theta 3$; $\theta 4$; $\theta 5$ to $\theta 7$; $\theta 81$ to $\theta 84$ are approximately equal, and each of the first parallel conductor arrays being oriented in a direction parallel to a direction directed toward the point of intersection 16;

(i) a second wiring layer L82 formed on the other surface of the third insulating layer I84, the second wiring layer L82 having a plurality of second parallel conductor arrays, each of the second parallel conductor arrays being formed in one of the split regions 74 to 77, and the second parallel conductor arrays being oriented orthogonal to the first parallel conductor arrays in the respective split regions 74 to 77; and (j) a second through conductor array T82, passing through the third insulating layer I84, for electrically interconnecting the first and second wiring layers L81 and L82, the second through conductor array T82 forming a parallel conductor section 79, together with the first and second wiring layers L81 and L82.

In the invention it is preferable that a ground or power conductor layer GL1 is embedded in the first and second insulating layers I81 and I82 over a range from the stripline section 71 to the parallel conductor section 79, and the ground or power conductor layer GL1 is electrically connected to at least either the upper conductor layer C81 or the lower conductor layer C83.

In the invention it is preferable that pitches W3 and W4 of the first and second parallel conductor arrays are each chosen to be greater than the pitch W2 of the line conductors of the line conductor layer C82 (W3>W2 and W4>W2).

Further, in the invention it is preferable that one or more devices are selected as the semiconductor device D from the group consisting of a microprocessing unit, an application specific integrated circuit, and a digital signal processor.

In the invention it is preferable that the insulating layers are formed of one or more materials selected from the group consisting of inorganic insulating material, organic insulating material, and composite insulating material made up of a mixture of inorganic insulating material and organic insulating material.

According to the multilayered wiring board of the invention, the stripline section having the line conductor layer to which the input/output terminals of the semiconductor device are connected via the first through conductor array is formed inside the multilayered wiring board directly beneath the semiconductor mounting region, and the parallel conductor section electrically connected to the line conductor layer and comprising parallel conductor arrays, one in each of approximately equal four to eight split regions separated by two to four straight lines intersecting within the mounting region, is formed encircling the stripline section, thereby electrically connecting the mounted semiconductor device to the first wiring layer of the parallel conductor section via the line conductor layer; accordingly, since the narrow wiring pitch (conductor spacing) of the line conductors connected to the input/output electrodes of the semiconductor device arranged at a very high density can be spread out in the stripline section 71, and the signal conductors, power conductors, and ground conductors are rearranged and expanded to wider pitches for connection to the parallel conductor section, the semiconductor device having high-density input/output electrodes can be electrically connected efficiently, while making effective use of the excellent electrical characteristics of the parallel conductor section. Furthermore, by using the stripline section, or by stacking a plurality of such stripline sections one on top of another, the signal conductors, power conductors, and ground conductors leading from the semiconductor device can be efficiently rearranged and expanded into optimum wiring arrangement for connection to the encircling parallel conductor section. Accordingly, when the number of layers has to be increased to accommodate a higher density semiconductor device, the number of stacked layers can be reduced by optimizing the wiring design.

Furthermore the invention provides a package for housing a semiconductor device comprising the above-mentioned multilayered wiring board.

BRIEF DESCRIPTION OF THE DRAWINGS

Other and further objects, features, and advantages of the invention will be more explicit from the following detailed description taken with reference to the drawings wherein:

FIG. 2 is a cross sectional view of the multilayered wiring board with cross sections taken along line A1—A1 in FIG. 1A, line A2—A2 in FIG. 1b, line A3—A3 in FIG. 1C, line A4-A4a–A4b-A4 in FIG. 10, and line A5—A5 in FIG. 1E;

DETAILED DESCRIPTION OF THE PREFERRED EMBODIMENTS

Figure 1B:
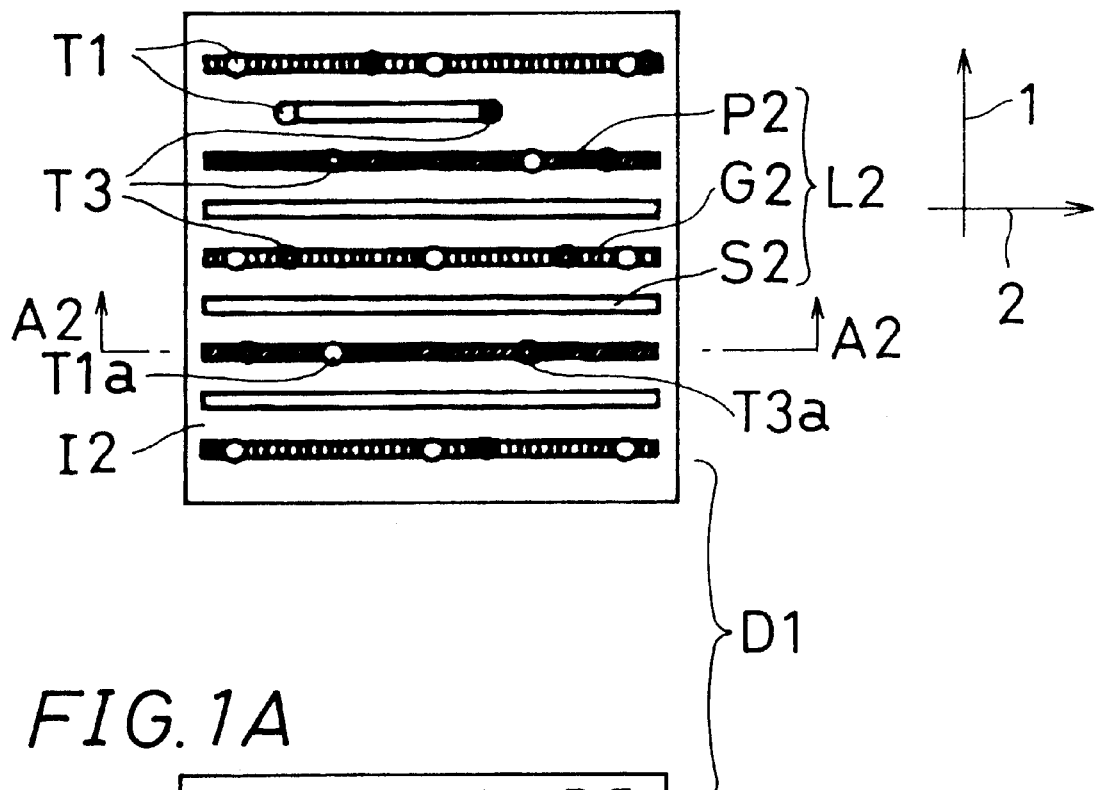
FIGS. 1A to 1E are plan views of individual insulating layers, respectively, illustrating one embodiment of a multilayered wiring board according to the present invention.

Now referring to the drawings, preferred embodiments of the invention are described below.

Figure 1A:
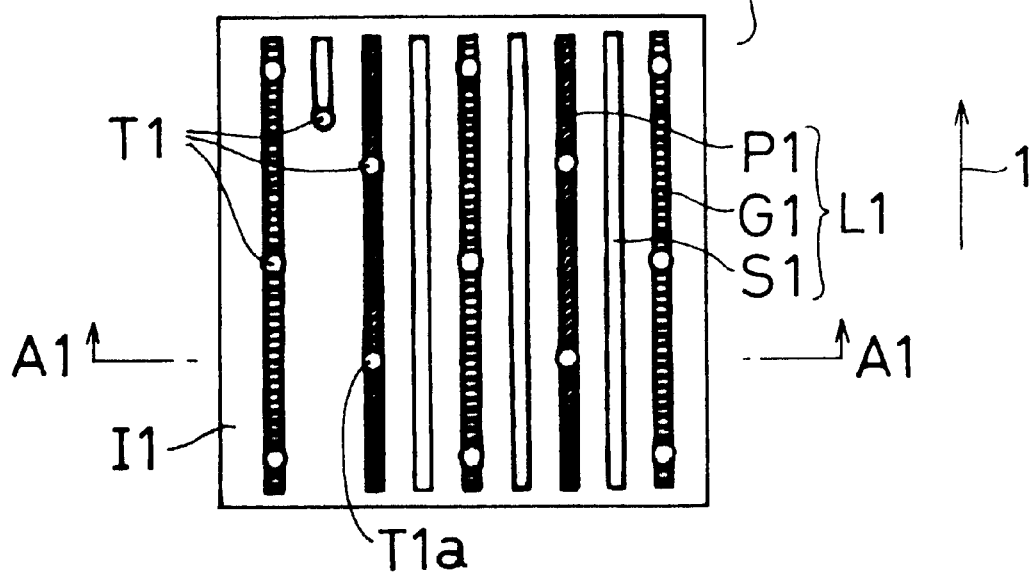
Figure 1E:
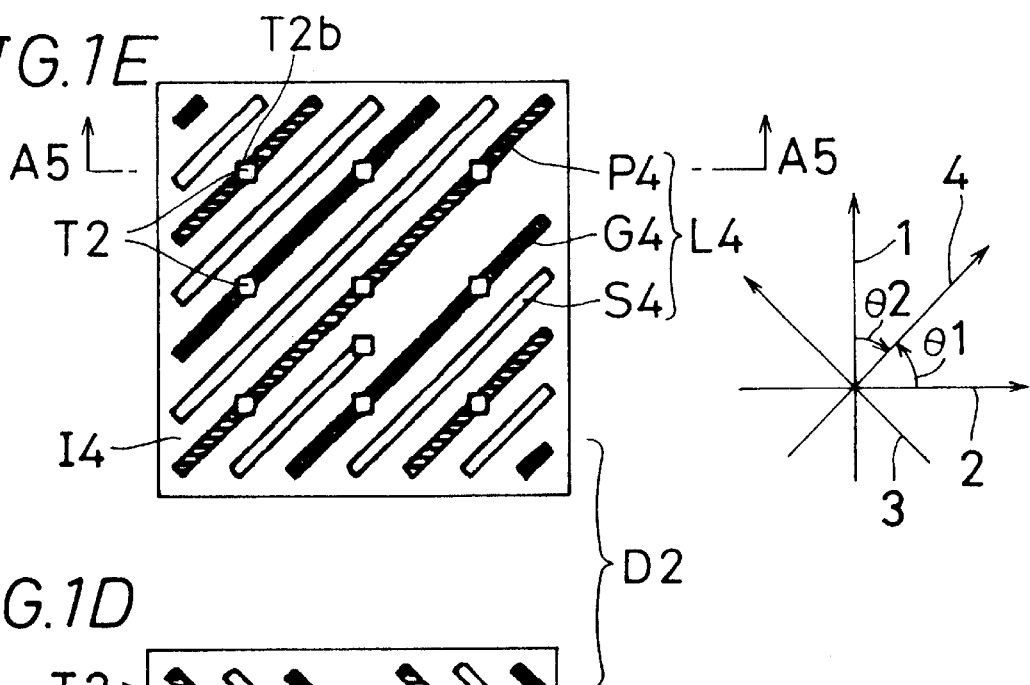
Figure 1D:
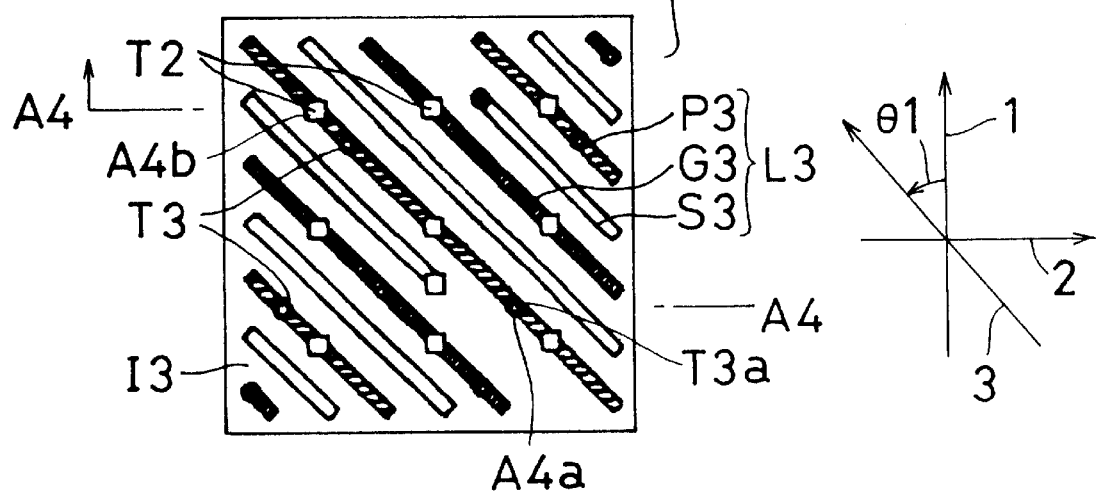
Figure 1C:
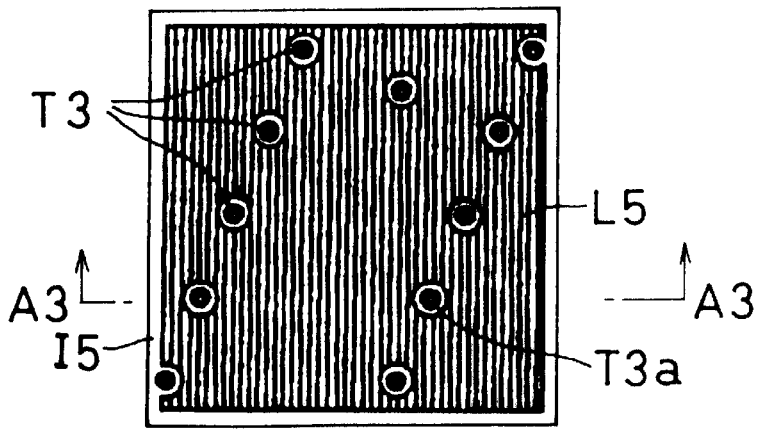

FIGS. 1A to 1E are broken apart plan views illustrating one embodiment of the multilayered wiring board according to the present invention; FIG. 1A is a plan view of a first insulating layer I1, FIG. 1B is a plan view of a second insulating layer I2, FIG. 1C is a plan view of an intermediate insulating layer I5, FIG. 1D is a plan view of a third insulating layer I3, and FIG. 1E is a plan view of a fourth insulating layer I4.

FIG. 2 is a cross sectional view of the multilayered wiring board with cross sections taken along line A1—A1 in FIG. 1A, line A2—A2 in FIG. 1B, line A3—A3 in FIG. 1C, line A4-A4a–A4b-A4 in FIG. 1D, and line A5—A5 in FIG. 1E.

The multilayered wiring board shown here is constructed by stacking the first insulating layer I1, the second insulating layer I2, the intermediate insulating layer I5, the third insulating layer I3, and the fourth insulating layer I4 in this order from the bottom to the top in FIG. 2.

In the figures, I1 to I4 and I5 are the first to fourth insulating layers and the intermediate insulating layer, respectively, L1 to L4 are first to fourth parallel conductor arrays formed in a substantially parallel arrangement on the upper surface of the first to fourth insulating layer I1 to I4, respectively, and L5 is a conductive layer, usually a power supply layer or a ground layer, formed on the upper surface of the intermediate insulating layer I5 in such a manner as to face at least the first and second parallel conductor arrays L1 and L2. Further, P1 to P4 are power conductors in the first to fourth parallel conductor arrays L1 to L4, respectively, G1 to G4 are ground conductors in the first to fourth parallel conductor arrays L1 to L4, respectively, and S1 to S4 are signal conductors in the first to fourth parallel conductor arrays L1 to L4, respectively.

It will be appreciated that the plurality of signal conductors S1 to S4 disposed on the same lane may be made to carry different signals with different signal conductors, and likewise the plurality of power conductors P1 to P4 disposed on the same plane may be made to carry different power supply levels with different power conductors. Connections to external electrical circuitry and connections to an electronic component such as a semiconductor device mounted on the board are not shown here.

The first parallel conductor array L1 formed on the first insulating layer I1 is oriented substantially parallel to a first direction 1, and the second parallel conductor array L2 formed on the second insulating layer I2 is oriented substantially parallel to a second direction 2 orthogonal to the first direction 1, these together forming a first stacked structure D1. Further, the third parallel conductor array L3 formed on the third insulating layer I3 is oriented substantially parallel to a third direction 3 inclined at an angle $\theta 1$ to 30 to 60 degrees with respect to the first direction 1, and the fourth parallel conductor array L4 formed on the fourth insulating layer I4 is oriented substantially parallel to a fourth direction 4 orthogonal to the third direction 3 (and inclined at the angle $\theta 1$ of 30 to 60 degrees with respect to the second direction 2), these together forming a second stacked structure D2. In the illustrated example, the third direction 3 and the fourth direction 4 are inclined at an angle $\theta 1$ of 45 degrees with respect to the first direction 1 and the second direction 2, respectively, so that $\theta 1+\theta 2=90$ degrees.

By setting the third direction obliquely at an angle of 30 to 60 degrees with respect to the first direction as described above, the connection wiring length between terminals from the first parallel conductor array L1 to the fourth parallel conductor array L4 can be made about 20% shorter than would be the case if the first to fourth parallel conductor arrays L1 to L4 were simply arranged orthogonal to each other. Preferably, by setting the inclination angle $\theta 1$ of the third direction to 40 to 50 degrees with respect to the first direction, the wiring length can be further reduced; in particular, when the angle $\theta 1$ is set to about 45 degrees, the wiring length can be shortened by about 30%, and the resistance, capacitance, and inductance resulting from the interconnection of the first to fourth parallel conductor arrays L1 to L4 can each be reduced by about 30%, achieving an optimum interconnection wiring structure.

In the illustrated example, the first to fourth parallel conductor arrays L1 to L4 are each arranged so that the signal conductors S1 to S4, are adjacent to the power conductors P1 to P4, or ground conductors G1 to G4. This arrangement electromagnetically shields the signal conductors from each other on each of the insulating layers I1 to I4, effectively reducing cross talk noise between adjacent signal conductors on the same plane. Furthermore, by arranging the signal conductors S1 to S4 so that no two signal conductors are adjacent to each other without a power conductor P1 to P4, or a ground conductor G1 to G4, being interposed therebetween, the interconnection between the power conductors P1 to P4, and the signal conductors S1 to S4, and between the ground conductors G1 to G4, and the signal conductors S1 to S4, formed on the same plane is maximized, so that current paths of the signal conductors S1 to S4 are the shortest, thus serving to reduce the inductance values of the power conductors P1 to P4 and ground conductors G1 to G4 from the signal conductors S1 to S4. This inductance value reduction contributes to effectively reducing power supply noise as well as ground noise.

T1 to T3 are first to third through conductor arrays of via hole conductors or through-hole conductors. The first through conductor array T1 (each conductor indicated by a circle) electrically interconnects the first parallel conductor array L1 and the second parallel conductor array L2 having the same potential and function, the second through conductor array T2 (each conductor indicated by a square) electrically interconnects the third parallel conductor array L3 and the fourth parallel conductor array L4, and the third through conductor array T3 (each conductor indicated by a double circle) electrically interconnects the first or second parallel conductor array L1 or L2 and the third or fourth parallel conductor array L3 or L4 by passing through the conductive layer L5; the through conductor arrays provide the electrical connections by passing through the respective insulating layers between the respective parallel conductor arrays. When interconnecting the upper and lower parallel conductor arrays through the conductive layer L5 having a different potential and different function, the conductive layer L5 being usually a power supply layer or a ground layer, the third through conductor array T3 passing through the conductive layer L5 is electrically insulated from the conductive layer L5. In the illustrated example, the second parallel conductor array L2 and the third parallel conductor array L3 are interconnected by the third through conductor array T3.

In FIG. 2, reference characters T1a, T2a, and T3a designate individual through conductors in the first to third through conductor arrays T1, T2, and T3.

As described, the multilayered wiring board of the present invention is characterized in that on top of the first insulating layer I1, on the upper surface of which the first conductor array L1 is arranged substantially parallel to the first direction, is formed the second insulating layer I2 on the upper surface of which the second conductor array L2 is arranged substantially parallel to the second direction orthogonal to the first direction, the lower and upper conductor arrays L1 and L2 being electrically interconnected by the first through conductor array T1 to form the first stacked structure D1, while on top of the third insulating layer I3, on the upper surface of which the third conductor array L3 is arranged substantially parallel to the third direction inclined at an angle of 30 to 60 degrees with respect to the first direction, is formed the fourth insulating layer I4 on the upper surface of which the fourth conductor array L4 is arranged substantially parallel to the fourth direction orthogonal to the third direction, the lower and upper conductor arrays L3 and L4 being electrically interconnected by the second through conductor array T2 to form the second stacked structure D2 which is overlaid on the first stacked structure D1 by interposing therebetween the intermediate insulating layer I5 having on its surface the conductive layer L5 disposed opposite at least the first and second conductor arrays L1 and L2, and the first or second conductor array L1 or L2 and the third or fourth conductor array L3 and L4 are electrically interconnected by the third through conductor array T3 passing through the conductive layer L5.

According to the multilayered wiring board of the invention, the first stacked structure D1, constructed with the first and second parallel conductor arrays L1 and L2 formed on the first and second insulating layers I1 and I2, and the second stacked structure D2, constructed with the third and fourth parallel conductor arrays L3 and L4 formed on the third and fourth insulating layers I3 and I4, are separated by the conductive layer L5 formed on the intermediate insulating layer I5, and the upper and lower parallel conductors are electrically connected together by the third through conductor array T3; between the first stacked structure D1 and the second stacked structure D2, this arrangement serves to almost completely prevent unwanted electromagnetic coupling not only between the second parallel conductor array L2 and the third parallel conductor array L3 but also between the first and second parallel conductor arrays L1 and L2 and the third and fourth parallel conductor arrays L3 and L4, and thus, cross talk noise between the first stacked structure D1 and the second stacked structure D2 can be virtually eliminated without compromising the freedom of wiring arrangement.

Formed in such a manner as to face at least the first parallel conductor array L1 and the second parallel conductor array L2, and interposed between the first stacked structure D1 and the second stacked structure D2, the conductive layer L5 deposited on the upper surface of the intermediate insulating layer I5 has the effect of preventing unwanted electromagnetic coupling between the first and second parallel conductor arrays L1 and L2 and the third and fourth parallel conductor arrays L3 and L4, the latter being arranged at an angle of 30 to 60 degrees with respect to the former. The conductive layer L5 may be formed in such a manner as to face the third parallel conductor array L3 and the fourth parallel conductor array L4, but preferably, the conductive layer L5 is formed in such a manner as to face all of the first to fourth parallel conductor arrays L1 to L4.

The conductive layer L5 is usually deposited in the so-called solid pattern on the intermediate insulating layer I5 to form a conductive layer having an area larger than the conductive region of each of the first to fourth parallel conductor arrays L1 to L4, but the conductive layer L5 may be provided with a desired opening or may be deposited in a mesh pattern, the only requirement being the ability to prevent unwanted electromagnetic coupling between the first stacked structure D1 and the second stacked structure D2.

The multilayered wiring board of the invention may be extended beyond the multilayer structure described above; that is, by repeating the same interconnection wiring structure used to construct the second stacked structure D2 on top of the first stacked structure D1, a fifth insulating layer, on the upper surface of which a fifth parallel conductor array is formed substantially parallel to a fifth direction inclined at an angle of 30 to 60 degrees with respect to the third direction, and a sixth insulating layer, on the upper surface of which a sixth parallel conductor array is formed substantially parallel to a sixth direction orthogonal to the fifth direction, may be constructed and stacked on top of the second stacked structure D2 shown in FIGS. 1A to 1E by interposing therebetween an intermediate insulating layer having a conductive layer, with the upper and lower parallel conductor arrays being electrically interconnected by a fourth through conductor array to form a third stacked structure on top of the second stacked structure D2, while electrically interconnecting the second or third parallel conductor array L3 or L4 in the second stacked structure D2 and the fifth or sixth parallel conductor array L5 or L6 in the third stacked structure by means of a fifth through conductor array, thus constructing a multilayered wiring board consisting of the first to third stacked structures. The same stacked wiring structure may be further repeated to construct a multilayered wiring board having a larger number of layers.

In the multilayered wiring board of the invention, the first to fourth insulating layers I1 to I4 and the intermediate insulating layer I5 are formed, for example, by a ceramic green sheet lamination method, using an inorganic insulating material such as an aluminum oxide-based sintered material, aluminum nitride-based sintered material, silicon carbide-based sintered material, silicon nitride-based sintered material, mullite-based sintered material, glass ceramic, etc., or an organic insulating material such as polyimide, epoxy resin, fluorocarbon polymers, polynorbornene, benzocyclobutene, etc., or an electrical insulating material such as a composite insulating material formed by binding a ceramic powder or other inorganic insulating powder with a thermosetting resin such as an epoxy-based resin.

For example, when forming the first to fourth insulating layers I1 to I4 and the intermediate insulating layer I5 from an aluminum oxide-based sintered material, a raw material powder of aluminum oxide, silicon oxide, calcium oxide, magnesium oxide, or the like, is mixed with a suitable organic binder, solvent, etc. to form a slurry which is then formed into a sheet using a prior known doctor blade method to obtain a ceramic green sheet, after which the ceramic green sheet is suitably punched and a parallel conductor array, a through conductor array, or a metal paste as a conductive layer, whichever is required, is printed in a desired pattern for coating; then, a plurality of such ceramic green sheets are stacked one on top of another, and the stacked structure is baked at a temperature of about 1600° C. in a reducing atmosphere to complete the fabrication.

The thicknesses of the insulating layers I1 to I5 are appropriately set according to the properties of the material used, so as to satisfy conditions such as the mechanical strength and electrical characteristics conforming to the required specifications and the ease of formation of through conductor arrays.

The first to fourth parallel conductor arrays L1 to L4, the first to third through conductor arrays T1 to T3, and the conductive layer L5 are formed, for example, by the metalization of a metallic powder of tungsten, molybdenum, molybdenum-manganese, copper, silver, silver-palladium, or the like, or formed from a thin film of a metallic material such as copper, silver, nickel, chromium, titanium, gold, niobium, or their alloys.

When forming them by the metalization of a metallic powder of tungsten, for example, a metal paste prepared by adding and mixing a suitable organic binder, solvent, etc. into a tungsten powder is printed in a desired pattern for coating on the ceramic green sheets formed as the insulating layers I1 to I5, and the ceramic green sheets coated with such patterns are baked to complete the fabrication of the multilayer stacked structure with the desired patterns formed on the respective insulating layers I1 to I5.

When forming them from a thin film of a metallic material, first a metal layer is formed, for example, by sputtering, vacuum evaporation, or plating, and then the metal layer is formed into the desired conductor pattern using photolithography.

The width of each conductor and the spacing between conductors in the first to fourth parallel conductor arrays L1 to L4 are appropriately set according to the properties of the material used, so as to satisfy conditions such as the electrical characteristics conforming to the required specifications and the ease of formation on the respective insulating layers I1 to I5.

The thickness of each of the parallel conductor arrays L1 to L4 is preferably set to about 1 to 20 μm. If the thickness is less than 1 μm, the conductor resistance becomes large, tending to make it difficult to supply sufficient power to the semiconductor device through conductors, to provide stable ground, and to ensure good signal propagation. On the other hand, if the thickness exceeds 20 μm, the cladding provided by the insulating layer formed overlying the conductors may become insufficient, causing an insulation failure.

The through conductors of the first to third through conductor arrays T1 to T3 may be formed circular in cross section or may be formed in elliptical, square, rectangular, or other irregular shapes. Their positions and sizes are appropriately chosen according to the properties of the material used, so as to satisfy conditions such as the electrical characteristics conforming to the required specifications and the ease of their formation and placement in the insulating layers I1 to I5.

When the insulating layers are formed from an aluminum oxide-based sintered material and the parallel conductor arrays are formed by the metalization of tungsten, for example, if the thickness of each insulating layer is 200 μm, the line width of each conductor is 100 μm, the spacing between conductors is 150 μm, and the size of each through conductor is 100 μm, then the impedance of signal conductors can be made 50 Ω, and the upper and lower parallel conductor arrays can be electrically interconnected while suppressing reflections of high frequency signals.

Figure 3:
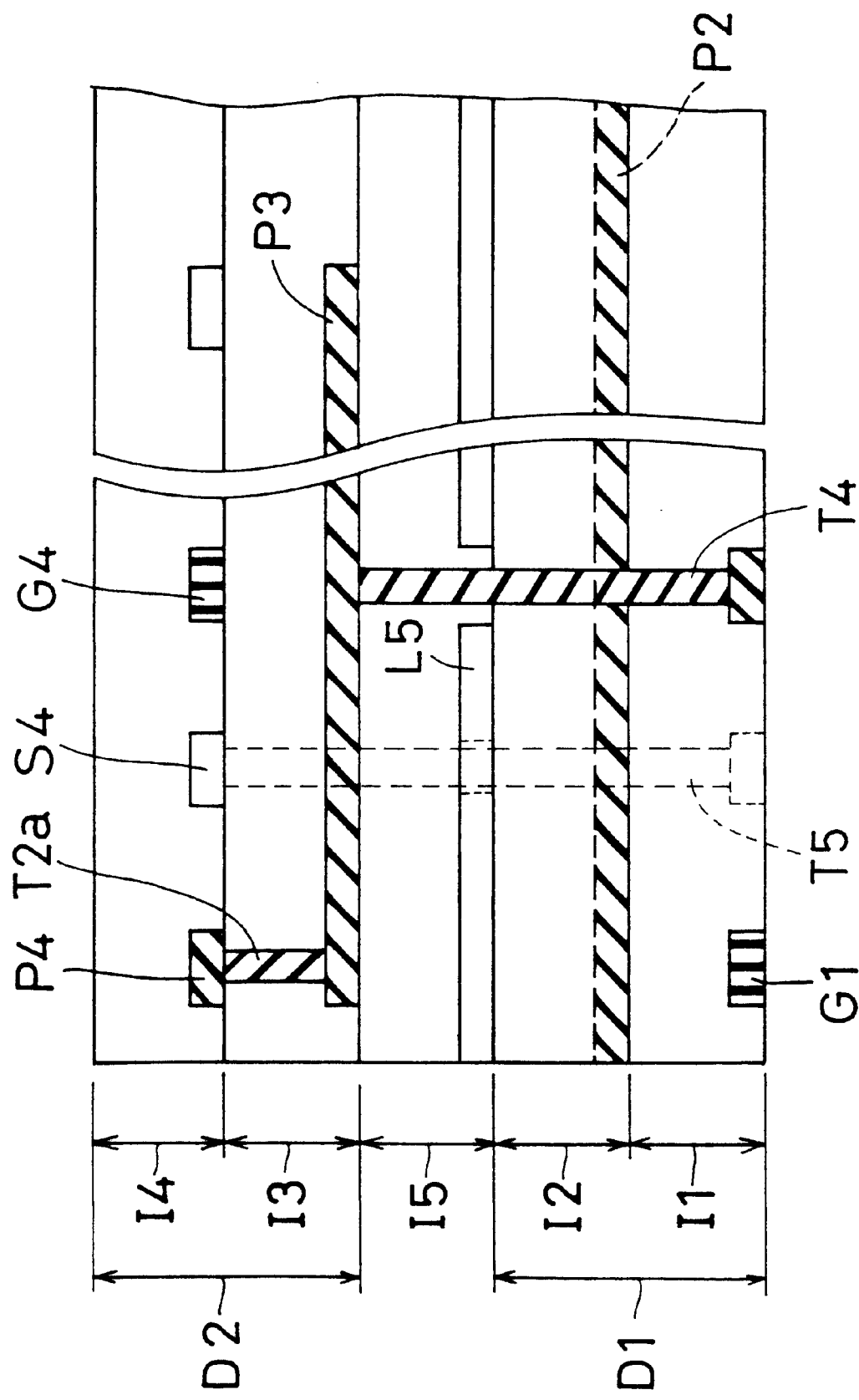
FIG. 3 is a cross sectional view showing another embodiment of the present invention.

FIG. 3 is a cross sectional view showing another embodiment of the present invention. The embodiment shown in FIG. 3 is similar to the embodiment shown in FIGS. 1A to 1E and 2, and corresponding portions are designated by the same reference characters. In this embodiment, a fourth through conductor array T4 is provided which is formed passing through the second insulating layer T2 and the intermediate insulating layer I5. The fourth through conductor array T4 is formed where the first and third parallel conductor arrays L1 and L3 intersect and where neither the first parallel conductor array L1 nor the third parallel conductor array L3 intersects the second parallel conductor array L2. The fourth through conductor array T4 thus electrically interconnects the first and third parallel conductor arrays L1 and L3.

In still another embodiment of the present invention, a fifth through conductor array indicated by an imaginary line T5 in FIG. 3 is provided. The fifth through conductor array T5 is formed passing through the second insulating layer I2, the intermediate insulating layer I5, and the third insulating layer I3. The fifth through conductor array T5 is formed where the first and fourth parallel conductor arrays L1 and L4 intersect and where the first parallel conductor array L1 and the fourth parallel conductor array L4 intersect neither the second parallel conductor array L2 nor the third parallel conductor array L3. The fifth through conductor array T5 thus electrically interconnects the first and fourth parallel conductor arrays L1 and L4.

In a further embodiment of the present invention, the multilayered wiring board having the structure shown in FIGS. 1 to 3 may be implemented.

Figure 4A:
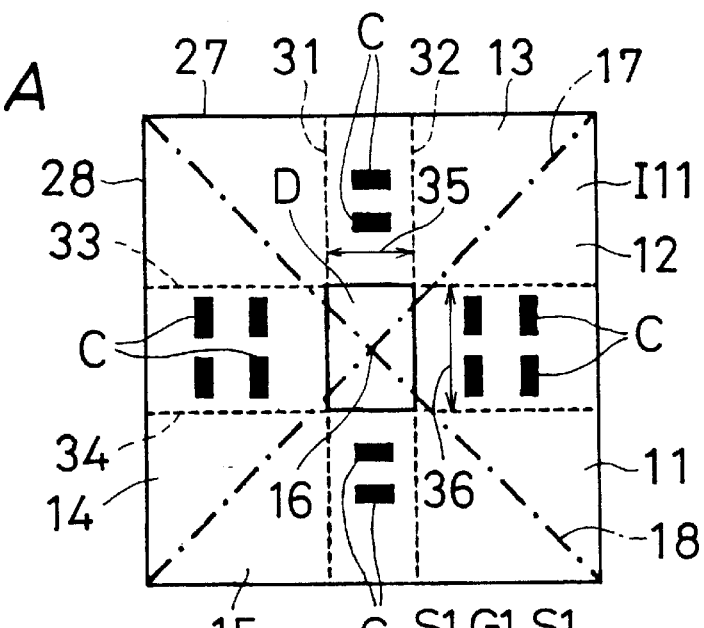
FIGS. 4A to 4C are plan view of first to third insulating layers, respectively, illustrating one embodiment of a multilayered wiring board according to the present invention.
Figure 4B:
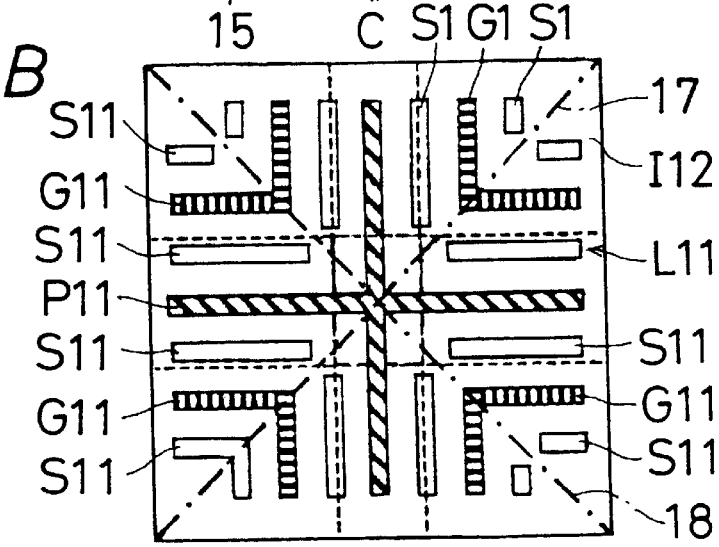
Figure 4C:
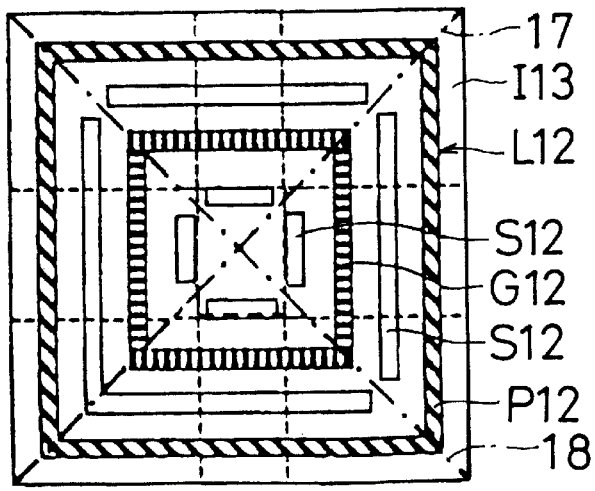
Figure 5:
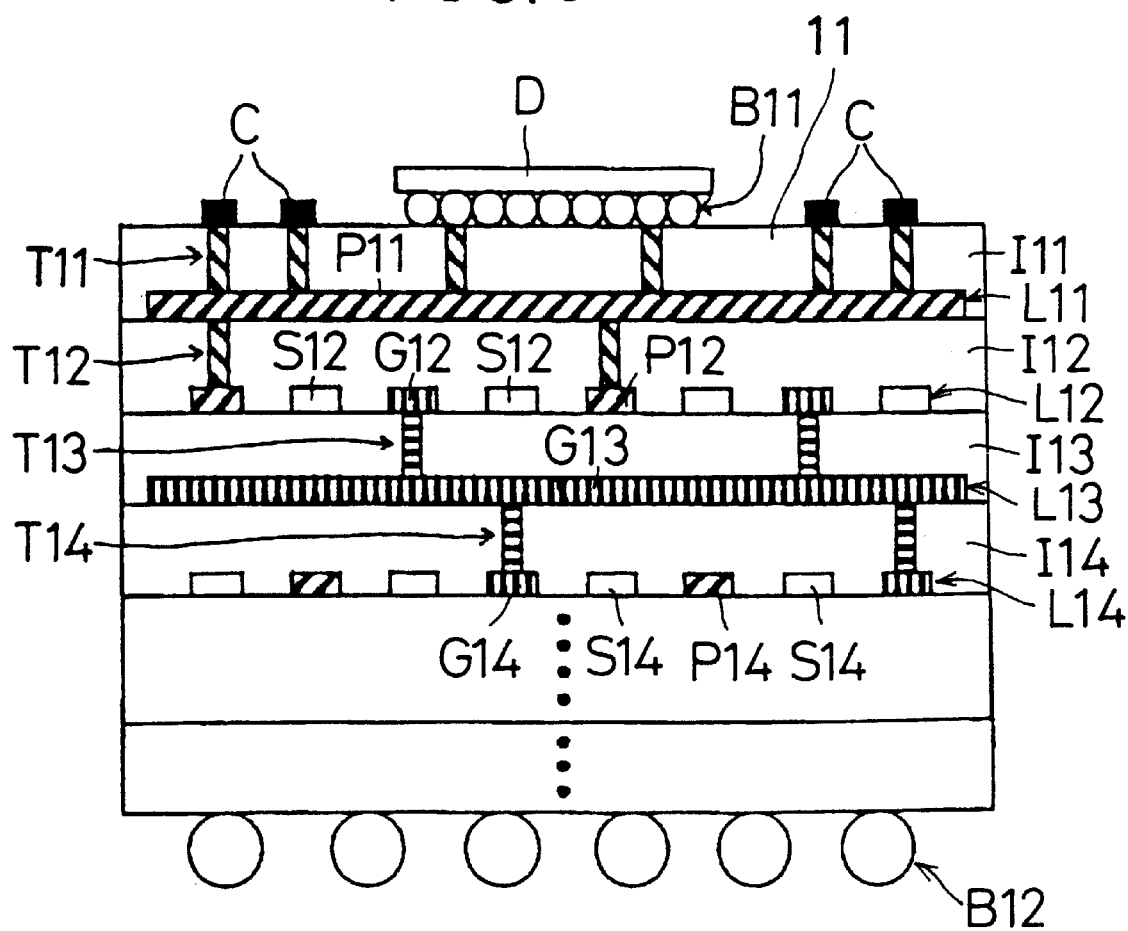
FIG. 5 is a cross sectional view showing the multilayered wiring board constructed with the layers of FIGS. 4A to 4C stacked one on top of another.

FIG. 4 shows broken apart plan views illustrating one embodiment of the multilayered wiring board according to the present invention: FIG. 4A is a plan view of a first insulating layer I11 forming a surface 11 of the multilayered wiring board, FIG. 4B is a plan view of a second insulating layer I12 on which is formed a first wiring layer L11 lying directly below the surface, and FIG. 4C is a plan view of a third insulating layer I13 on which is formed a second wiring layer L12. FIG. 5 is a cross sectional view of a multilayer structure constructed by staking these layers.

In FIG. 4, I11 to I14 are the first to fourth insulating layers, and L11 to L13 are the first to third wiring layers formed on the upper surfaces of the second to fourth insulating layers I12 to I14, respectively. In FIG. 4, however, plan views only of the first to third insulating layers I11 to I13 are shown, and in FIG. 5, the details of the fifth and lower layers are omitted.

P11 to P13 are power conductors formed in the first to third wiring layers L11 to L13, respectively, G11 to G13 are ground conductors formed in the first to third wiring layers L11 to L13, respectively, and S11 to S13 are signal conductors formed in the first to third wiring layers L11 to L13, respectively.

It will be appreciated that the plurality of signal conductors S11 to S13 disposed on the same plane may be made to carry different signals with different signal conductors, and likewise the plurality of power conductors P11 to P13 disposed on the same plane may be made to carry different power supply levels with different power conductors.

Reference character D indicates a semiconductor device mounted in the center 16 of the surface 11 of the multilayered wiring board; usually, a semiconductor device such as an MPU (microprocessing unit), an ASIC (application specific integrated circuit), or a DSP (digital signal processor) is mounted. The semiconductor device D is electrically connected to the first wiring layer L11 by being mounted on the surface of the multilayered wiring board using, for example, so-called bump electrodes B11 or the like, as shown in FIG. 5, or by being attached to the mounting portion with an adhesive or a brazing material and using bonding wires, etc.

Reference character C designates capacitors placed around the semiconductor device D on the surface of the multilayered wiring board. The capacitors C are electrically connected to the power conductors P11 and the ground conductors G11 in the first wiring layer L11 via a through conductor array T11, and also to power supply electrodes and ground electrodes on the semiconductor device D via the power conductors P11 in the first layer or via conductors or the like formed on the surface of the first insulating layer I11.

In the example shown here, a plurality of chip capacitors are shown as the capacitors C, but the capacitors C may be implemented as interlayer-type capacitors formed between a wiring layer formed on the surface 11 of the first insulating layer I11 and the power conductors P11 or the ground conductors G11 in the first wiring layer, with the first insulating layer I11 interposed therebetween. Alternatively, electrolytic capacitors using a tantalum sintered material or the like may be used.

T11 to T14 are through conductor arrays formed through the first to fourth insulating layers I11 to I14, respectively. The through conductors are formed passing through the respective insulating layers I11 to I14 to electrically interconnect the upper and lower wiring layers or to electrically connect the respective wiring layers to the semiconductor device D or the capacitors C, or external connection terminals B12 or the like attached to a surface of the multilayered wiring board. These through conductor arrays T11 to T14 consist of through-hole conductors or via conductors, and are formed in a plurality of positions where connections are needed.

In the multilayered wiring board of the present invention, the first wiring layer L11 formed on the second insulating layer I12 directly beneath the surface is divided into four quadrant regions 12 to 15 by two straight lines 17 and 18 intersecting, for example, at right angles, as indicated by semi-dashed lines in FIG. 4, at the center 16 of the second insulating layer I12 corresponding to the center of the semiconductor device D, and each quadrant region contains a parallel conductor array oriented substantially parallel to a direction directed toward the center 16. In the illustrated example, the two straight lines 17 and 18 intersecting at right angles at the center 16 of the semiconductor device D are set so as to be substantially coincident with the diagonals of the substantially square-shaped insulating layers I11 to I13.

The second wiring layer L12 formed on the third insulating layer I13 comprises parallel conductor arrays, one in each of the four quadrant regions 12 to 15, the parallel conductor array in each quadrant region being oriented substantially parallel to a direction orthogonal to the direction along which the parallel conductor array in the same quadrant region of the first wiring layer L11 is oriented.

The first and second wiring layers L11 and L12 are electrically interconnected at desired places in each of the quadrant region 12 to 15 by a through conductor array T12. This quadrant structure has the effect of reducing cross talk noise between the upper and lower wiring layers, similarly to the prior art wiring board structure having orthogonally oriented parallel conductor arrays.

In the illustrated example, the parallel conductor arrays in the first and second wiring layers L11 and L12 are arranged so that the signal conductors S11, S12 are adjacent to the power conductors P11, P12 or ground conductors G11, G12. This arrangement provides electromagnetic shielding between the signal conductors S11, S12 formed on the same insulating layer I12, I13, and thus effectively reduces cross talk noise between the adjacent signal conductors S11, S12 on the same plane.

Furthermore, by arranging the signal conductors S11, S12 so that no two signal conductors are adjacent to each other without a power conductor P11, P12 or a ground conductor G11, G12 being interposed therebetween, the interconnection between the power conductors P11, P12 and the signal conductors S11, S12 and between the ground conductors G11, G12 and the signal conductors S11, S12 formed on the same plane is maximized, so that current paths of the signal conductor S11, S12 are the shortest, thus serving to reduce the inductance values of the power conductors P11 and P12 and ground conductors G11 and G12 from the signal conductors S11, S12. This inductance value reduction contributes to effectively reducing power supply noise as well as ground noise.

In addition, in the multilayered wiring board of the invention, the capacitors C arranged around the semiconductor device D on the surface are placed above the parallel conductors of the first wiring layer L11 that are directed to the semiconductor device D and located in areas 35 and 36 bounded by dotted lines 31, 32 and 33, 34 in FIG. 4, these parallel conductors forming part of the parallel conductor arrays of the first wiring layer L11 formed directly beneath the surface 11 and oriented in directions toward the center in the respective quadrant regions 12 to 15.

With this arrangement, the capacitor placement areas where the capacitors C can be connected to the semiconductor device D over the shortest distance can be provided in the four directions around the semiconductor device D, and in this way, the placement density of the capacitors C can be increased and the multilayered wiring board be reduced in size, while suppressing the effects of noise to the power supply by the interposition of the capacitors C.

The external connection terminals B12 need not necessarily be limited to the ball-shaped bump electrodes shown in FIG. 5, but various other types such as electrode pads or line conductors can be used according to the type of external electrical circuit to which the multilayered wiring board is connected.

Figure 6A:
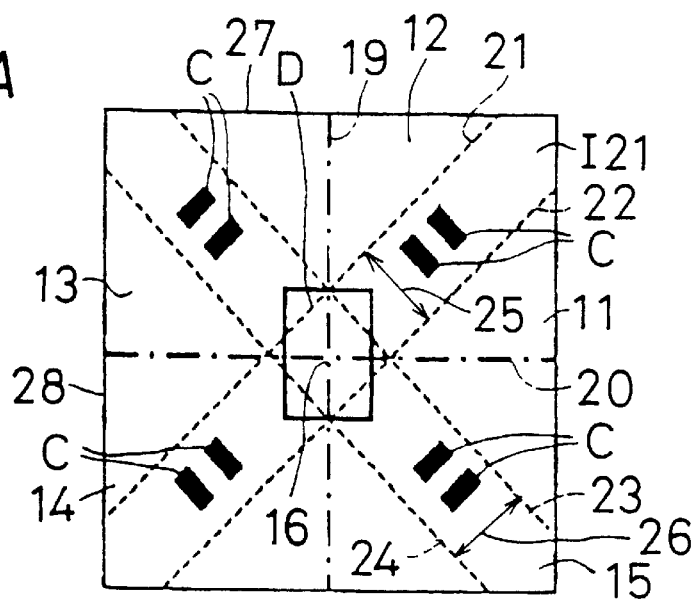
FIGS. 6A to 6C are plan view of the first to third insulting layers, respectively, illustrating another example of the embodiment of the multilayered wiring board according to the present invention.
Figure 6B:
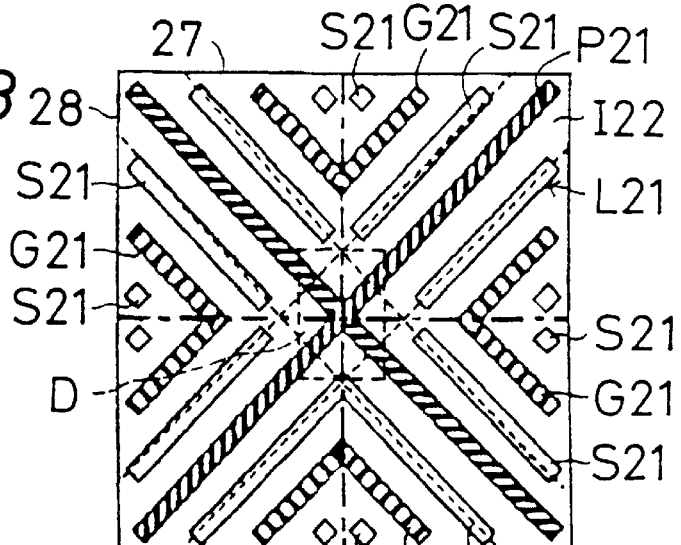
Figure 6C:
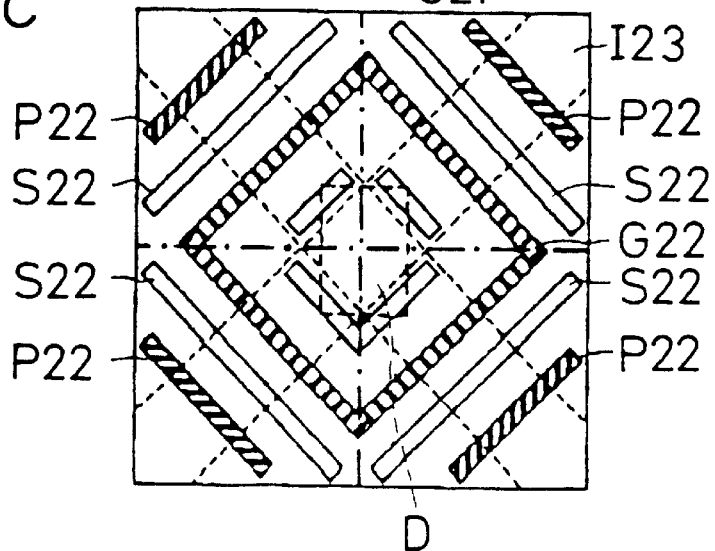

FIGS. 6A to 6C show plan views, similar to those of FIGS. 4A to 4C, illustrating another example of the embodiment of the multilayered wiring board according to the present invention.

In FIG. 6, the same portions as those in FIG. 4 are designated by the same alphabetic characters followed by numerals ending with the same numeric characters 1 to 3 as in the numerals 21 to 23. While, in the example of FIG. 4, the two straight lines 17 and 18 dividing the plane into the four quadrant regions are set along the diagonals of the substantially square-shaped second and third insulating layers I12 and I13, in the example of FIG. 6 the two straight lines 19 and 20 (indicated by semi-dashed lines in FIG. 6) are set as lines each passing through about the midpoint of one of mutually perpendicular sides 27 and 28 of the second and third insulating layers I22 and I23 and extending in parallel to its adjacent side 28 or 27, respectively.

Here, the capacitors C arranged around the semiconductor device D are placed above the parallel conductors of the first wiring layer L21 that are directed to the semiconductor device D and located in areas 25 and 26 bounded by dotted lines 21, 22 and 23, 24 in FIG. 6 and extending along the diagonals of the insulating layer, these parallel conductors forming part of the parallel conductor arrays of the first wiring layer L21 formed directly beneath the surface 11 and oriented in directions toward the center 16 in the respective quadrant regions 12 to 15.

As described, according to the multilayered wiring board of the invention on which the plurality of capacitors C are arranged around the semiconductor device D mounted on the surface thereof, the capacitor placement areas where the capacitors C can be connected to the semiconductor device D over the shortest distance can be provided in four directions, i.e., in the four quadrant regions 12 to 15 arranged about the center 16 of the semiconductor device D, and thus the multilayered wiring board of the invention can be reduced in size while reducing the effects of noise caused to the power supply conductors leading to the semiconductor device D; this compares favorably with the prior art multilayered wiring boards having orthogonally oriented parallel conductor arrays, in which such capacitor placement areas can be provided only in two directions parallel to the wiring direction of the parallel conductor array in the first layer lying directly beneath the surface. Furthermore, since the parallel conductor arrays on the first and second wiring layers L11 and L12 are oriented orthogonal to each other in the respective quadrant regions 12 to 15, cross talk between the conductors can be reduced, and these combined, the placement density of the capacitors C can be increased and the multilayered wiring board can be reduced in size while suppressing the effects of noise caused to the power supply to the semiconductor device D.

In the multilayered wiring boards of the invention shown in FIGS. 4 and 6, various wiring structures can be employed for the multilayer wiring section comprising fourth and lower insulating layers I14, I24, etc. and third and lower wiring layers L13, L23, etc. to be stacked below the above-described board structure. For example, a wiring structure constructed from multiple layers of parallel conductors alternately oriented at right angles, or a wiring structure employing a stripline structure, or various other wiring structures employing a microstrip line structure, coplanar line structure, etc. can be selected for use according to the specifications, etc. required of the multilayered wiring board.

Furthermore, an electronic circuit may be constructed, for example, by stacking polyimide insulating layers and conductive layers formed by copper evaporation. Also, a semiconductor package may be constructed by attaching such components as chip resistors, thin-film resistors, coil inductors, cross capacitors, etc.

The shape of each of the insulating layers including the first to third insulating layers I11 to I13, I21 to I23 is not limited to the substantially square shape shown in FIGS. 4 to 6, but other shapes such as a rectangular or rhombic shape may be employed.

Furthermore, the wiring layers including the first and second wiring layers L11, L21 and L12, L22 are not limited to being formed on the surfaces of the respective insulating layers including the second and third insulating layers I12, I22, and I13, I23, but the wiring layers may be formed within the respective insulating layers including the first insulating layer I11, I21.

In the multilayered wiring board of the invention, the insulating layers including the first to third insulating layers I11 to I13, I21 to I23 are formed, for example, by a ceramic green sheet lamination method, using an inorganic insulating material such as an aluminum oxide-based sintered material, aluminum nitride-based sintered material, silicon carbide-based sintered material, silicon nitride-based sintered material, mullite-based sintered material, glass ceramic, etc., or an organic insulating material such as polyimide, epoxy resin, fluorocarbon polymers, polynorbornene, benzocyclobutene, etc., or an electrical insulating material such as a composite insulating material formed by binding a ceramic powder or other inorganic insulating powder with a thermosetting resin such as an epoxy-based resin.

For example, when forming the insulating layers from an aluminum oxide-based sintered material, a raw material powder of aluminum oxide, silicon oxide, calcium oxide, magnesium oxide, or the like, is mixed with a suitable organic binder, solvent, etc. to form a slurry which is then formed into a sheet using a prior known doctor blade method to obtain a ceramic green sheet, after which the ceramic green sheet is suitably punched and a parallel conductor array, a through conductor array, or a metal paste as a conductive layer, whichever is required, is printed in a desired pattern for coating; then, a plurality of such ceramic green sheets are stacked one on top of another, and the stacked structure is baked at a temperature of about 1600° C. in a reducing atmosphere to complete the fabrication.

The thicknesses of the insulating layers are appropriately set according to the properties of the material used, so as to satisfy conditions such as the mechanical strength and electrical characteristics conforming to the required specifications and the ease of formation of through conductor arrays.

The parallel conductor arrays forming the first and second wiring layers L11, L21 and L12, L22, and other wiring layers and through conductors, are formed, for example, by the metalization of a metallic powder of tungsten, molybdenum, molybdenum-manganese, copper, silver, silver-palladium, or the like, or formed from a thin film of a metallic material such as copper, silver, nickel, chromium, titanium, gold, niobium, or their alloys.

When forming them by the metalization of a metallic powder of tungsten, for example, a metal paste prepared by adding and mixing a suitable organic binder, solvent, etc. into a tungsten powder is printed in a desired pattern for coating on the ceramic green sheets formed as the insulating layers, and the ceramic green sheets coated with such patterns are baked to complete the fabrication of the stacked multilayer structure with the desired patterns formed on or within the respective insulating layers.

When forming them from a thin film of a metallic material, first a metal layer is formed, for example, by sputtering, vacuum evaporation, or plating, and then the metal layer is formed into the desired conductor pattern using photolithography.

The width of each conductor and the spacing between conductors in the parallel conductor arrays forming the first and second wiring layers L11, L21 and L12, L22 are appropriately set according to the properties of the material used, so as to satisfy conditions such as the electrical characteristics conforming to the required specifications and the ease of formation on the respective insulating layers I12, I22 and I13, I23.

The thickness of each of the wiring layers L11, L21 and L12, L22 is preferably set to about 1 to 20 $\mu$m. If the thickness is less than 1 $\mu$m, the conductor resistance becomes large, tending to make it difficult to supply sufficient power to the semiconductor device through conductors, to provide stable ground, and to ensure good signal propagation. On the other hand, if the thickness exceeds 20 $\mu$m, the cladding provided by the insulating layer formed overlying the conductors may become insufficient, causing an insulation failure.

The through conductors of each through conductor array may be formed circular in cross section or may be formed in elliptical, square, rectangular, or other irregular shapes. Their positions and sizes are appropriately chosen according to the properties of the material used, so as to satisfy conditions such as the electrical characteristics conforming to the required specifications and the ease of their formation and placement in the insulating layers.

When the insulating layers are formed from an aluminum oxide-based sintered material and the parallel conductor arrays are formed by the metalization of tungsten, for example, if the thickness of each insulating layer is 200 $\mu$m, the line width of each conductor is 100 $\mu$m, the spacing between conductors is 150 $\mu$m, and the size of each through conductor is 100 $\mu$m, then the impedance of signal conductors can be made 50 $\Omega$, and the upper and lower parallel conductor arrays can be electrically interconnected while suppressing reflections of high frequency signals.

Figure 7A:
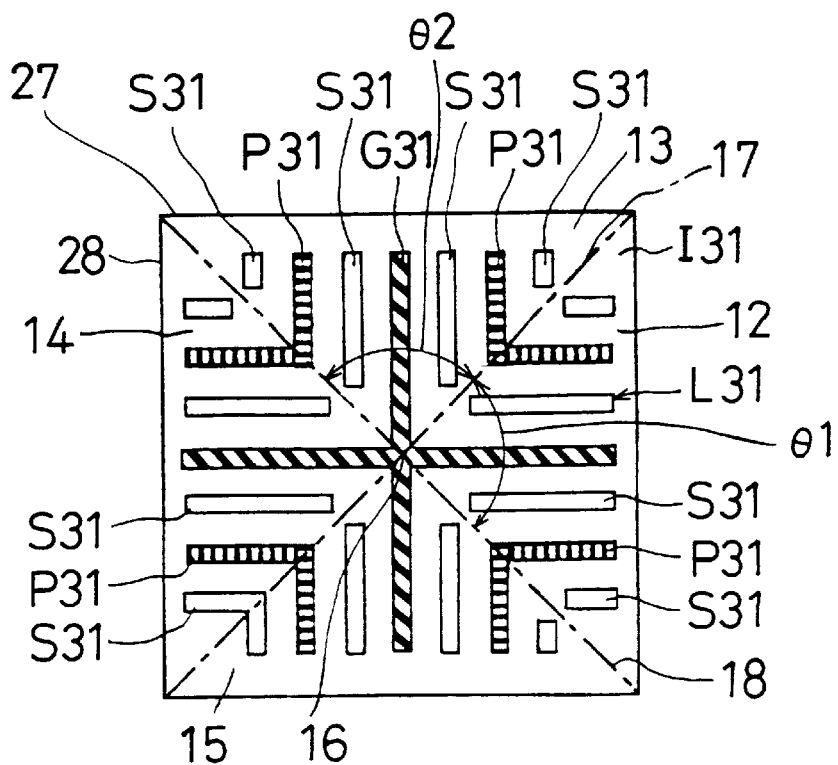
FIGS. 7A and 7B are plan views of first and second insulating layers, respectively, illustrating one embodiment of a multilayered wiring board according to the present invention.
Figure 7B:
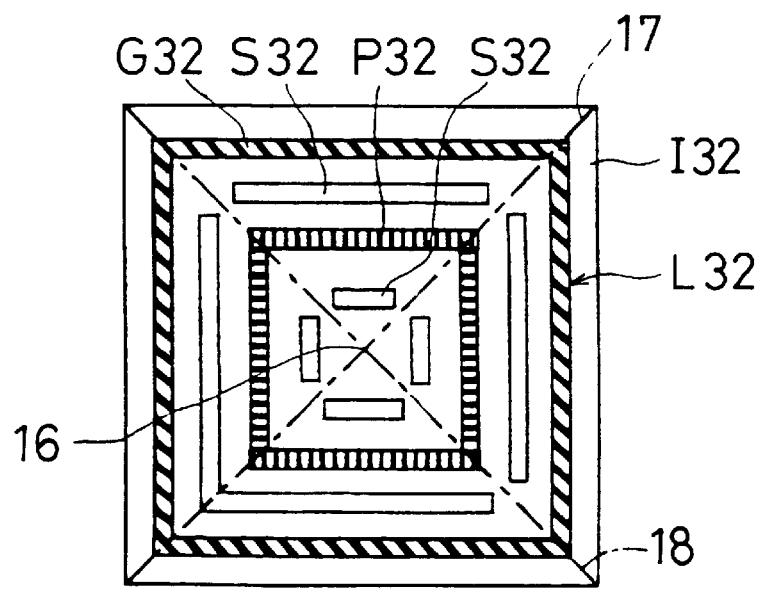

FIGS. 7A and 7B are broken apart plan views illustrating one embodiment of the multilayered wiring board according to the present invention: FIG. 7A shows a plan view of a first insulating layer I31, and FIG. 7B shows a plan view of a second insulating layer I32.

The embodiment shown in FIG. 7 is similar to the embodiment described with reference to FIGS. 4 and 5; the first insulating layer I31 in FIG. 7A corresponds to the insulating layer I12 in FIG. 4B, and the second insulating layer I32 in FIG. 7B corresponds to the insulating layer I13 in FIG. 4C, the layer structure being similar between these two embodiments. The embodiment of FIG. 7 may be constructed to include the insulating layer I11 shown in FIG. 4A.

In the plan views of FIG. 7, I31 and I32 are the first and second insulating layers, and L31 and L32 are the first and second wiring layers formed on the upper surfaces of the first and second insulating layers I31 and I32, respectively. Further, P31 and P32 are power conductors in the first and second wiring layers L31 and L32, respectively, G31 and G32 are ground conductors in the first and second wiring layers L31 and L32, respectively, and S31 and S32 are signal conductors in the first and second wiring layers L31 and L32, respectively.

It will be appreciated that the plurality of signal conductors S31, S32 disposed on the same plane may be made to carry different signals with different signal conductors, and likewise the plurality of power conductors P31, P32 disposed on the same plane may be made to carry different power supply levels with different power conductors. Though not shown in FIG. 7, connections to external electrical circuitry and connections to an electronic component such as a semiconductor device are the same as those shown in FIGS. 4 and 5.

The first wiring layer L31 formed on the first insulating layer I31 is divided into regions 12 to 15 by two straight lines 17 and 18 (indicated by semi-dashed lines in FIG. 7) intersecting at the center 16 of the first insulating layer I31 so that the respective regions have approximately equal interior angles $\theta 1$ and $\theta 2$, and each region comprises a parallel conductor array directed toward the intersection point 16, i.e., the center of the first insulating layer I31. In the example shown here, the area is divided into the four regions 12 to 15 by the two straight lines 17 and 18 along the diagonals of the substantially square-shaped first insulating layer I31 so that each region has an interior angle $\theta 1$, $\theta 2$ of about 90 degrees.

On the other hand, the second wiring layer L32 formed on the second insulating layer I32 comprises parallel conductor arrays oriented orthogonal to the parallel conductor arrays of the first wiring layer L31 in the respective regions 12 to 15.

In the illustrated example, the parallel conductor arrays in the respective regions 12 to 15 of the second wiring layer L32 are interconnected to form a substantially square-shaped encircling wiring structure with each of the conductors oriented parallel to one of mutually perpendicular sides 27 and 28 of the substantially square-shaped second insulating layer I32

The parallel conductors of the first wiring layer L31 are connected at suitable places by the through conductor array T13 (see FIG. 5, not shown in FIG. 7) formed in the first insulating layer I31 to the corresponding parallel conductors of the second wiring layer L32 (for example, S31 to S32), thus forming a stacked wiring structure comprising orthogonally oriented parallel conductor arrays in each region. The through conductor array T13 here is formed passing through the first insulating layer I31.

Further, in the illustrated example, the first and second wiring layers L31 and L32 are formed so that the signal conductors S31, S32 are adjacent on both sides to the power conductors P31, P32 and ground conductors G31, G32. This arrangement provides electromagnetic shielding between the signal conductors S31, S32 formed on the same insulating layer I31, I32, and thus effectively reduces cross talk noise between the adjacent signal conductors S31, S32 on the same plane. Furthermore, by arranging the signal conductors S31, S32 so that no two signal conductors are adjacent to each other without a power conductor P31, P32 or a ground conductor G31, G32 being interposed therebetween, the interaction between the power conductors P31, P32 and the signal conductors S31, S32 and between the ground conductors G31, G32 and the signal conductors S31, S32 formed on the same plane is maximized, so that cuurrent paths of the signal conductors S31, S32 are the shortest, thus serving to reduce the inductance values of the power conductors P31 and P32 and ground conductors G31 and G32 from the signal conductors S31, S32. This inductance value reduction contributes to effectively reducing power supply noise as well as ground noise in device switching.

According to the multilayered wiring board of the invention, since the regions 12 to 15 are set as described above, and since the stacked wiring structure is constructed by forming the parallel conductor assays L31 and L32 oriented orthogonal to each other in the respective regions, the power conductors P32 and the ground conductors G32 of the parallel conductor arrays constituting the second wiring layer L32 form a substantially encircling wiring structure encircling the center portion 16 of the second insulating layer I32, and by optimizing these power conductors P32 and ground conductors G32, this structure has the effect of providing shielding to block the infiltration of external EMI noise as well as the radiation of unwanted electromagnetic wave to the outside, thus providing an effective countermeasure against EMI while reducing cross talk noise between the conductors.

Furthermore, since the encircling wiring structure of the second wiring layer L32 is formed by interconnecting the parallel conductor arrays in the respective regions, by optimizing the power conductors P32 and the ground conductors G32 in the parallel conductor arrays L32, this encircling wiring structure serves to enhance the effectiveness of the EMI countermeasure, and thus provides more effective means for suppressing the effects of EMI.

Moreover, since the outermost encircling conductor of the second wiring layer L32 is a ground conductor G32, this encircling ground conductor G32 provides a very effective shielding means against EMI noise, and contributes to further enhancing the effectiveness of the EMI countermeasure.

Figure 8A:
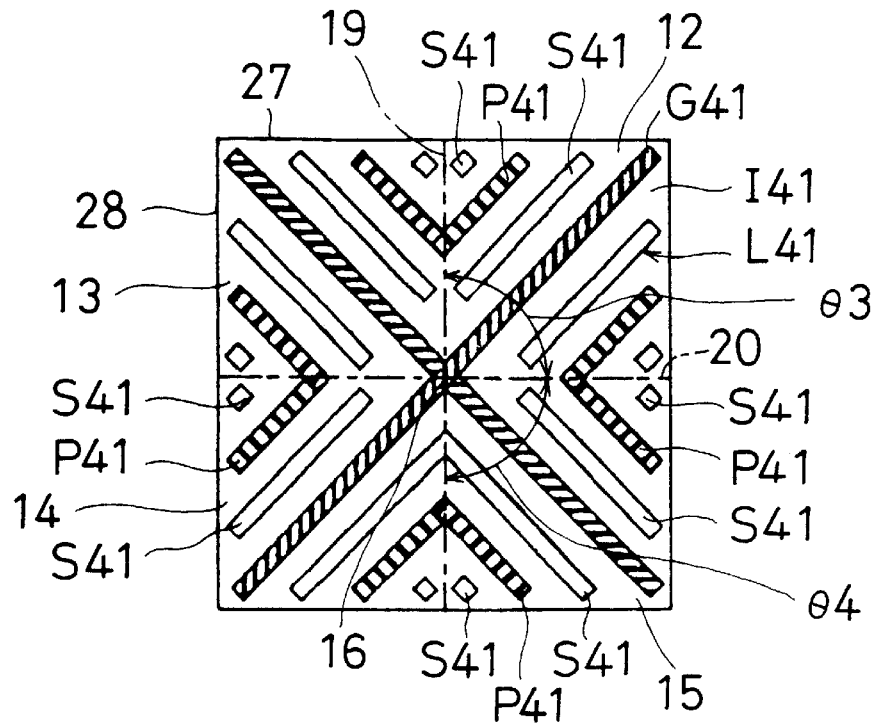
FIGS. 8A and 8B are plan views of the first and second insulating layers, respectively, illustrating another example of the embodiment of the multilayered wiring board according to the present invention.
Figure 8B:
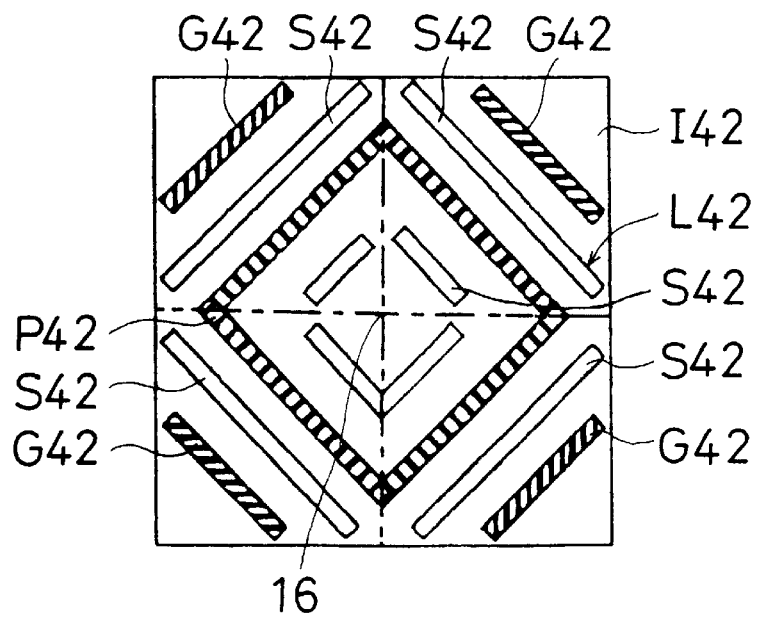

Another example of the embodiment of the multilayered wiring board according to the present invention is shown in FIG. 8 using plan views similar to those of FIG. 7. FIG. 8A is a plan view of a first insulating layer I41, and FIG. 8B is a plan view of a second insulating layer I42, wherein corresponding portions to those in FIG. 7 are designated by like reference characters. The first insulating layer I41 in FIG. 8A corresponds to the insulating layer I22 in FIG. 6B, and the second insulating layer I42 in FIG. 8B corresponds to the insulating layer I23 in FIG. 6C. This embodiment may be constructed to include the insulating layer I21 shown in FIG. 6A; in that case, the cross sectional structure is similar to that shown in FIG. 5.

In the multilayered wiring board shown in FIG. 8, the first wiring layer L41 formed on the first insulating layer I41 is divided into regions 12 to 15 by two straight lines 19 and 20 (indicated by semi-dashed lines in FIG. 8) intersecting at the center of the first insulating layer I41 so that the respective regions have approximately equal interior angles $\theta 3$ and $\theta 4$, and each region comprises a parallel conductor array directed toward the intersection point 16, i.e., the center 16 of the first insulating layer I41. In the example shown here, the plane is divided into the four regions 12 to 15 by the two straight lines 19 and 20, each passing through about the midpoint of one side 27 or 28 of the substantially square-shaped first insulating layer I41 and extending in parallel to its adjacent side 28 or 27, so that each region has an interior angle θ 3, θ4 of about 90 degrees.

On the other hand, the second wiring layer L42 formed on the second insulating layer I42 comprises parallel conductor arrays oriented orthogonal to the parallel conductor arrays of the first insulating layer L41 in the respective regions.

In the inllustrated example, of the conductors formed in the second wiring layer L42 the inwardly located conductors in the respective regions are interconnected to form a substantially square-shaped encircling wiring structure with the conductors oriented substantially orthogonal to the diagonals of the substantially square-shaped second insulating layer I42.

The parallel conductors of the first wiring layer L41 are connected at suitable places by the through conductor array T13 (see FIG. 5, not shown in FIG. 8) formed in the first insulating layer I41 to the corresponding parallel conductors of the second wiring layer L42 (for example, S41 to S42), thus forming a stacked wiring structure comprising parallel conductor arrays oriented orthogonal to each other in the respective regions 12 to 15.

In this example also, the first and second wiring layers L41 and L42 are formed so that the signal conductors S41, S42 are adjacent to the power conductors P41, P42 or ground conductors G41, G42. This arrangement also serves to effectively reduce cross talk noise between the adjacent signal conductors S41, S42 on the same plane, reducing the inductances of the power conductors P41 and P42 and ground conductors G41 and G42, and thus effectively reducing power supply noise as well as ground noise.

Further, since the power conductors P42 and the ground conductors G42 of the parallel conductor assays forming the second wiring layer L42 are arranged in a substantially encircling wiring structure encircling the center portion of the second insulating layer I42, by optimizing these power conductors P42 and ground conductors G42, the structure has the effect of providing shielding to block the infiltration of external EMI noise as well as the radiation of unwanted electromagnetic wave to the outside, thus providing an effective countermeasure against EMI while reducing cross talk noise between the conductors.

Furthermore, in the second wiring layer L42, since the encircling wiring structure is formed using conductors located inward by interconnecting the parallel conductor arrays in the respective regions, by optimizing the power conductors P42 and the ground conductors G42 in the parallel conductor arrays L42, the encircling wiring structure serves to enhance the effectiveness of the EMI countermeasure for the region inside it, and thus provides more effective means for suppressing the effects of EMI.

Figure 9A:
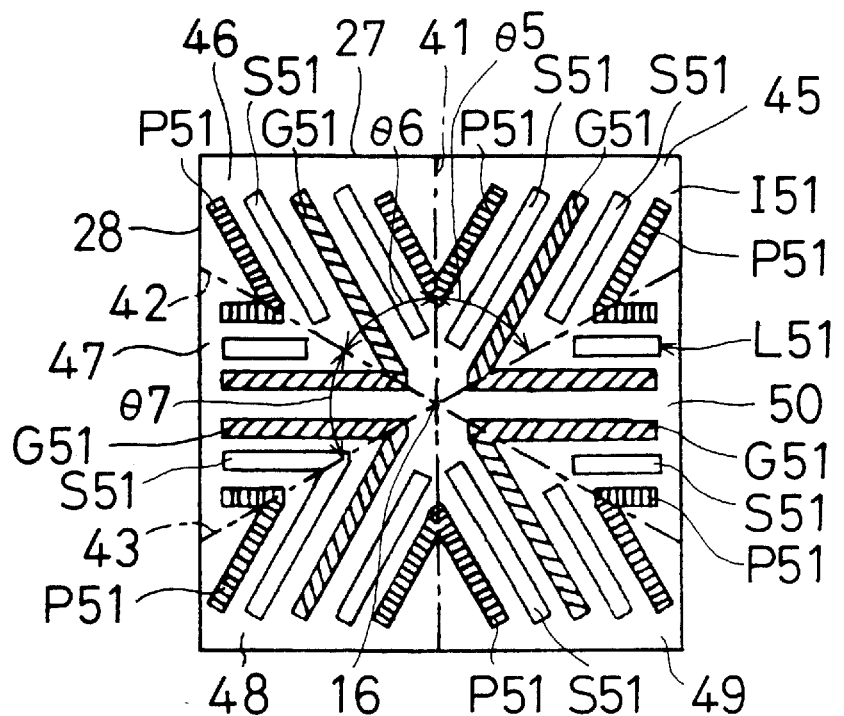
FIGS. 9A and 9B are plan views of the first and second insulating layers, respectively, illustrating another example of the embodiment of the multilayered wiring board according to the present invention.
Figure 9B:
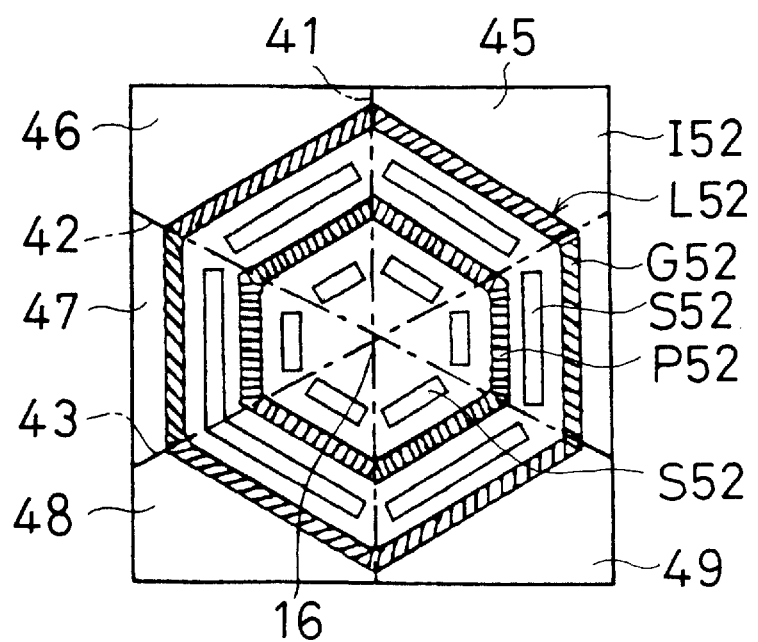

A further example of the embodiment of the multilayered wiring board according to the present invention is shown in FIG. 9 using plan views similar to those of FIG. 7. FIG. 9A is a plan view of a first insulating layer I51, and FIG. 9B is a plan view of a second insulating layer I52, wherein corresponding portions to those in FIG. 7 are designated by like reference characters.

In the multilayered wiring board shown in FIG. 9, the first wiring layer L51 formed on the first insulating layer I51 is divided into regions 45 to 50 by three straight lines 41 to 43 (indicated by semi-dashed lines in FIG. 9) intersecting at the center 16 of the first insulating layer I51 so that the respective regions have approximately equal interior angles θ5 to 74 7, and each region comprises a parallel conductor array directed toward the intersection point 16, i.e., the center 16 of the first insulating layer I51. In the example shown here, the plane is divided into the six regions 45 to 50 by the three straight lines 41 to 43 intersecting at the center 16 of the substantially square-shaped first insulating layer I51 so that each region has an interior angle, θ5 to 7, of about 60 degrees.

On the other hand, the second wiring layer L52 formed on the second insulating layer I52 comprises parallel conductor arrays oriented orthogonal to the parallel conductor arrays of the first insulating layer L51 in the respective regions 45 to 50.

In the illustrated example, the parallel conductor arrays in the respective regions 45 to 50 of the second wiring layer L52 are interconnected to form an encircling wiring structure substantially hexagonal in shape on the substantially square-shaped second insulation layer I52.

The parallel conductors of the first layer L51 are connected at suitable places by the through conductor array T13 (see FIG. 5, not shown in FIG. 9) formed in the first insulating layer I51 to the corresponding parallel conductors of the second wiring layer L52 (for example, S51 to S52), thus forming a stacked wiring structure comprising orthogonally oriented parallel conductor arrays in each of the regions 45 to 50.

In this example also, the first and second wiring layers L51 and L52 are formed so that the signal conductors S51, S52 are adjacent to the power conductors P51, P52 or ground conductors G51, G52. This arrangement also serves to effectively reduce cross talk noise between the adjacent signal conductors S51, S52 on the same plane, reducing the inductances of the power conductors P51 and P52 and ground conductors G51 and G52, and thus effectively reducing power supply noise as well as ground noise.

Further, since the power conductors P52 and the ground conductors G52 of the parallel conductor array forming the second wiring layer L52 are arranged in an encircling wiring structure encircling the center portion of the second insulating layer I52, by optimizing these power conductors P52 and ground conductors G52, the structure has the effect of providing shielding to block the infiltration of external EMI noise as well as the radiation of unwanted electromagnetic wave to the outside, thus providing an effective countermeasure against EMI while reducing cross talk noise between the conductors.

Furthermore, in the second wiring layers L52, since the encircling wiring structure is formed by interconnecting the parallel conductor arrays in the respective regions, the encircling wiring structure serves to enhance the effectiveness of the EMI countermeasure for the region inside it, and thus provides more effective means for supporting the effects of EMI.

Moreover, since the outermost encircling conductor of the second wiring layer L52 is a ground conductor G52, this encircling ground conductor G52 provides a very effective shielding means against EMI noise, and contributes to further enhancing the effectiveness of the EMI countermeasure.

Figure 10A:
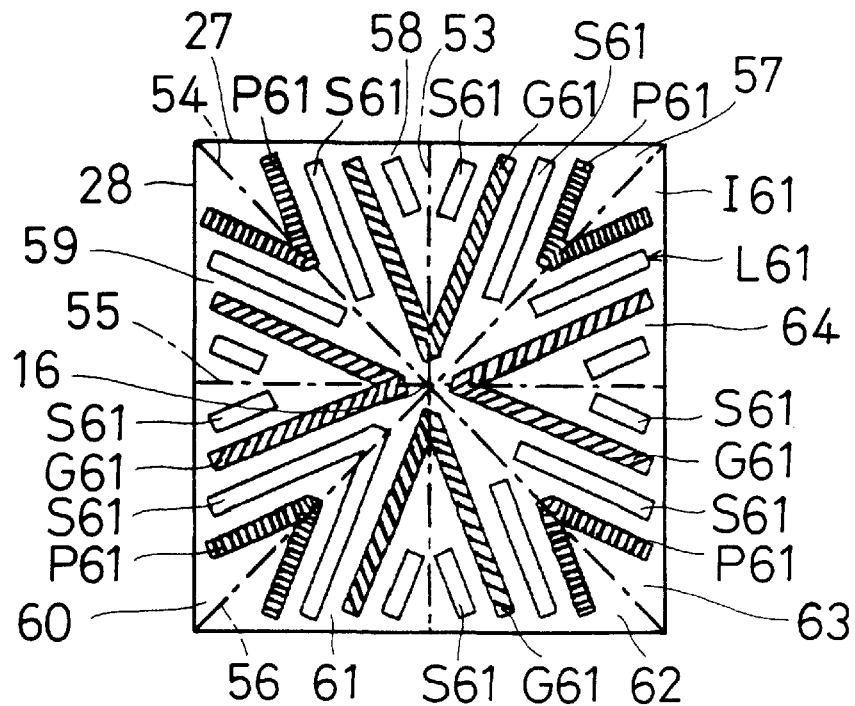
FIGS. 10A and 10B are plan views of the first and second insulating layers, respectively, illustrating another example of the embodiment of the multilayered wiring board according to the present invention.

A still further example of the embodiment of the multilayered wiring board according to the present invention is shown in FIG. 10 using plan views similar to those of FIG. 7. FIG. 10A is a plan view of a first insulating layer, and FIG.

10B is a plan view of a second insulating layer, wherein corresponding portions to those in FIG. 7 are designated by like reference characters.

Figure 10B:
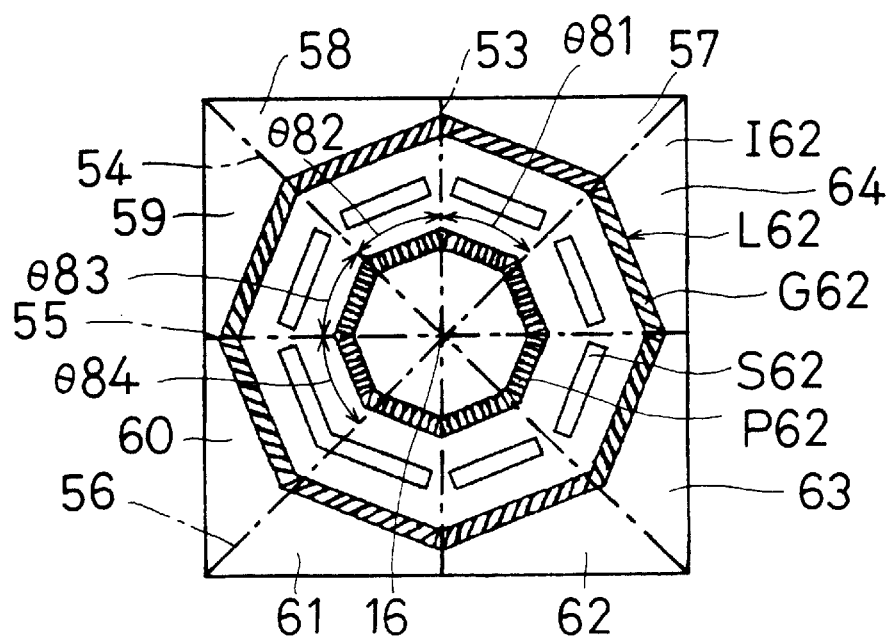

In the multilayered wiring board shown in FIG. 10, the first wiring layer L61 formed on the first insulating layer I61 is divided into regions 57 to 64 by four straight lines 53 to 56 (indicated by semi-dashed lines in FIG. 10) intersecting at the center of the first insulating layer I61 so that the respective regions have approximately equal interior angles θ81 to θ84 (See FIG. 10B), and each region comprises a parallel conductor array directed toward the intersection point 16, i.e., the center of the first insulating layer I61. In the example shown here, the plane is divided into the eight regions 57 to 64 by the four straight lines, i.e., two straight lines 54 and 56 respectively extending along the diagonals of the substantially square-shaped first insulating layer I61 and two straight lines 53 and 55 each passing through about the midpoint of one side 27 or 28 of the square and extending in parallel to its adjacent side 28 or 27, so that each region has interior angles θ81 to θ84 of about 45 degrees.

On the other hand, the second wiring layer L62 formed on the second insulating layer I62 comprises parallel conductor arrays oriented orthogonal to the parallel conductor arrays of the first insulating layer L61 in the respective regions 57 to 64.

In the illustrated example, the parallel conductor arrays in the respective regions 57 to 64 of the second wiring layer L62 are interconnected to form an encircling wiring structure substantially octagonal in shape on the substantially square-shaped second insulation layer I62.

The parallel conductors of the first wiring layer L61 are connected at suitable places by the through conductor array T13 (see FIG. 5, not shown in FIG. 10) formed in the first insulating layer I61 to the corresponding parallel conductors of the second wiring layer L62 (for example, S61 to S62), thus forming a stacked wiring structure comprising orthogonally oriented parallel conductor arrays in each of the regions.

In this example also, the first and second wiring layers L61 and L62 are formed so that the signal conductors S61, S62 are adjacent to the power conductors P61, P62 or ground conductors G61, G62. This arrangement also serves to effectively reduce cross talk noise between the adjacent signal conductors S61, S62 on the same plane, reducing the inductances of the power conductors P61 and P62 and ground conductors G61 and G62, and thus effectively reducing power supply noise as well as ground noise.

Further, since the power conductors P62 and the ground conductors G62 of the parallel conductor arrays forming the second wiring layer L62 are arranged in an encircling wiring structure encircling the center portion of the second insulating layer I62, by optimizing these power conductors P62 and ground conductors G62, the structure has the effect of providing shielding to block the infiltration of external EMI noise as well as the radiation of unwanted electromagnetic wave to the outside, thus providing an effective countermeasure against EMI while reducing cross talk noise between the conductors.

Furthermore, in this second wiring layers L62 also, since the encircling wiring structure is formed by interconnecting the parallel conductor arrays in the respective regions, by optimizing the power conductors P62 and the ground conductors in the parallel conductor arrays L62, the encircling wiring structure serves to enhance the effectiveness of the EMI countermeasure for the region inside it, and thus provides more effective means for suppressing the effects of EMI.

Moreover, since the outermost encircling conductor of the second wiring layer L62 also is a ground conductor G62, this encircling ground conductor G62 provides a very effective shielding means against EMI noise and contributes to further enhancing the effectiveness of the EMI countermeasure.

In the multilayered wiring boards of the invention shown in FIGS. 7 and 10, various wiring structures can be employed for the multilayer wiring section to be formed above or below the stacked wiring structure to construct the multilayered wiring board. For example, a wiring structure constructed from multiple layers of parallel conductors alternately oriented at right angles, or a wiring structure employing a stripline structure, or various other wiring structures employing a microstrip line structure, coplanar line structure, etc. can be selected for use according to the specifications, etc. required of the multilayered wiring board.

In the embodiment of FIGS. 4 to 10, the insulating layers are stacked with their centers 16 substantially aligned with each other.

Further, an electronic circuit may be constructed, for example, by stacking polyimide insulating layers and conductive layers formed by copper evaporation. Also, a semiconductor package may be constructed by attaching such components as chip resistors, thin-film resistors, coil inductors, cross capacitors, chip capacitors, electrolytic capacitors, etc.

The shape of each of the insulating layers including the first and second insulating layers I31 to I61 and I32 to I62 is not limited to the substantially square shape shown in FIGS. 7 to 10, but other shapes such as a rectangular or rhombic shape or a hexagonal or octagonal shape may be employed.

Furthermore, the first and second wiring layers L31 to L61 and L32 to L62 are not limited to being formed on the surfaces of the first and second insulating layers I31 to I61 and I32 to I62, but the wiring layers may be formed within the respective insulating layers I31 to I61 and I32 to I62.

In the multilayered wiring board of the present invention the insulating layers including the first and second insulating layers I31 to I61 and I32 to I62 are formed, for example, by a ceramic green sheet lamination method, using an inorganic insulating material such as an aluminum oxide-based sintered material, aluminum nitride-based sintered material, silicon carbide-based sintered material, silicon nitride-based sintered material, mullite-based sintered material, glass ceramic, etc., or an organic insulating material such as polyimide, epoxy resin, fluorocarbon polymers, polynorbornene, benzocyclobutene, etc., or an electrical insulating material such as a composite insulating material formed by binding a ceramic powder or other inorganic insulating powder with a thermosetting resin such as an epoxy-based resin.

For example, when forming the insulating layers from an aluminum oxide-based sintered material, a raw material powder of aluminum oxide, silicon oxide, calcium oxide, magnesium oxide, or the like, is mixed with a suitable organic binder, solvent, etc. to form a slurry which is then formed into a sheet using a prior known doctor blade method to obtain a ceramic green sheet, after which the ceramic green sheet is suitably punched and a parallel conductor array, a through conductor array, or a metal paste as a conductive layer, whichever is required, is printed in a desired pattern for coating; then, a plurality of such ceramic green sheets are stacked one on top of another, and the stacked structure is baked at a temperature of about 1600° C. in a reducing atmosphere to complete the fabrication.

The thicknesses of the insulating layers are appropriately set according to the properties of the material used, so as to satisfy conditions such as the mechanical strength and electrical characteristics conforming to the required specifications and the ease of formation of through conductor arrays.

The parallel conductor arrays forming the first and second wiring layers L31 to L61 and L32 to L62, and other wiring layers and through connectors, are formed, for example, by the metalization of a metallic powder of tungsten, molybdenum, molybdenum-manganese, copper, silver, silver-palladium, or the like, or formed from a thin film of a metallic material such as copper, silver, nickel, chromium, titanium, gold, niobium, or their alloys.

When forming them by the metalization of a metallic powder of tungsten, for example, a metal paste prepared by adding and mixing a suitable organic binder, solvent, etc. into a tungsten powder is printed in a desired pattern for coating on the ceramic green sheets formed as the insulating layers, and the ceramic green sheets coated with such patterns are baked to complete the fabrication of the stacked multilayer structure with the desired patterns formed on the respective insulating layers.

When forming them from a thin film of a metallic material first a metal layer is formed, for example, by sputtering, vacuum evaporation, or plating, and then the metal layer is formed into the desired conductor pattern using photolithography.

The width of each conductor and the spacing between conductors in the parallel conductor arrays forming the first and second wiring layers L31 to L61 and L32 to L62 are appropriately set according to the properties of the material used, so as to satisfy conditions such as the electrical characteristics conforming to the required specifications and the ease of formation on the respective insulating layers I31 to I61 and I32 to I62.

The thickness of each of the wiring layers L31 to L61 and L32 to L62 is preferably set to about 1 to 20 $\mu$m. If the thickness is less than 1 $\mu$m, the conductor resistance becomes large, tending to make it difficult to supply sufficient power to the semiconductor device through conductors, to provide stable ground, and to ensure good signal propagation. On the other hand, if the thickness exceeds 20 $\mu$m, the cladding provided by the insulating layer formed overlying the conductors may become insufficient, causing an insulation failure.

The through conductors in each through conductor array may be formed circular in cross section or may be formed in elliptical, square, rectangular, or other irregular shapes. Their positions and sizes are appropriately chosen according to the properties of the material used, so as to satisfy conditions such as the electrical characteristic conforming to the required specifications and the ease of their formation and placement in the insulating layers.

When the insulating layers are formed from an aluminum oxide-based sintered material and the parallel conductor arrays are formed by the metalization of tungsten, for example, if the thickness of each insulating layer is 200 $\mu$m, the line width of each conductor is 100 $\mu$m, the spacing between conductors is 150 $\mu$m, and the size of each through conductor is 100 $\mu$m, then the impedance of signal conductors can be made 50 $\Omega$, and the upper and lower parallel conductor arrays can be electrically interconnected while supporting reflections of high frequency signals.

Figure 11C:
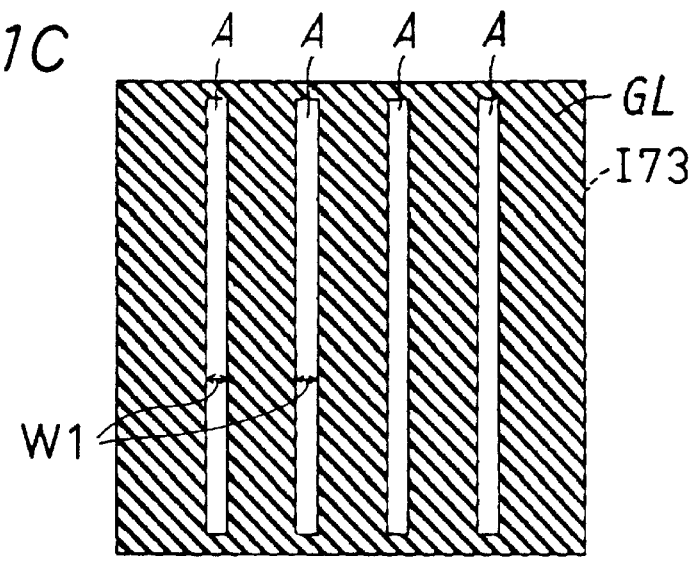
FIGS. 11A to 11C are plan view of a first insulating layer, a second insulating layer, and a ground conductor layer, respectively, illustrating one embodiment of a stacked wiring structure applicable to a multilayered wiring board according to the present invention.
Figure 11B:
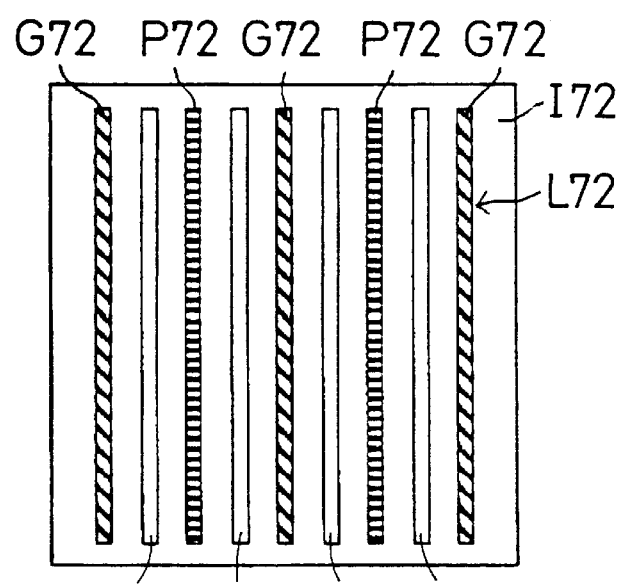
Figure 11A:
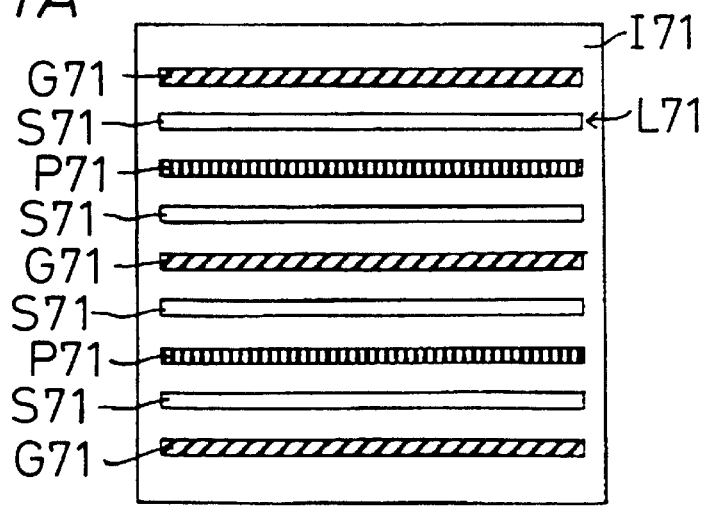
Figure 12:
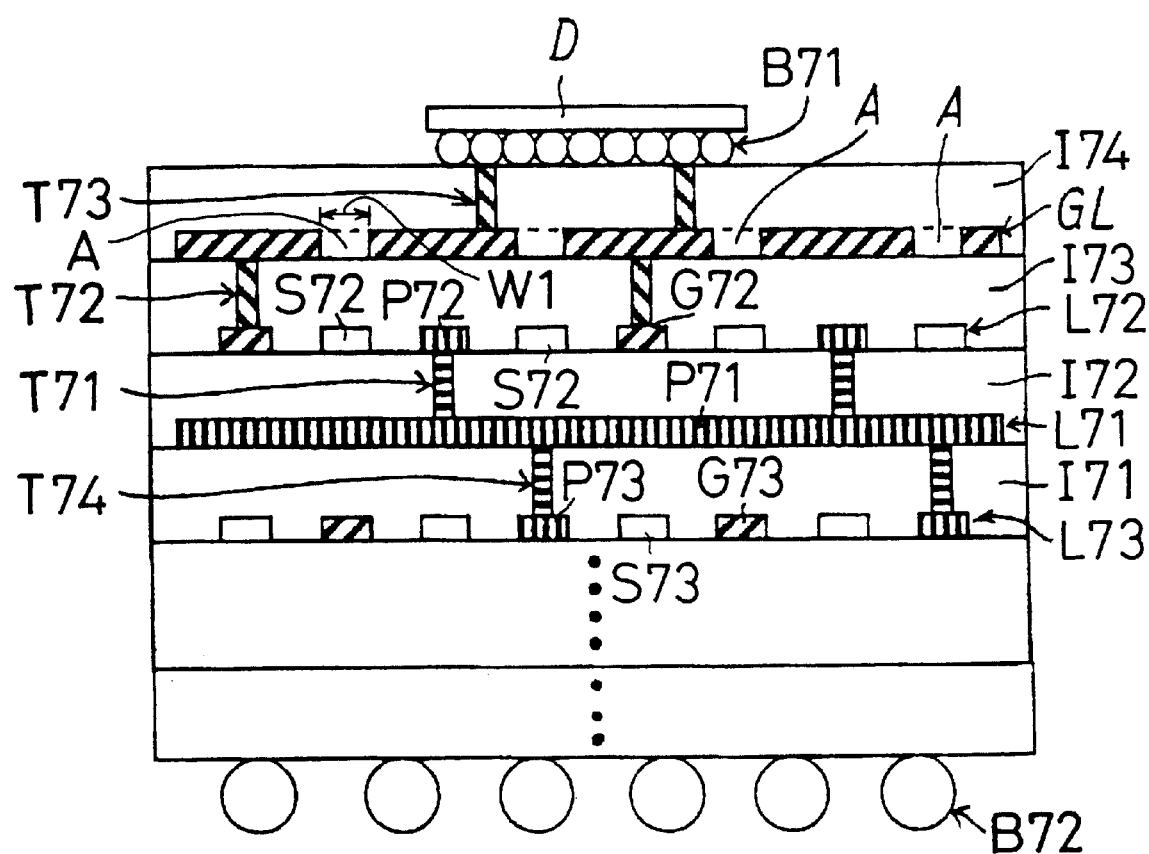
FIG. 12 is a cross sectional view showing one embodiment of the multilayered wiring board according to the present invention comprising the stacked wiring structure shown in FIGS. 11A to 11C.

FIG. 11 shows broken apart plan views illustrating one embodiment of a stacked wiring structure applicable to the multilayered wiring board of the present invention: FIG. 11A is a plan view of a first insulating layer I71, FIG. 11B is a plan view of a second insulating layer I72, and FIG. 11C is a plan view of a ground conductor layer I73. FIG. 12 is a cross sectional view showing one embodiment of the multilayered wiring board of the present invention comprising the stacked wiring structure constructed by stacking the above-listed layers.

In the figures, I71 to I74 are the first to fourth insulating layers, L71 and L72 are first and second parallel conductor arrays formed in a substantially parallel arrangement on the upper surface of the first and second insulating layers I71 and I72, respectively, GL is a ground conductor layer having prescribed openings A (conductor regions are indicated by oblique hatching) formed above the second parallel conductor array L72 with the third insulating layer I73 interposed therebetween, and T71 is a through conductor array for electrically interconnecting the first and second parallel conductor arrays L71 and L72 at desired places. These components together form the stacked wiring structure for the multilayered wiring board of the present invention. Further, I74 is the fourth insulating layer formed on the ground conductor layer GL and serving as the surface layer of the multilayered wiring board, and L73 is a third wiring layer formed on a fifth insulating layer underneath the first insulating layer I71 and electrically connected to the first parallel conductor array L71 via the through conductor array T74. In the illustrated example, the third wiring layer L73 is formed from a parallel conductor array similar to the second parallel conductor array L72. In FIG. 12, the details of the fifth and lower insulating layers are omitted.

P71 to P73 are power conductors in the first to third parallel conductor arrays L71 to L73, respectively, G71 to G73 are ground conductors in the first to third parallel conductor arrays L71 to L73, respectively, and S71 to S73 are signal conductors in the first to third parallel conductor arrays L71 to L73, respectively.

It will be appreciated that the plurality of signal conductors S71 to S73 disposed on the same plane may be made to carry different signals within different signal conductors, and likewise the plurality of power conductors P71 to P73 disposed on the same plane may be made to carry different power supply levels with different power conductors.

Reference character D indicates a semiconductor device mounted on the surface of the multilayered wiring board; usually, a semiconductor device such as an MPU (microprocessing unit), an ASIC (application specific integrated circuit), or a DSP (digital signal processor) is mounted. The semiconductor device D is electrically connected to the second parallel conductor array L72 by being mounted on the surface of the multilayered wiring board using, for example, so-called bump electrodes B71, as shown in FIG. 12, or by being attached to the mounting portion with an adhesive or a brazing material and using bonding wires, etc. The figure shows the portions connected to the ground conductors G72 of the second parallel conductor array L72 via the through conductor array T72, the ground conductor layer GL, and through conductor array T73.

The through conductor arrays T71 to T74 are formed passing through the insulating layers I71 to I74, respectively, to electrically interconnect the upper and lower conductors or to electrically connect the appropriate conductors to the semiconductor device D or to external connection terminals B72 or the like attached to a surface of the multilayered wiring board. These through conductor arrays T71 to T74 consist of through-hole conductors or via conductors, and are formed in a plurality of positions where connections are needed.

In the stacked wiring structure forming the multilayered wiring board of the present invention, the first parallel conductor array L71 including the signal conductors S71 is oriented substantially parallel to a first direction, and the second parallel conductor array L72 overlaid thereon, including the signal conductors S72, is oriented substantially parallel to a second direction orthogonal to the first direction. The stacked wiring structure is constructed by interconnecting these conductors via the through conductor array T71 passing through the second insulating layer I72.

According to this stacked wiring structure, since the first parallel conductor array L71 and the second parallel conductor array L72 are overlaid one on top of the other with their planes oriented orthogonal to each other, cross talk noise between the conductors of the parallel conductor arrays L71 and L72 can be reduced to a minimum.

Further, on the stacked wiring structure is formed the ground conductor layer GL having openings A disposed opposite the signal conductors S72 of the second parallel conductor array L72. This ground conductor layer GL may be placed below the stacked wiring structure or above and below the stacked wiring structure, depending on the specification of the multilayered wiring board. Since the ground conductor layer GL having the prescribed openings A is formed on the stacked wiring structure having the orthogonally oriented parallel conductor arrays, as described above, by appropriately setting the size of the opening in consideration of the semiconductor device mounted, not only the ground conductor layer GL can not only sufficiently shield against EMI noise because the openings A are formed in positions opposite the signal conductors S72, but also unwanted capacitive components do not occur between the signal conductors S72 and the ground conductor layer G1 and, unlike the case of the solid pattern electromagnetic shield layer of the prior art, impedance mismatching of the signal conductors S72 does not occur.

After detailed studies on the conditions of EMI noise and the relations among frequencies, dielectric constant of each insulating layer, wavelengths of high frequency signals, etc. relating to the multilayered wiring board, the inventor has discovered that when the width W1 of each opening A (the opening width measured in the width direction of the signal conductor S71, S72 disposed opposite the opening) is set to 500 $\mu$m or less, EMI noise of the level detrimental to the high frequency electrical characteristics is prevented from passing into or being radiated from the stacked wiring structure through the openings A, and the ground conductor layer can thus be used as a shield layer having a sufficient shielding effect against EMI noise.

Further, it is preferable that the area of each opening A be set not smaller than 50% of the area of the signal conductor S72 disposed opposite the opening. This is because as the opening area decreases, the tendency to cause impedance mismatching to the signal conductor S72 increases, and it has been found that, when the opening area becomes smaller than 50% of the area of the signal conductor S72 disposed opposite the opening, the mismatching tends to increase to the point where a detrimental effect is caused that can pose a practical problem to the transmission characteristics of a high frequency signal.

As for the shape and pattern of the openings A formed in the ground conductor layer GL, not only the parallel slit openings having approximately the same shape as the signal conductors S72 as shown in FIG. 11C, but various other shapes and patterns can also be employed, provided that the openings are formed opposite the signal conductors S72 (or S71), that the width W1 of each opening is 500 $\mu$m or less, and that the opening area is not smaller than 50% of the signal conductor S72 (S71) disposed opposite the opening. Examples of such shapes and patterns are shown in FIGS. 13A to 13C using plan views similar to that of FIG. 11C.

Figure 13A:
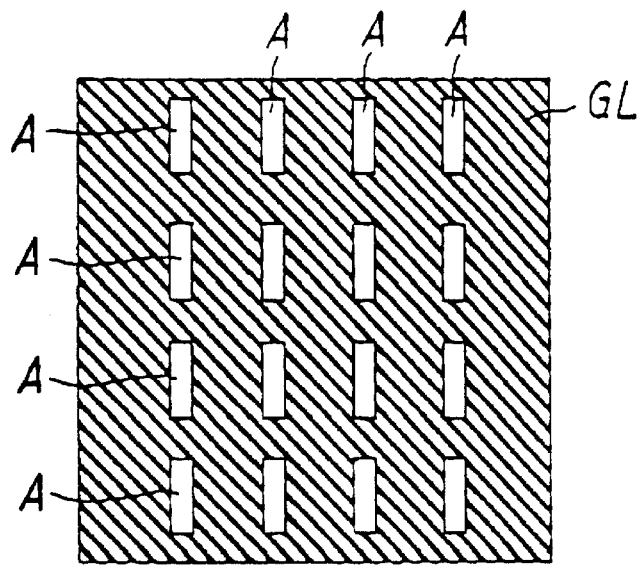
FIGS. 13A to 13C are plan views showing other examples of the ground conductor layer.
Figure 13B:
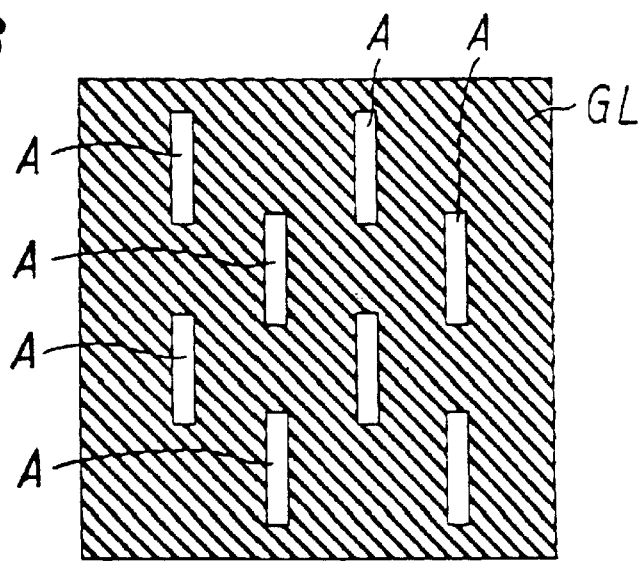
Figure 13C:
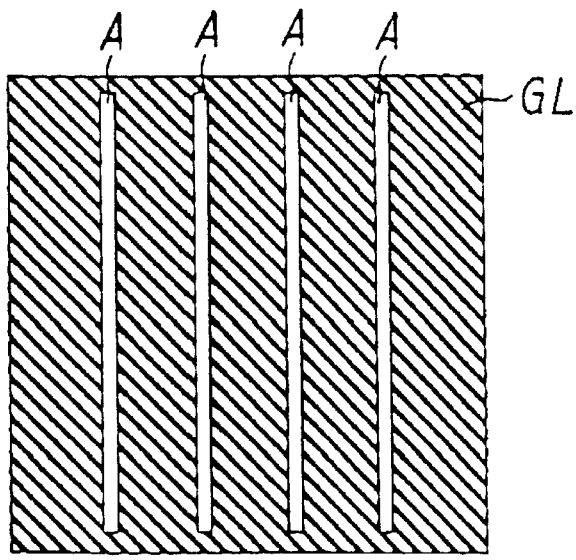

FIG. 13A shows an example in which the openings A consist of a large number of short slit-like openings arrayed in horizontal and vertical directions along each signal conductor S72 (S71), forming a mesh pattern as a whole. FIG. 13B shows an example in which the openings A consist of a large number of slit-like openings, each longer than each opening shown in FIG. 13A, arranged in a staggered pattern, i.e., in the so-called checkerboard pattern. FIG. 13C shows an example in which the openings A consist of opening each of which, like each opening A shown in FIG. 11C, has approximately the same length as that of each signal conductor S72 (S71) but has a narrower width. Alternatively, the openings A may be formed as polygonal or circular openings of width W1 500 $\mu$m or less arranged opposite the signal conductors S72 (S71); that is, the openings A need not necessarily be limited in shape, pattern, or arrangement to the particular examples described above.

In the embodiment shown in FIGS. 11 and 12, the first and second parallel conductor arrays L71 and L72 forming the stacked wiring structure are formed so that the signal conductors S71, S72 are adjacent to the power conductors P71, P72 or the ground conductors G71, G72. This arrangement provides electromagnetic shielding between the signal conductors S71, S72 formed on the same insulating layer I71, I72, and thus effectively reduces cross talk noise between the adjacent signal conductors S71, S72 on the same plane.

Furthermore, by arranging the signal conductors S71, S72 so that no two signal conductors are adjacent to each other without a power conductor P71, P72 or a ground conductor G71, G72 being interposed therebetween, the interaction between the power conductors P71, P72 and the signal conductors S71, S72 and between the ground conductors G71, G72 and the signal conductors S71, S72 formed on the same plane is maximized, serving to reduce the inductances of the power conductors P71 and P72 and ground conductors G71 and G72. This inductance reduction contributes to effectively reducing power supply noise as well as ground noise.

The same can be said of the third wiring layer L73 and lower wiring layers if parallel conductor arrays similar to those described above are used for the third and lower wiring layers.

In the multilayered wiring board of the present invention, various wiring structures can be employed for the multilayer wiring section formed above or below the stacked wiring structure to construct the multilayered wiring board. For example, a wiring structure constructed from multiple layers of parallel conductors alternately oriented at right angles as in the above-described stacked wiring structure, or a wiring structure employing a stripline structure, or various other wiring structures employing a microstrip line structure, coplanar line structure, etc. can be selected for use according to the specifications, etc. required of the multilayered wiring board.

Further, an electronic circuit may be constructed, for example, by stacking polyimide insulating layers and conductive layers formed by copper evaporation. Also, a semiconductor package may be constructed by attaching such components as chip resistors, thin-film resistors, coil inductors, cross capacitors, chip capacitors, electrolytic capacitors, etc.

The shape of each of the insulating layers including the first to fourth insulating layers I71 to I74 is not limited to the substantially square shape shown in the figures, but other shapes such as a rectangular or rhombic shape or other polygonal shape may be employed.

Furthermore, the first and second parallel conductor arrays L71 and L72 are not limited to being formed on the surfaces of the first and second insulating layers I71 and I72, but the parallel conductor arrays may be formed within the respective insulating layers I71 and I72.

In the example shown in FIG. 12, if the second parallel conductor array L72 is formed within the second insulating layer I72, the third insulating layer I73 need not necessarily be provided, and the ground conductor layer GL placed thereon may instead be formed on the second insulating layer I72.

In the multilayered wiring board of the present invention, the insulating layers including the first to fourth insulating layers I71 to I74 are formed, for example, by a ceramic green sheet lamination method, using an inorganic insulating material such as an aluminum oxide-based sintered material, aluminum nitride-based sintered material, silicon carbide-based sintered material, silicon nitride-based sintered material, mullite-based sintered material, glass ceramic, etc., or an organic insulating material such as polyimide, epoxy resin, fluorocarbon polymers, polynorbornene, benzocyclobutene, etc., or an electrical insulating material such as a composite insulating material formed by binding a ceramic powder or other inorganic insulating powder with a thermosetting resin such as an epoxy-based resin.

For example, when forming the insulating layers from an aluminum oxide-based sintered material, a raw material powder of aluminum oxide, silicon oxide, calcium oxide, magnesium oxide, or the like, is mixed with a suitable organic binder, solvent, etc. to form a slurry which is then formed into a sheet using a prior known doctor blade method to obtain a ceramic green sheet, after which the ceramic green sheet is suitably punched and a parallel conductor array, a through conductor array, or a metal phase as a conductive layer, whichever is required, is printed in a desired pattern for coating; then, a plurality of such ceramic green sheets are stacked one on top of another, and the stacked structure is baked at a temperature of about 1600° C. in a reducing atmosphere to complete the fabrication.

The thicknesses of the insulating layers are appropriately set according to the properties of the material used, so as to satisfy conditions such as the mechanical strength and electrical characteristics conforming to the required specifications and the ease of formation of through conductor arrays.

The first and second parallel conductor arrays L71 and L72, other wiring layers, the ground conductor layer GL, and the through conductors T71 to T74 are formed, for example, by the metallization of a metallic powder of tungsten, molybdenum, molybdenum-manganese, copper, silver, silver-palladium, or the like, or formed from a thin film of a metallic material such as copper, silver, nickel, chromium, titanium, gold, niobium, or their alloys.

When forming them by the metalization of a metallic powder of tungsten, for example, a metal paste prepared by adding and mixing a suitable organic binder, solvent, etc. into a tungsten powder is printed in a desired pattern for coating on the ceramic green sheets formed as the insulating layers, and the ceramic green sheets coated with such patterns are baked to complete the fabrication of the stacked multilayer structure with the desired patterns formed on the respective insulating layers.

When forming them from a thin film of a metallic material, first a metal layer is formed, for example, by sputtering, vacuum evaporation, or plating, and then the metal layer is formed into the desired conductor pattern using photolithography.

The width of each conductor and the spacing between conductors in the first and second parallel conductor arrays L71 and L72 are appropriately set according to the properties of the material used, so as to satisfy conditions such as the electrical characteristics conforming to the required specifications and the ease of formation on the respective insulating layers I71 and I72.

The thickness of each of the parallel conductor arrays L71 and L72 and the ground conductor layer GL is preferably set to about 1 to 20 $\mu$m. If the thickness is less than 1 $\mu$m, the conductor resistance becomes large, tending to make it difficult to supply sufficient power to the semiconductor device through conductors, to provide stable ground, and to ensure good signal propagation. On the other hand, if the thickness exceeds 20 $\mu$m, the cladding provided by the insulating layer formed overlying the conductors may become insufficient, causing an insulation failure.

The through conductors in each of the through conductor arrays T71 and T74 may be formed circular in cross section or may be formed in elliptical, square, rectangular, or other irregular shapes. Their positions and sizes are appropriately chosen according to the properties of the material used, so as to satisfy conditions such as the electrical characteristics conforming to the required specifications and the ease of their formation and placement in the insulating layers.

When the insulating layers are formed from an aluminum oxide-based sintered material and the parallel conductor arrays are formed by the metallization of tungsten, for example, if the thickness of each insulating layer is 200 $\mu$m, the line width of each conductor is 100 $\mu$m, the spacing between conductors is 150 $\mu$m, and the size of each through conductor is 100 $\mu$m, then the impedance of signal conductors can be made 50 $\Omega$, and the upper and lower parallel conductor arrays can be electrically interconnected while suppressing reflections of high frequency signals.

Figure 14:
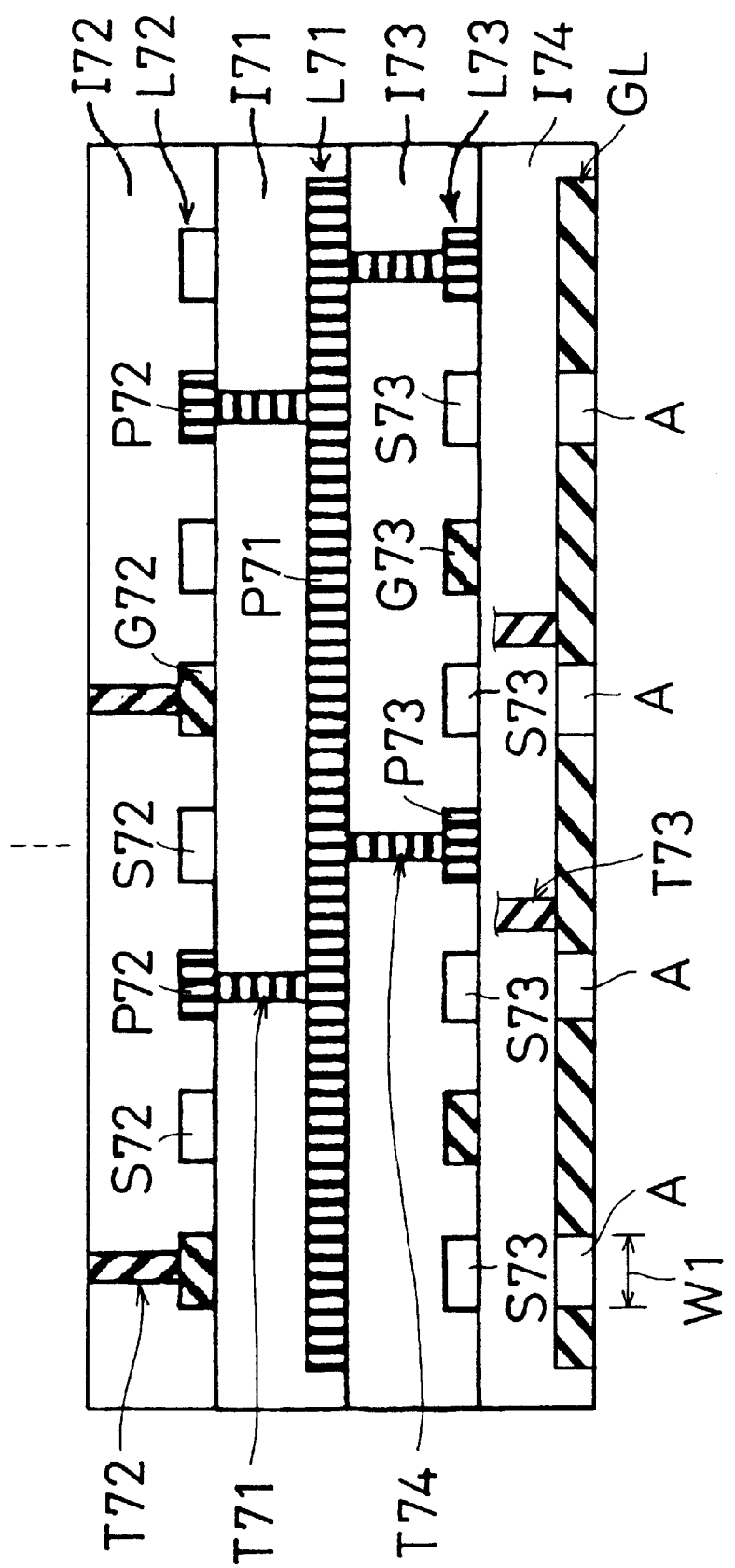
FIG. 14 is a cross sectional view showing a portion of a multilayered wiring board according to another embodiment of the present invention.

FIG. 14 is a cross sectional view showing a portion of a multilayered wiring board according to another embodiment of the present invention. This embodiment is similar to the embodiment shown in FIGS. 11 and 12, and corresponding portions are designated by the same reference characters. What should be noted in this embodiment is that, at the bottom of FIG. 14, an insulating layer I74 is formed underlying the insulating layer I73 with one surface of the former contacting the surface of the latter on which the parallel conductor array L73 is formed. On the other surface of the insulating layer I74 (the bottom surface as viewed in the plane of FIG. 14) is formed a ground conductor layer GL. The ground conductor layer GL, like the one shown in FIG. 11C, has openings A of width W1 500 $\mu$m or less in positions opposite the signal conductors S73. The ground character GL may also be formed in any of the patterns shown in FIGS. 13A to 13C. In other respect, this embodiment is the same in structure as the foregoing embodiment.

Figure 15:
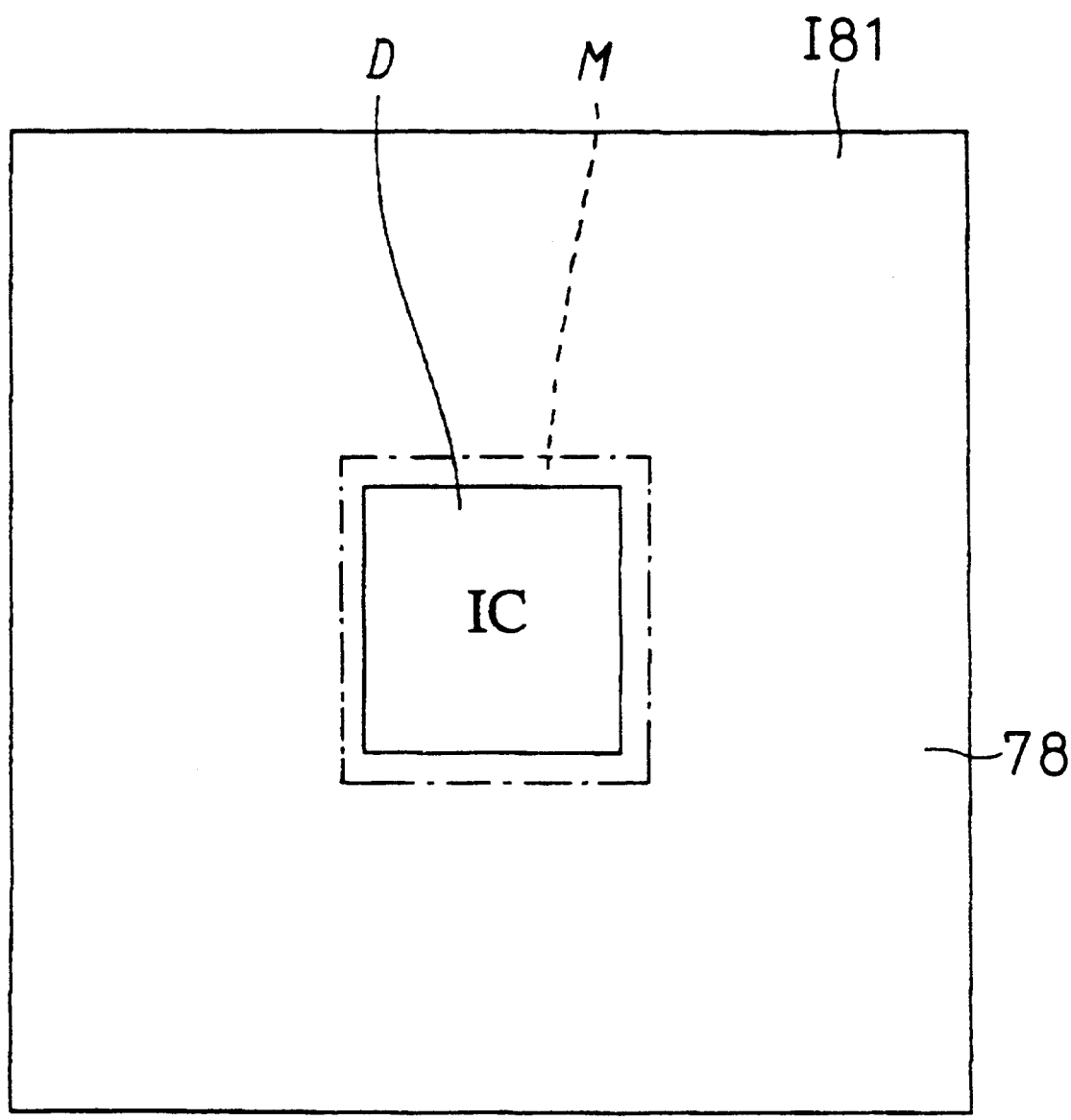
FIG. 15 is a top plan view of a first insulating layer with a semiconductor device mounted on the upper surface of the multilayered wiring board, illustrating one embodiment of the multilayered wiring board according to the present invention.
Figure 16:
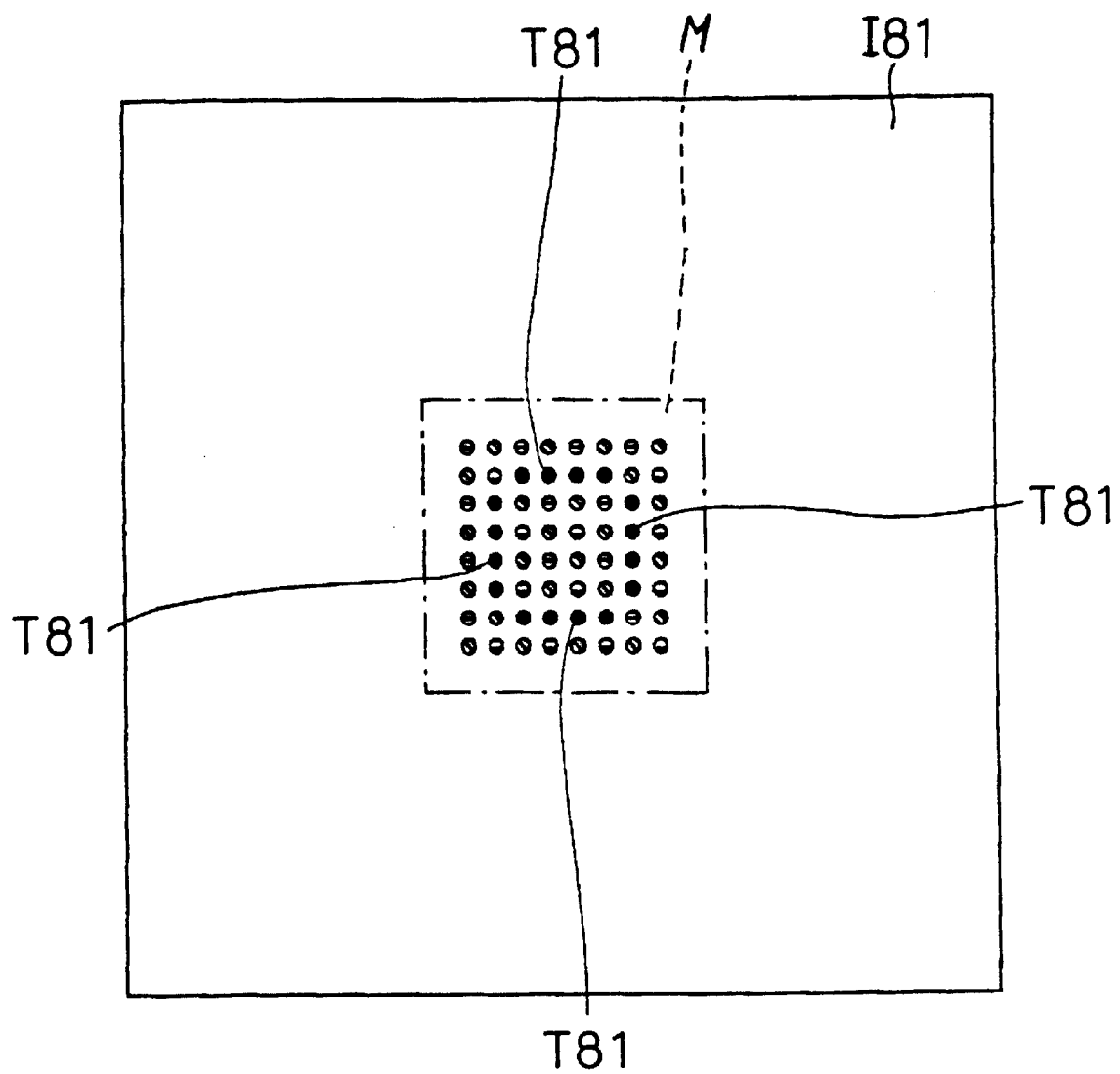
FIG. 16 is a top plan view of the first insulating layer with the semiconductor device removed, illustrating the embodiment of the multilayered wiring board according to the present invention.
Figure 17:
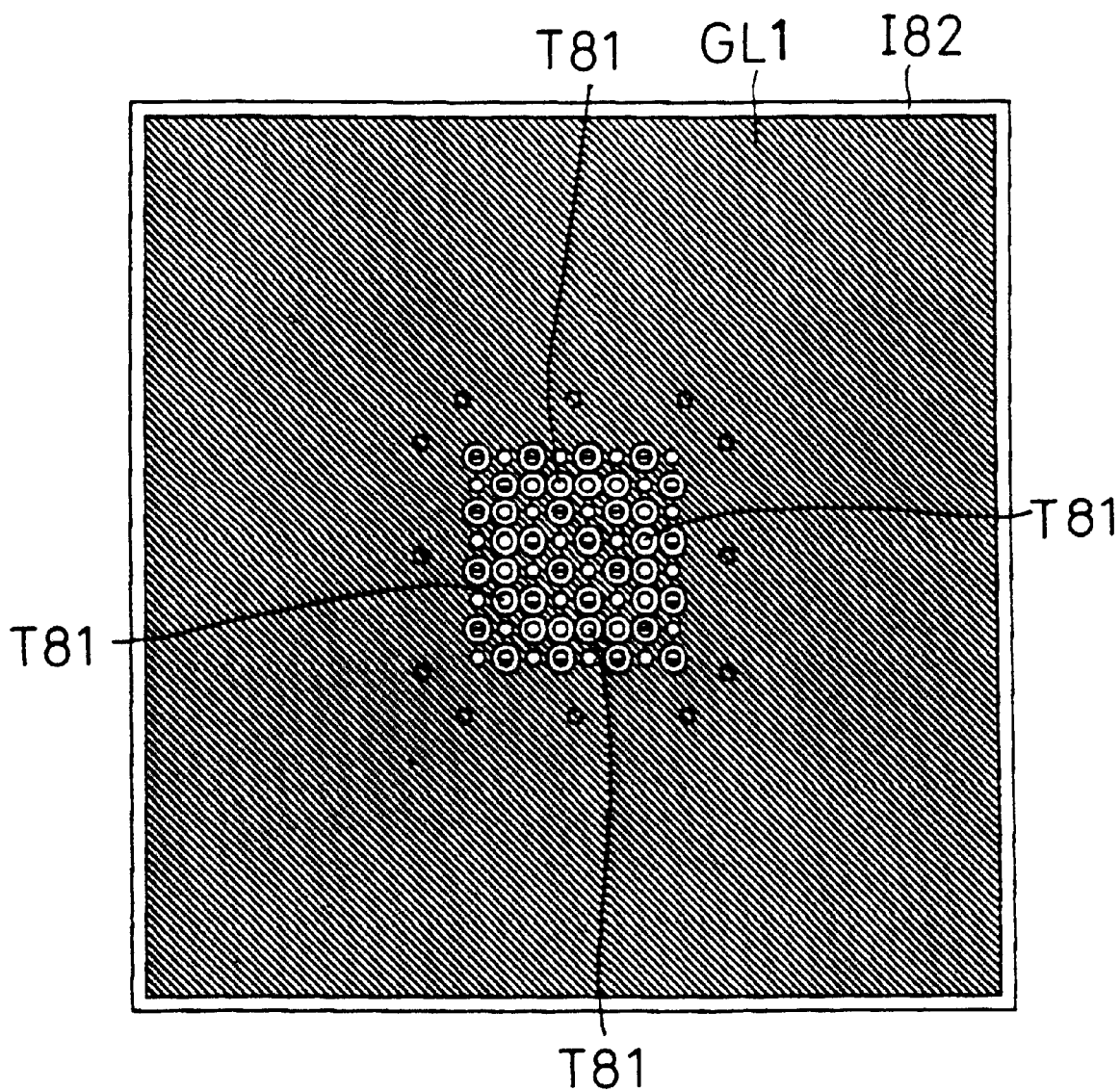
FIG. 17 is a top plan view of a second insulating layer, illustrating the embodiment of the multilayered wiring board according to the present invention.
Figure 18:
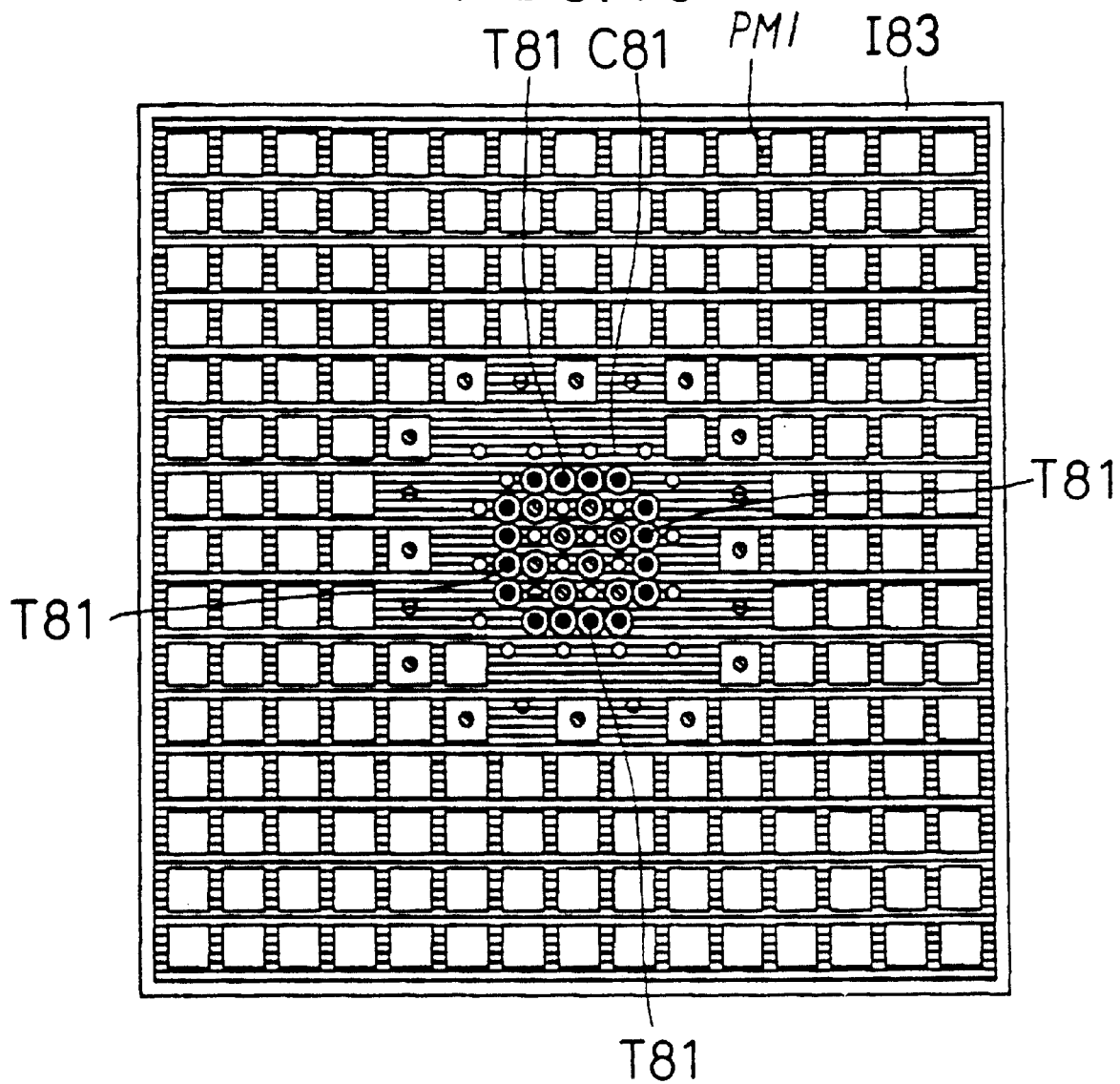
FIG. 18 is a top plan view of a third insulating layer, illustrating the embodiment of the multilayered wiring board according to the present invention.
Figure 19:
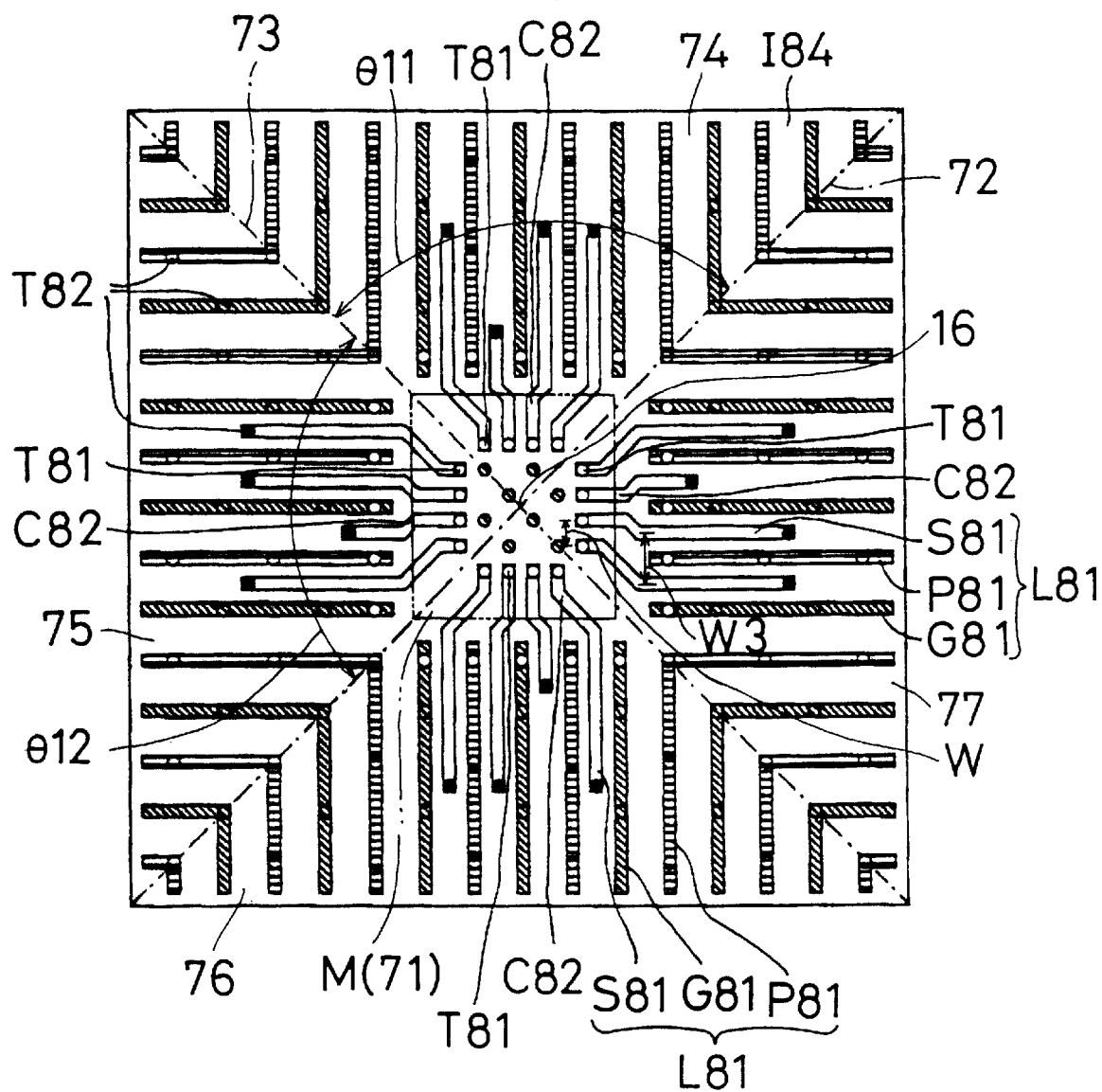
FIG. 19 is a top plan view of a fourth insulating layer, illustrating the embodiment of the multilayered wiring board according to the present invention.
Figure 20:
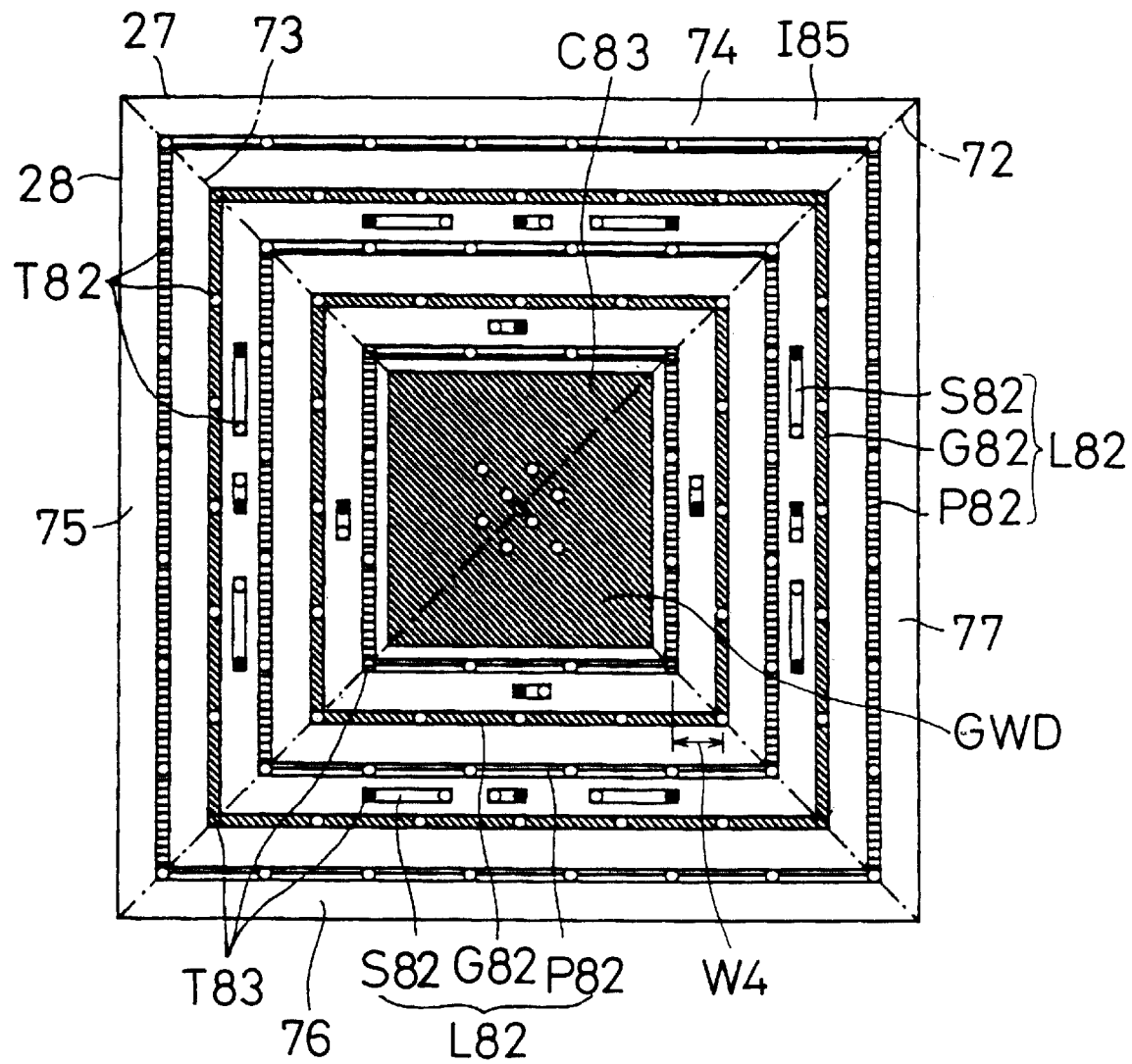
FIG. 20 is a top plan view of a fifth insulating layer, illustrating the embodiment of the multilayered wiring board according to the present invention.
Figure 21:
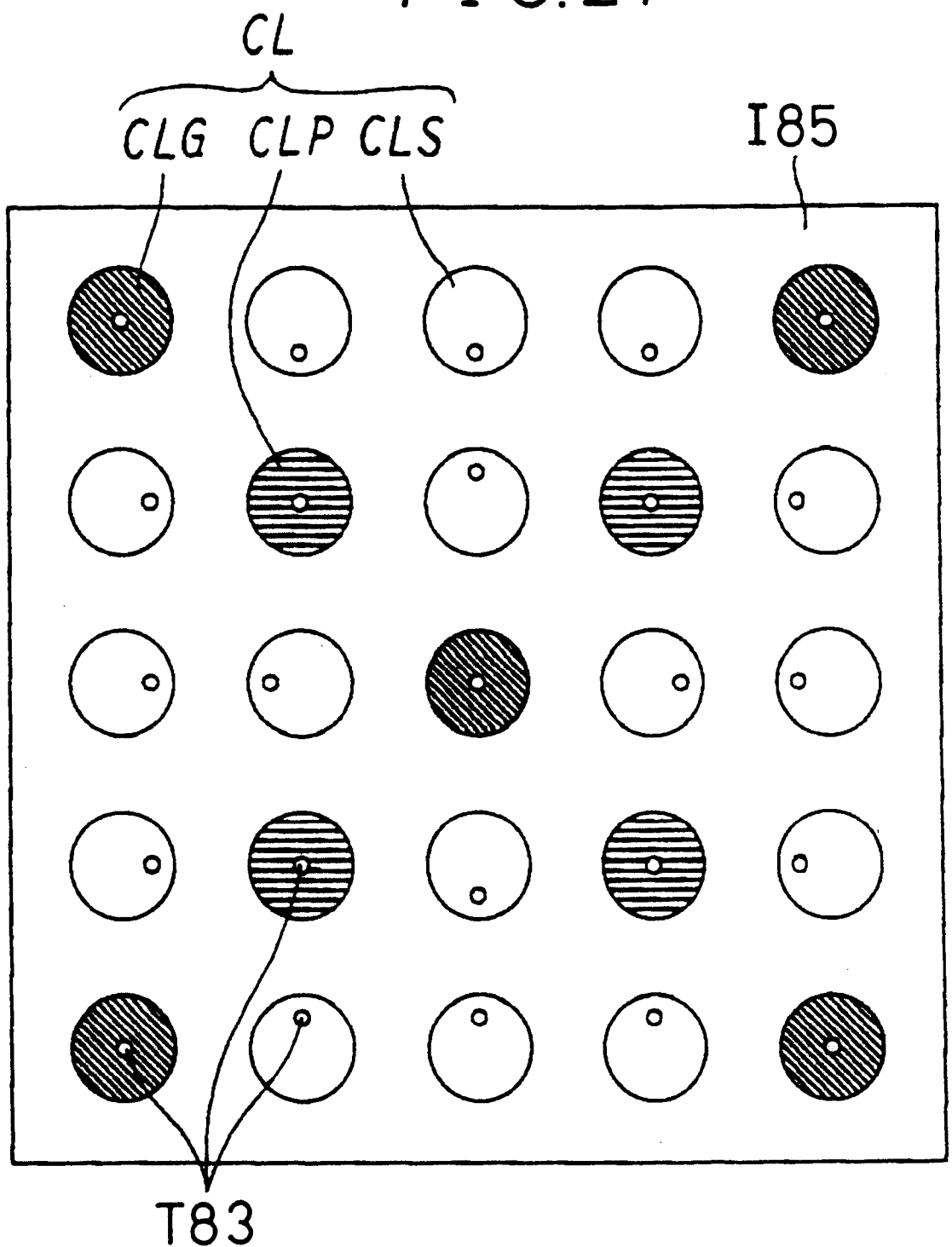
FIG. 21 is a bottom plan view of the fifth insulating layer, illustrating the embodiment of the multilayered wiring board according to the present invention.
Figure 22:
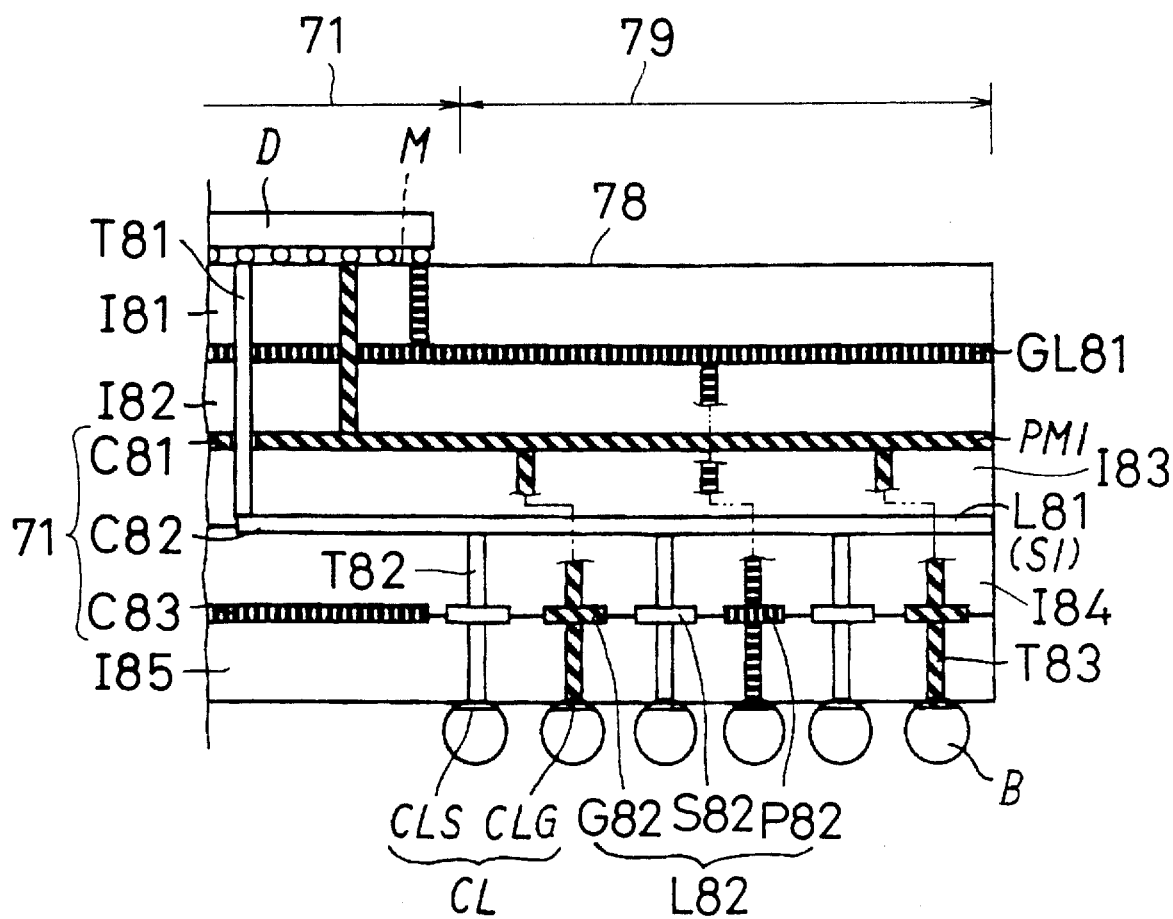
FIG. 22 is a cross sectional view showing a portion of the multilayered wiring board of the present invention constructed with the respective insulating layers stacked one on top of another as shown in FIGS. 15 to 21.

FIGS. 15 to 21 are plan views showing individual insulating layers I81 to I85, illustrating one embodiment of the multilayered wiring board according to the present invention: FIG. 15 is a top plan view of the first insulating layer I81 with an integrated circuit device D mounted on the upper surface of the multilayered wiring board; FIG. 16 is a top plan view of the first insulating layer I81 with the integrated circuit device D removed; FIG. 17 is a top plan view of the underlying second insulating layer I82; FIG. 18 is a top plan view of the third insulating layer I83; FIG. 19 is a top plan view of the fourth insulating layer I84; FIG. 20 is a top plan view of the fifth insulating layer I85; and FIG. 21 is a bottom plan view of the fifth insulating layer I85. FIG. 22 is a cross sectional view showing a portion of the stacked structure constructed by stacking the above-listed layers.

In FIGS. 15 to 22, I81 to I85 are the first to fifth insulating layers; in the illustrated example, the first insulating layer I81 is the uppermost layer of the multilayered wiring board, and the fifth insulating layer I85 is the lowermost layer. Further, reference character D is a semiconductor device, such as an integrated circuit device, which is mounted in a mounting region M provided in the center of the upper surface of the first insulating layer I81, i.e., the upper surface of the multilayered wiring board.

C81 indicates an upper conductor layer formed on the upper surface of the third insulating layer I83 in a position underneath the mounting region M, C82 shows a plurality of line conductors likewise formed on the upper surface of the fourth insulating layer I84, and C83 designates a lower conductor layer likewise formed on the upper surface of the fifth insulating layer I85. The upper conductor layer C81, the plurality of line conductors C82, and the lower conductor layer C83 together form a stripline section 71. The plurality of line conductors C82 are brought out through a first through conductor array T81 to the mounting region M on the upper surface of the multilayered wiring board for electrical connection to the respective terminal electrodes of the semiconductor device D mounted thereon. In FIGS. 15 to 21, individual through conductors including the through conductors of the first through conductor array T81 are each indicated by a circle.

Further, GL81 is a ground conductor layer formed on the surface of the second insulating layer I82. The ground conductor layer GL81 not only has a shielding effect against electromagnetic wave, but also serves the function of allowing the rearrangement of wiring in order to electrically connect the semiconductor device D efficiently to the parallel conductor array of the first wiring layer L81 described later. The ground conductor layer GL81 is formed as the first conductor layer of the multilayered wiring board is an appropriate manner according to the specification of the multilayered wiring board and in such a manner as to cover almost the entire region of each underlying conductor or wiring layer. With the ground conductor layer GL81 thus formed, the multilayered wiring board allows the rearrangement of ground conductors for efficient connection between the semiconductor device D and the first wiring layer L81, and provides a good shielding effect against electromagnetic wave.

Further, PM1 is a grid-like power conductor layer formed from a layer of conductors arranged in an orthogonal grid pattern on the surface of the third insulating layer I83. The grid-like power conductor layer PM1, like the ground conductor layer GL81, serves the function of allowing the rearrangement of wiring in order to electrically connect the semiconductor device D efficiently to the parallel conductor array of the first wiring layer L81, and is formed in a grid pattern to reduce the impedance mismatching between the signal conductors S81 in the first wiring layer L81 and the signal conductors S82 in the second wiring layer L82 described later. Like the ground conductor layer GL81, the grid-like power conductor layer PM1 also is formed in an appropriate manner according to the specification of the multilayered wiring board. With the grid-like power conductor layer PM1 thus formed, the power conductors can be rearranged to effect efficient connection between the semiconductor device D and the first wiring layer L81, and also the impedance mismatching between the signal conductors S81 and S82 can be reduced.

The ground conductor layer GL81 and the grid-like power conductor layer PM1, together with the upper conductor layer C81 and lower conductor layer C83, may be set, if necessary, as a power conductor layer and a grid-like ground conductor layer, respectively; which layer is to be set as a ground layer or a conductor layer should be determined according to the specification of the multilayered wiring board.

Here, the first through conductor array T81 is formed. passing through the ground conductor layer GL81 and upper conductor layer C81 without making electrical contact with these layers.

Next, L81 and L82 are the first and second wiring layers formed on the upper surfaces of the fourth and fifth insulating layers I84 and I85, respectively. Further, P81 and P82 are power conductors in the first and second wiring layers L81 and L82, respectively, G81 and G82 are ground conductors in the first and second wiring layers L81 and L82, respectively, and S81 and S82 are signal conductors in the first and second wiring layers L81 and L82, respectively.

It will be appreciated that the plurality of signal conductors S81, S82 disposed on the same plane may be made to carry different signals with different signal conductors, and likewise the plurality of power conductors P81, P82 disposed on the same plane may be made to carry different power supply levels with different power conductors.

For connections with an external electrical circuit, the fifth insulating layer I85 is provided on its bottom surface with connection lands CL which are electrically connected to the conductors of the second wiring layer L82 or the first wiring layer L81 via the third through conductor array T83, and connection conductors B such as solder bumps are attached to these connection lands CL and electrically connected to connection electrodes of the external electrical circuit. Of the many connection lands CL, CLP indicates power connection lands connected to the power conductors P81 or P82, CLG denotes ground connection lands connected to the ground conductors G81 or G82, and CLS designates signal connection lands connected to the signal conductors S81 or S82. Also, the upper conductor layer C81, the lower conductor layer C83, the ground conductor layer GL81, the grid-like power conductor layer PM1, etc. are electrically connected as necessary to the connection lands CL via through conductors.

The first wiring layer L81 formed on the fourth insulating layer I84 is divided into regions 74 to 77 by two straight lines 72 and 73 (indicated by semi-dashed lines in FIG. 19) intersecting at a point within the mounting region M in the center of the fourth insulating layer I84 so that the respective regions have approximately equal interior angles θ11 and θ12, and each region comprises a parallel conductor array directed toward the intersection point 16, i.e., the mounting region M in the center of the fourth insulating layer I84. In the example shown here, the plane is divided into the four regions 74 and 77 by the two straight lines 72 and 73 extending along the diagonals 72 and 73 of the substantially square-shaped fourth insulating layer I84 and intersecting at the point 16 within the mounting region M so that each region has an interior angle θ11, θ12 of about 90 degrees.

On the other hand, the second wiring layer L82 formed on the fifth insulating layer I85 comprises parallel conductor arrays oriented orthogonal to the parallel conductor arrays of the first wiring layer L81 in the respective regions (indicated by semi-dashed lines in FIG. 20). In the illustrated example, the second wiring layer L82 forms a substantially square shaped encircling wiring structure comprising conductors extending in parallel to the respective sides 27 and 28 of the substantially square-shaped fifth insulating layer I85, by interconnecting the power conductors P82 and ground conductors G82 of the parallel conductor arrays in the respective regions 74 to 77.

The parallel conductors of the first wiring layer L81 are connected at suitable places by the second through conductor array T82 formed in the fourth insulating layer T84 to the corresponding parallel conductors of the second wiring layer L82, thus forming a parallel conductor section, i.e., the stacked wiring structure, comprising the parallel conductor arrays oriented orthogonal to each other in the respective regions.

Further, in the illustrated example, the first and second wiring layers L81 and L82 are formed so that the signal conductors S81, S82 are adjacent to the power conductors P81, P82 or ground conductors G81, G82. This arrangement provides electromagnetic shielding between the signal conductors S81, S82 formed on the same insulating layer I84, I85, and thus effectively reduces cross talk noise between the adjacent signal conductors S81, S82, on the same plane. Furthermore, by arranging the signal conductors S81, S82 so that no two signal conductors are adjacent to each other without a power conductor P81, P82 or a ground conductor G81, G82 being interposed therebetween, the interconnection between the power conductors P81, P82 and the signal conductors S81, S82 and between the ground conductors G81, G82 and the signal conductors S81, S82 formed on the same plane is maximized, serving to reduce the inductances of the power conductors P81 and P82 and ground conductors G81 and G82. This inductance reduction contributes to effectively reducing power supply noise as well as ground noise.

According to the multilayered wiring board of the invention, since the stacked wiring structure is constructed by setting the regions as described above and by arranging the parallel conductor arrays orthogonal to each other in the respective regions, the power conductors P82 and the ground conductors G82 of the parallel conductor arrays forming the second wiring layer L82 takes a substantially encircling wiring structure encircling the center portion of the fifth insulating layer I85, by optimizing these power conductors P82 and ground conductors G82, this has the effect of providing shielding to block the infiltration of external EMI noise as well as the radiation of unwanted electromagnetic wave to the outside, thus providing an effective countermeasure against EMI while reducing cross talk noise between the conductors.

Furthermore, when the encircling wiring structures of the second wiring layer L82 is formed by interconnecting the parallel conductor arrays in the respective regions as shown in FIG. 20, by optimizing the power conductors P82 and the ground conductors G82 in the parallel conductor arrays L82, this encircling wiring structure serves to enhance the effectiveness of the EMI countermeasure and thus provides more effective means for suppressing the effects of EMI.

Moreover, when the outermost encircling conductor of the second wiring layer L82 is a ground conductor G82, this encircling ground conductor G82 provides a very effective shielding means against EMI noise, and contributes to further enhancing the effectiveness of the EMI countermeasure.

The first wiring layer L82 is formed on the fourth insulating layer I84, that is, in the same plane as the line conductor layer comprising the plurality of line conductors C82 forming part of the stripline section 71, and the signal conductors S81 of the first wiring layer L82, for example, are connected in that same plane to the respective line conductors C82, which are also signal conductors, at the perimeter of the mounting region M. Further, the second wiring layer L82 is formed on the fifth insulating layer I85, that is, in the same plane as the lower conductor layer C83 forming part of the stripline section, and is electrically connected to the first wiring layer L82 via the second through conductor array T82. With this arrangement, the terminal electrodes of the semiconductor device D mounted in the mounting region M are electrically connected to the first or second wiring layer L81 or L82 in the parallel conductor section via the stripline section 71.

According to the multilayered wiring board of the invention having the above-described interconnection wiring structure, the narrow wiring pitch (conductor spacing) W2 of the line conductors C82 connected to the input/output electrodes of the semiconductor device D arranged at a very high density with a narrow pitch W is spread out in the stripline section 71, and the signal conductors, power conductors, and ground conductors are rearranged and expanded to wider pitches W3 and W4 for connection to the parallel conductor section 79. This structure effects efficient electrical connection to the semiconductor device D having high-density input/output electrodes, while making effective use of the excellent electrical characteristics of the parallel conductor section 79. Furthermore, by using the stripline section 71, or by stacking a plurality of such stripline sections 71 one on top of another until the signal conductors are fully expanded and by providing corresponding parallel conductor sections 79, the signal conductors, power conductors, and ground conductors leading from the semiconductor device D can be efficiently rearranged and expanded into optimum wiring arrangement for connection to the encircling parallel conductor sections 79. Accordingly, when the number of layers has to be increased to accommodate a higher density semiconductor device D, the number of stacked layers can be reduced by optimizing the wiring design. As shown in FIGS. 19 and 20, the pitch W3 of the parallel conductors of the first wiring layer L81 and the pitch W4 of the parallel conductors of the second wiring layer L82 may be set equal to each other (W3=W4), and each pitch is chosen to be greater than the pitch W2 of the line conductors of the line conductor layer C82 (W3>W2, W4>W2).

In the multilayered wiring board of the invention, the regions 74 to 77 forming the parallel conductor section 79 may be set in other ways than that described in the above particular example; for example, the plane may be divided into four regions 12 to 15, as shown in FIG. 8, by two straight lines 19 and 20 (see FIG. 8) intersecting at a point within the mounting region M in the center of the fourth insulating layer I84, each line passing through about the midpoint of one side 27 or 28 of the substantially square-shaped fourth insulating layer I84 and extending in parallel to its adjacent side 28 or 27, so that each region has an interior angle of about 90 degrees. Alternatively, as shown in FIG. 9, six regions 45 to 50 may be set by dividing the plane by three straight lines 41 to 43 so that each of the interior angles θ5 to θ7 is approximately equal to 60 degrees, or as shown in FIG. 10, eight regions 57 to 64 may be set by dividing the plane by four straight lines 53 to 56 so that each interior angle is approximately equal to 45 degrees.

In any of the above examples, as in the foregoing example, cross talk noise between the adjacent signal conductors S81, S82 on the same plane can be effectively reduced, and inductances of the power conductors P81 and P82 and ground conductors G81 and G82 can be reduced, thus effectively reducing power supply noise as well as ground noise. Further, the power conductors P82 and the ground conductors G82 of the parallel conductor arrays forming the second wiring layer L82 takes a substantially encircling wiring structure encircling the center portion of the insulating layer on which the parallel conductor arrays are formed, and by optimizing these power conductors P82 and ground conductors G82, this has the effect of providing shielding to block the infiltration of external EMI noise as well as the radiation of unwanted electromagnetic wave to the outside, thus providing an effective countermeasure against EMI while reducing cross talk noise between the conductors. Furthermore, when the encircling wiring structure of the second wiring layer L82 is formed by interconnecting the parallel conductor arrays in the responsive regions, this encircling wiring structure serves to enhance the effectiveness of the EMI countermeasure, and thus provides more effective means for suppressing the effects of EMI. When the output encircling conductor of the second wiring layer L82 is a ground conductor G82, this encircling ground conductor G82 provides a very effective shielding means against EMI noise, and contributes to further enhancing the effectiveness of the EMI countermeasure.

In the multilayered wiring board of the invention, various wiring structures other than the illustrated one can be employed for the multilayer wiring section formed above or below the parallel wiring section to construct the multilayered wiring board. For example, a wiring structure constructed from multiple layers of parallel conductors alternately oriented at right angles, or a wiring structure employing a stripline structure, or various other wiring structures employing a microstrip line structure, coplanar line structure, etc. can be selected for use according to the specifications, etc. required of the multilayered wiring board.

Further, an electronic circuit may be constructed, for example, by stacking polyimide insulating layers and conductive layers formed by copper evaporation. Also, a semiconductor package may be constructed by attaching such components as chip resistors, thin-film resistors, coil inductors, cross capacitors, chip capacitors, electrolytic capacitors, etc.

The shape of each of the insulating layers including the fourth and fifth insulating layers I84 and I85 is not limited to the substantially square shape shown in the figures, but other shapes such as a rectangular or rhombic shape or a hexagonal or octagonal shape may be employed.

Furthermore, the first and second wiring layers L81 and L82 are not limited to being formed on the surfaces of the fourth and fifth insulating layers I84 and I85, but these, together with the line conductors C82 and the lower conductor layer C83 of the stripline section, may be formed within the respective insulating layers I84 and I85.

In the multilayered wiring board of the invention, the insulating layers including the fourth and fifth insulating layers I84 and I85 are formed, for example, by a ceramic green sheet lamination method, using an inorganic insulating material such as an aluminum oxide-based sintered material, aluminum nitride-based sintered material, silicon carbide-based sintered material, silicon nitride-based sintered material, mullite-based sintered material, glass ceramic, etc., or an organic insulating material such as polyimide, epoxy resin, fluorocarbon polymers, polynorbornene, benzocyclobutene, etc., or an electrical insulating material such as a composite insulating material formed by binding a ceramic powder or other inorganic insulating powder with a thermosetting resin such as an epoxy-based resin.

For example, when forming the insulating layers from an aluminum oxide-based sintered material, a raw material powder of aluminum oxide, silicon oxide, calcium oxide, magnesium oxide, or the like, is mixed with a suitable organic binder, solvent, etc. to form a slurry which is then formed into a sheet using a prior known doctor blade method to obtain a ceramic green sheet, after which the ceramic green sheet is suitably punched and a parallel conductor array, a through conductor array, or a metal paste as a conductive layer, whichever is required, is printed in a desired pattern for coating; then, a plurality of such ceramic green sheets are stacked one on top of another, and the stacked structure is baked at a temperature of about 1600° C. in a reducing atmosphere to complete the fabrication.

The thicknesses of the insulating layers are appropriately set according to the properties of the material used, so as to satisfy conditions such as the mechanical strength and electrical characteristics conforming to the required specifications and the ease of formation of through conductor arrays.

The parallel conductor arrays forming the first and second wiring layers L81 and L82, the upper conductor layer C81, the line conductors C82, the lower conductor layer C83, and other wiring layers and through conductors are formed, for example, by the metallization of a metallic powder of tungsten, molybdenum, molybdenum-manganese, copper, silver, silver-palladium, or the like, or formed from a thin film of a metallic material such as copper, silver, nickel, chromium, titanium, gold, niobium, or their alloys.

When forming them by the metallization of a metallic powder of tungsten, for example, a metal paste prepared by adding and mixing a suitable organic binder, solvent, etc. into a tungsten powder is printed in a desired pattern for coating on the ceramic green sheets formed as the insulating layers, and the ceramic green sheets coated with such patterns are baked to complete the fabrication of the multilayer stacked structure with the desired patterns formed on the respective insulating layers.

When forming them from a thin film of a metallic material, first a metal layer is formed, for example, by sputtering, vacuum evaporation, or plating, and then the metal layer is formed into the desired conductor pattern using photolithography.

The width of each conductor and the spacing between conductors in the parallel conductor arrays of the first and second wiring layers L81 and L82 are appropriately set according to the properties of the material used, so as to satisfy conditions such as the electrical characteristics conforming to the required specifications and the ease of formation on the insulating layers I84 and I85.

The thickness of each of the wiring layers L81 and L82 is preferably set to about 1 to 20 μm. If the thickness is less than 1 μm, the conductor resistance becomes large, tending to make it difficult to supply sufficient power to the semiconductor device through conductors, to provide stable ground, and to ensure good signal propagation. On the other hand, if the thickness exceeds 20 μm, the cladding provided by the insulating layer formed overlying the conductors may become insufficient, causing an insulation failure.

The through conductors in the through conductor arrays including the second through conductor array T82 may be formed circular in cross section or may be formed in elliptical, square, rectangular, or other irregular shapes. Their positions and sizes are appropriately chosen according to the properties of the material used, so as to satisfy conditions such as the electrical characteristics conforming to the required specifications and the ease of their formation and placement in the insulating layers.

When the insulating layers are formed from an aluminum oxide-based sintered material and the parallel conductor arrays are formed by the metallization of tungsten, for example, if the thickness of each insulating layer is 200 μm, the line width of each conductor is 100 μm, the spacing between conductors is 150 μm, and the size of each through conductor is 100 μm, then the impedance of signal conductors can be made 50 Ω, and the upper and lower parallel conductor arrays can be electrically interconnected while suppressing reflections of high frequency signals.

As for the thickness of each of the upper and lower conductor layers C81 and C83 forming the stripline section, their formation regions, and the thickness, width, and conductor spacing of the line conductors C82, if the line width of each conductor is 100 μm, the conductor spacing and the conductor-to-the conductor layer spacing are each 150 μm, and the thickness of each conductor and each conductor layer is 300 μm, for example, then the impedance of signal conductors can be made 50 Ω.

The present invention is not limited to the particular embodiment described above, but various modifications may be made without departing the spirit and essential characteristics of the invention. For example, the insulating layers may be formed using an aluminum nitride-based sintered material or silicon carbide-based sintered material, considering their good heat conductor property, or a glass ceramic-based sintered material, considering its low dielectric constant.

For example, in the above embodiments, the invention has been described as being applied to a multilayered wiring board for mounting thereon a semiconductor device, but the invention may also be applied to a semiconductor package for packaging a semiconductor device.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A multilayered wiring board comprising:
   (a) a first insulating layer having a mounting region for mounting a semiconductor device formed substantially centrally on a surface thereof;
   (b) an upper conductor layer formed on the other surface of the first insulating layer and underneath the mounting region;
   (c) a second insulating layer formed to have a surface facing the other surface of the first insulating layer and the upper conductor layer;
   (d) a line conductor layer comprising a plurality of line conductors, the line conductor layer being formed on the other surface of the second insulating layer and underneath the mounting region;
   (e) a first through conductor array, passing through the first and second insulating layers, for electrically connecting the semiconductor device to the line conductors of the line conductor layer;
   (f) a third insulating layer formed to have one surface facing the other surface of the second insulating layer and the line conductor layer;
   (g) a lower conductor layer formed on the other surface of the third insulating layer and underneath the mounting region, the lower conductor layer forming a stripline section together with the upper conductor layer and the line conductor layer;
   (h) a first wiring layer interposed between the other surface of the first insulating layer and the one surface of the third insulating layer,
   the first wiring layer having a plurality of first parallel conductor arrays,
   each of the first parallel conductor arrays being formed in one of a plurality of split regions formed around the stripline section,
   the split regions being separated by two to four straight lines intersecting at a point within the mounting region so that interior angles θ11, θ12; θ1, θ2; θ3, θ4; θ5 to θ7; θ81 to θ84 are approximately equal, and
   each of the first parallel conductor arrays being oriented in a direction parallel to a direction directed toward the point of intersection;
   (i) a second wiring layer formed on the other surface of the third insulating layer,
   the second wiring layer having a plurality of second parallel conductor arrays,
   each of the second parallel conductor arrays being formed in one of the split regions, and
   the second parallel conductor arrays being oriented orthogonal to the first parallel conductor arrays in the respective split regions; and
   (j) a second through conductor array, passing through the third insulating layer, for electrically interconnecting the first and second wiring layers,
   the second through conductor array forming a parallel conductor section, together with the first and second wiring layers.

2. The multilayered wiring board of claim 1, wherein a ground or power conductor layer is embedded in the first and second insulating layers over a range from the stripline section to the parallel conductor section, and the ground or power conductor layer is electrically connected to at least either the upper conductor layer or the lower conductor layer.

3. The multilayered wiring board of claim 1 or 2, wherein pitches W3 and W4 of the first and second parallel conductor arrays are each chosen to be greater than the pitch W2 of the line conductors of the line conductor layer (W3>W2 and W4>W2).

4. The multilayered wiring board of claim 1, wherein one or more devices are selected as the semiconductor device from the group consisting of a microprocessing unit, an application specific integrated circuit, and a digital signal processor.

5. The multilayered wiring board of any one of claims 1, wherein insulating layers are formed of one or more materials selected from the group consisting of inorganic insulating material, organic insulating material, and composite insulating material made up of a mixture of inorganic insulating material and organic insulating material.

6. A package for housing a semiconductor, comprising the multilayered wiring board of any one of claims 1.

* * * * *